(12) United States Patent
Berneth et al.

(10) Patent No.: US 9,146,456 B2
(45) Date of Patent: Sep. 29, 2015

(54) PHOTOPOLYMER FORMULATION FOR PRODUCING HOLOGRAPHIC MEDIA HAVING HIGHLY CROSSLINKED MATRIX POLYMERS

(75) Inventors: Horst Berneth, Leverkusen (DE); Thomas Rölle, Leverkusen (DE); Friedrich-Karl Bruder, Krefeld (DE); Thomas Fäcke, Leverkusen (DE); Marc-Stephan Weiser, Leverkusen (DE); Dennis Hönel, Zülpich (DE)

(73) Assignee: Bayer Intellectual Property GmbH, Monheim (DE)

( * ) Notice: Subject to any disclaimer, the term of this patent is extended or adjusted under 35 U.S.C. 154(b) by 18 days.

(21) Appl. No.: 13/883,008

(22) PCT Filed: Nov. 4, 2011

(86) PCT No.: PCT/EP2011/069389
§ 371 (c)(1),
(2), (4) Date: May 2, 2013

(87) PCT Pub. No.: WO2012/062655
PCT Pub. Date: May 18, 2012

(65) Prior Publication Data
US 2013/0224634 A1 Aug. 29, 2013

(30) Foreign Application Priority Data
Nov. 8, 2010 (EP) .................................. 10190324

(51) Int. Cl.
*G03H 1/02* (2006.01)
*G03F 7/035* (2006.01)
(Continued)

(52) U.S. Cl.
CPC . *G03C 1/00* (2013.01); *C09B 11/12* (2013.01); *C09B 17/00* (2013.01); *C09B 21/00* (2013.01);
(Continued)

(58) Field of Classification Search
CPC .......... G03C 1/00; G03F 7/0045; G03F 7/035; C09B 49/12; C09B 21/00; C09B 17/00; C09B 57/00; C09B 23/06; C09B 23/166; C09B 23/04; C09B 55/009; C09B 23/105; C09B 69/065; G03H 1/00; G11B 7/245
See application file for complete search history.

(56) References Cited

U.S. PATENT DOCUMENTS 3,619,105 A * 11/1971 Caldwell .......................... 8/591
3,660,008 A * 5/1972 Kissa .............................. 8/532
(Continued)

FOREIGN PATENT DOCUMENTS

CH 691684 A5 9/2001
EP 0223587 A1 5/1987
(Continued)

OTHER PUBLICATIONS
International Search Report for PCT/EP2011/069389 mailed Jun. 4, 2012.
(Continued)

*Primary Examiner* — Martin Angebranndt
(74) *Attorney, Agent, or Firm* — Drinker Biddle & Reath LLP

(57) ABSTRACT

The invention relates to a photopolymer formulation comprising a polyol component, a polyisocyanate component, a writing monomer, and a photoinitiator, containing a coinitiator and a dye having the formula F An, where F stands for a cationic dye and An" stands for an anion, wherein the dye having the formula F An comprises a water absorption of =5%. The invention further relates to a holographic medium, in particular in the form of a film, containing a photopolymer formulation according to the invention, to the use of such a medium for recording holograms, and to a special dye that can be used in the photopolymer formulation according to the invention.

17 Claims, 4 Drawing Sheets

(51) Int. Cl.

| | | |
|---|---|---|
| *G03C 1/00* | (2006.01) | |
| *G03F 7/004* | (2006.01) | |
| *C09B 11/12* | (2006.01) | |
| *C09B 17/00* | (2006.01) | |
| *C09B 21/00* | (2006.01) | |
| *C09B 23/04* | (2006.01) | |
| *C09B 23/06* | (2006.01) | |
| *C09B 23/08* | (2006.01) | |
| *C09B 23/10* | (2006.01) | |
| *C09B 23/16* | (2006.01) | |
| *C09B 55/00* | (2006.01) | |
| *C09B 57/00* | (2006.01) | |
| *C09B 69/06* | (2006.01) | |
| *G11B 7/245* | (2006.01) | |
| *C09B 49/12* | (2006.01) | |
| *G03H 1/00* | (2006.01) | |
| *G11B 7/24044* | (2013.01) | |

(52) U.S. Cl.
CPC ............... *C09B 23/04* (2013.01); *C09B 23/06* (2013.01); *C09B 23/083* (2013.01); *C09B 23/105* (2013.01); *C09B 23/166* (2013.01); *C09B 49/12* (2013.01); *C09B 55/009* (2013.01); *C09B 57/00* (2013.01); *C09B 69/06* (2013.01); *C09B 69/065* (2013.01); *G03F 7/0045* (2013.01); *G03F 7/035* (2013.01); *G03H 1/00* (2013.01); *G11B 7/245* (2013.01); *G03H 2260/12* (2013.01); *G03H 2260/14* (2013.01); *G11B 7/24044* (2013.01)

(56) References Cited

U.S. PATENT DOCUMENTS

| | | | |
|---|---|---|---|
| 3,915,630 A * | 10/1975 | Renault et al. | 8/501 |
| 4,063,889 A * | 12/1977 | Kissa | 8/539 |
| 5,250,391 A * | 10/1993 | Miller | 430/286.1 |
| 5,698,490 A | 12/1997 | Ito et al. | |
| 6,011,180 A | 1/2000 | Cunningham et al. | |
| 8,771,903 B2 * | 7/2014 | Honel et al. | 430/1 |
| 8,889,321 B2 * | 11/2014 | Bruder et al. | 430/1 |
| 2003/0044691 A1 * | 3/2003 | Setthachayanon et al. | 430/1 |
| 2003/0087104 A1 * | 5/2003 | Dhar et al. | 428/422.8 |
| 2005/0259303 A1 * | 11/2005 | Setthachayanon et al. | 359/15 |
| 2006/0194122 A1 * | 8/2006 | Takizawa | 430/1 |
| 2010/0086861 A1 * | 4/2010 | Weiser et al. | 430/2 |
| 2010/0087564 A1 * | 4/2010 | Weiser et al. | 522/95 |
| 2011/0065827 A1 * | 3/2011 | Facke et al. | 522/173 |
| 2011/0236803 A1 * | 9/2011 | Weiser et al. | 430/2 |
| 2014/0038084 A1 * | 2/2014 | Honel et al. | 430/2 |
| 2014/0255824 A1 * | 9/2014 | Weiser et al. | 430/2 |
| 2014/0295328 A1 * | 10/2014 | Weiser et al. | 430/2 |
| 2014/0302426 A1 * | 10/2014 | Honel et al. | 430/2 |

FOREIGN PATENT DOCUMENTS

| | | | |
|---|---|---|---|
| EP | 0408322 A1 | | 1/1991 |
| EP | 1666988 A1 | | 6/2006 |
| EP | 2028654 A1 | | 2/2009 |
| JP | 2002-258471 | * | 9/2002 |
| WO | WO-2008/125229 A1 | | 10/2008 |
| WO | 2011/054791 | * | 5/2011 |
| WO | 2011/067057 | * | 6/2011 |

OTHER PUBLICATIONS

Tetko et al., "Virtual Computational Chemistry Laboratory—Design and Description", *Journal of Computer-Aided Molecular Design*, vol. 19, pp. 453-463 (2005.

* cited by examiner

PHOTOPOLYMER FORMULATION FOR PRODUCING HOLOGRAPHIC MEDIA HAVING HIGHLY CROSSLINKED MATRIX POLYMERS

CROSS-REFERENCE TO RELATED APPLICATIONS

This application is a national stage application (under 35 U.S.C. §371) of PCT/EP2011/069389, filed Nov. 4, 2011, which claims benefit of European application 10190324.3, filed Nov. 8, 2010.

BACKGROUND OF THE INVENTION

The invention relates to a photopolymer formulation comprising a polyol component, a polyisocyanate component, a writing monomer and a photoinitiator containing a coinitiator and a dye of formula $F^+An^-$, where $F^+$ represents a cationic dye and $An^-$ represents an anion. The invention further relates to a holographic medium, particularly in the form of a film, containing a photopolymer formulation according to the invention, to the use of such a medium for recording of holograms, and also to a specific dye usable in the photopolymer formulations according to the invention.

Photopolymer formulations of the type mentioned at the beginning are known in the prior art. WO 2008/125229 A1, for instance, describes a photopolymer formulation comprising a polyol component, a polyisocyanate component, a writing monomer based on acrylate and also photoinitiators containing a coinitiator and a dye. In the cured state, the writing monomer and the photoinitiators form a spatially isotropic distribution embedded in the polyurethane matrix formed from polyol and polyisocyanate components.

The uses of photopolymer formulations are decisively determined by the refractive index modulation Δn produced in the photopolymer by holographic exposure. In holographic exposure, the interference field of signal light beam and reference light beam (in the simplest case, that of two plane waves) is mapped into a refractive index grating by the local photopolymerization of, for example, high refractive index acrylates at loci of high intensity in the interference field. The refractive index grating in the photopolymer (the hologram) contains all the information of the signal light beam. Illuminating the hologram with only the reference light beam will then reconstruct the signal. The strength of the signal thus reconstructed relative to the strength of the incident reference light is diffraction efficiency, DE in what follows.

In the simplest case of a hologram resulting from the superposition of two plane waves, the DE is the ratio of the intensity of the light diffracted on reconstruction to the sum total of the intensities of the incident reference light and the diffracted light. The higher the DE, the greater the efficiency of a hologram with regard to the amount of reference light needed to visualize the signal with a fixed brightness.

When the hologram is illuminated with white light, for example, the width of the spectral range which can contribute to reconstructing the hologram is likewise only dependent on the layer thickness d. The relationship which holds is that the smaller the d, the greater the particular acceptance widths. Therefore, to produce bright and easily visible holograms, it is generally desirable to seek a high Δn and a low thickness d while maximizing DE. That is, increasing Δn increases the latitude to engineer the layer thickness d without loss of DE for bright holograms. Therefore, the optimization of Δn is of outstanding importance in the optimization of photopolymer formulations (P. Hariharan, Optical Holography, 2nd Edition, Cambridge University Press, 1996).

In order that a very high Δn and DE may be realized for holograms, the matrix polymers and writing monomers of a photopolymer formulation should in principle be chosen such that there is a very large difference in their refractive indices. One possible method of realization is to use matrix polymers having a very low refractive index and writing monomers having a very high refractive index. Suitable matrix polymers of low refractive index are for example polyurethanes obtainable by reaction of a polyol component with a polyisocyanate component.

In addition to high DE and Δn values, however, another important requirement for holographic media from photopolymer formulations is that the matrix polymers be highly crosslinked in the final medium. When the degree of crosslinking is too low, the medium will lack adequate stability. One consequence of this is to appreciably reduce the quality of holograms inscribed in the media. In the worst case, the holograms may subsequently even be destroyed.

It is further very important for the large scale industrial production of holographic media from photopolymer formulations in particular that the matrix polymers crosslink quickly. Short cure times to blocking resistance are very important here, since this parameter determines the processing speed and/or the length of any curing sector needed.

However, it has been determined that media obtained from the known photopolymer formulations are frequently devoid of adequate crosslinking. Moreover, reaching an even just adequate crosslink density requires long cure times in many cases. This means that media obtained from the known photopolymer formulations may have quality issues and the prolonged cure time is associated with appreciable cost and inconvenience in large scale industrial manufacture.

The problem addressed by the present invention was therefore that of providing a photopolymer formulation of the type mentioned at the beginning, from which stable holographic media for bright holograms are obtainable quickly and at low cost and inconvenience.

BRIEF SUMMARY OF THE INVENTION

This problem is solved by the photopolymer formulation according to the invention when the dye has a water imbibition of ≤5%.

Water imbibition is apparent from formula (F-1)

$$W = (m_f/m_t - 1) * 100\% \tag{F-1}$$

where $m_f$ is the mass of the dye after water saturation and $m_t$ is the mass of the dried dye. $m_t$ is ascertained by drying a particular quantity of dye to constant mass, for example at elevated temperature in vacuo. $m_f$ is determined by letting a particular quantity of dye stand in air at a defined humidity to constant weight.

Surprisingly, fast-curing holographic media are found to be obtainable from photopolymer formulations containing a dye of formula $F^+An^-$ with a water imbibition of ≤5%. The media exhibit fast and high crosslinking of the matrix polymer and make it possible for bright holograms to be exposed in them.

A BRIEF DESCRIPTION OF THE FIGURES

Figure 7:
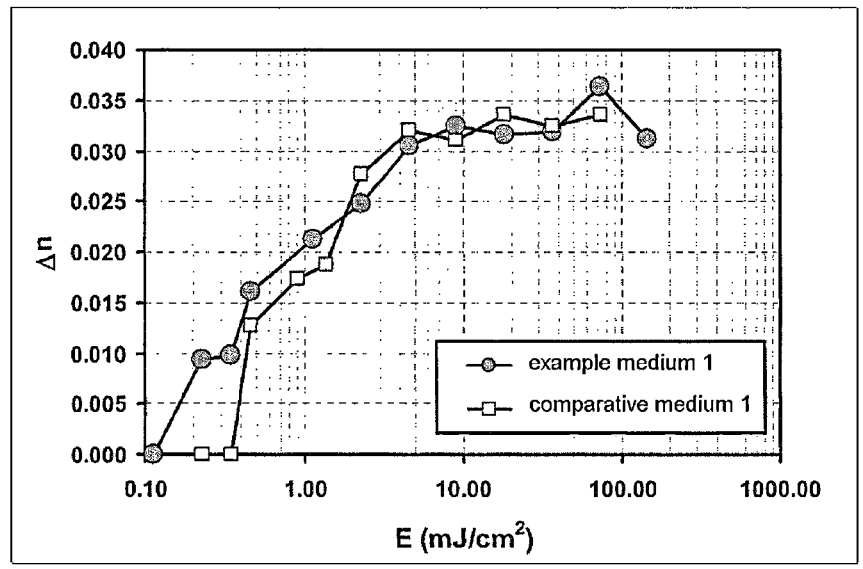

FIG. 7 plots the □n achieved versus the exposure dose E, holographic writing ensues in Example Medium 1 at lower doses E than in Comparative Medium 1.

A DETAILED DESCRIPTION OF THE INVENTION

In a first preferred embodiment of the invention, the dye has a water imbibition of ≤3% and preferably of ≤2%. It is very particularly preferable for the dye to imbibe only traces of water, if any.

Cationic dyes of formula $F^+$ is to be understood in the context of the present invention as referring to dyes as described for example in H. Berneth in Ullmann's Encyclopedia of Industrial Chemistry, Cationic Dyes, Wiley-VCH Verlag, 2008.

Cationic dyes of formula $F^+$ is preferably to be understood as meaning cationic dyes of the following classes: acridine dyes, xanthene dyes, thioxanthene dyes, phenazine dyes, phenoxazine dyes, phenothiazine dyes, tri(het)arylmethane dyes, particularly diamino- and triamino(het)arylmethane dyes, mono-, di- and trimethinecyanine dyes, hemicyanine dyes, externally cationic merocyanine dyes, externally cationic neutrocyanine dyes, nullmethine dyes—particularly naphtholactam dyes, streptocyanine dyes. Dyes of this type are described for example in H. Berneth in Ullmann's Encyclopedia of Industrial Chemistry, Azine Dyes, Wiley-VCH Verlag, 2008, H. Berneth in Ullmann's Encyclopedia of Industrial Chemistry, Methine Dyes and Pigments, Wiley-VCH Verlag, 2008, T. Gessner, U. Mayer in Ullmann's Encyclopedia of Industrial Chemistry, Triarylmethane and Diarylmethane Dyes, Wiley-VCH Verlag, 2000.

It is also preferable for the anion $An^-$ of the dye to have an AClogP in the range of 1-30, preferably in the range of 1-12, more preferably in the range of 1-6.5 and even more preferably in the range 1-4.

AClogP is computed as described in J. Comput. Aid. Mol. Des. 2005, 19, 453; Virtual Computational Chemistry Laboratory, http://www.vcclab.org.

In a further preferred embodiment of the invention, the anion $An^-$ has a molar mass >150 g/mol and more preferably >250 g/mol.

The anion of formula $An^-$ can comprise at least a phosphorus, boron or sulphur atom, preferably at least a boron or sulphur atom and more preferably at least a sulphur atom particularly a sulphur atom in an $SO_3$ moiety.

It is likewise preferable for the anion $An^-$ to have one or more than one linear or branched aliphatic moiety and preferably one linear or branched aliphatic $C_8$ to $C_{18}$ moiety. If the anion contains more than one linear or branched aliphatic moiety, these together contain 8 to 36 and preferably 8 to 24 carbon atoms. This aliphatic moiety may bear substituents such as fluorine, methoxy or ethoxy.

Outstandingly preferred anions of formula $An^-$ have, therefore, a molar mass >250 g/mol and contain an $SO_3^-$ grouping and also at least one alkyl group of 8 or more carbon atoms and have an AClogP in the range 1-6.5.

The formula $An^-$ anions according to the invention also subsume in particular:

$C_8$- to $C_{25}$-alkanesulphonate, preferably $C_{13}$- to $C_{25}$-alkanesulphonate, $C_3$- to $C_{18}$-perfluoroalkanesulphonate, preferably $C_4$- to $C_{18}$-perfluoroalkanesulphonate, $C_9$- to $C_{25}$-alkanoate, $C_9$- to $C_{25}$-alkenoate, $C_8$- to $C_{25}$-alkyl sulphate, preferably $C_{13}$- to $C_{25}$-alkyl sulphate, $C_8$- to $C_{25}$-alkenyl sulphate, preferably $C_{13}$- to $C_{25}$-alkenyl sulphate, $C_3$- to $C_{18}$-perfluoroalkyl sulphate, preferably $C_4$- to $C_{18}$-perfluoroalkyl sulphate, polyether sulphates based on 4 or more equivalents of ethylene oxide and/or propylene oxide, bis-$C_4$- to $C_{25}$-alkyl, $C_5$- to $C_7$-cycloalkyl, $C_3$- to $C_8$-alkenyl or $C_7$- to $C_{11}$-aralkyl sulphosuccinate, bis-$C_2$- to $C_{10}$-alkyl sulphosuccinate substituted by 8 or more fluorine atoms, $C_8$- to $C_{25}$-alkyl sulphoacetates, benzenesulphonate substituted by at least one moiety from the group halogen, $C_4$- to $C_{25}$-alkyl, perfluoro-$C_1$- to $C_8$-alkyl and/or $C_1$- to $C_{12}$-alkoxycarbonyl, optionally nitro-, cyano-, hydroxyl-, $C_1$- to $C_{25}$-alkyl-, $C_1$- to $C_{12}$-alkoxy-, amino-, $C_1$- to $C_{12}$-alkoxycarbonyl- or chlorine-substituted naphthalene- or biphenylsulphonate, optionally nitro-, cyano-, hydroxyl-, $C_1$- to $C_{25}$-alkyl-, $C_1$- to $C_{12}$-alkoxy-, $C_1$- to $C_{12}$-alkoxycarbonyl- or chlorine-substituted benzene-, naphthalene- or biphenyldisulphonate, dinitro-, $C_6$- to $C_{25}$-alkyl-, $C_4$- to $C_{12}$-alkoxycarbonyl-, benzoyl-, chlorobenzoyl- or toluoyl-substituted benzoate, the anion of naphthalenedicarboxylic acid, diphenyl ether disulphonate, sulphonated or sulphated, optionally mono- or polyunsaturated $C_8$- to $C_{25}$-fatty acid esters of aliphatic $C_1$- to $C_8$-alcohols or glycerol, bis(sulpho-$C_2$- to $C_6$-alkyl) $C_3$- to $C_{12}$-alkanedicarboxylic esters, bis(sulpho-$C_2$- to $C_6$-alkyl) itaconic acid esters, (sulpho-$C_2$- to $C_6$-alkyl) $C_6$- to $C_{18}$-alkanecarboxylic esters, (sulpho-$C_2$- to $C_6$-alkyl) acrylic or methacrylic acid esters, triscatechol phosphate optionally substituted by up to 12 halogen moieties, an anion from the group tetraphenyl borate, cyanotriphenyl borate, tetraphenoxyborate, $C_4$- to $C_{12}$-alkyltriphenyl borate, the phenyl or phenoxy moieties of which may be halogen, $C_1$- to $C_4$-alkyl and/or $C_1$- to $C_4$-alkoxy substituted, $C_4$- to $C_{12}$-alkyltrinaphthyl borate, tetra-$C_1$- to $C_{20}$-alkoxyborate, 7,8- or 7,9-dicarbanidoundecaborate(1-) or (2-), which optionally bear on the B and/or C atoms one or two $C_1$- to $C_{12}$-alkyl or phenyl substituents, dodecahydrodicarbadodecaborate(2-) or B—$C_1$- to $C_{12}$-alkyl-C-phenyldodecahydrodicarbadodecaborate(1-), where An− in multivalent anions such as naphthalenedisulphonate represents one equivalent of this anion, and where the alkane and alkyl groups may be branched and/or may be halogen, cyano, methoxy, ethoxy, methoxycarbonyl or ethoxycarbonyl substituted.

Particular preference is given to:
sec-$C_{11}$- to $C_{18}$-alkanesulphonate, $C_{13}$- to $C_{25}$-alkyl sulphate, branched $C_8$- to $C_{25}$-alkyl sulphate, optionally branched bis-$C_6$- to $C_{25}$-alkyl sulphosuccinate, sec- or tert-$C_4$- to $C_{25}$-alkylbenzenesulphonate, sulphonated or sulphated, optionally mono- or polyunsaturated $C_8$- to $C_{25}$-fatty acid esters of aliphatic $C_1$- to $C_8$-alcohols or glycerol, bis(sulpho-$C_2$- to $C_6$-alkyl) $C_3$- to $C_{12}$-alkanedicarboxylic esters, (sulpho-$C_2$- to $C_6$-alkyl) $C_6$- to $C_{18}$-alkanecarboxylic esters, triscatechol phosphate substituted by up to 12 halogen moieties, cyanotriphenyl borate, tetraphenoxyborate.

Examples are:
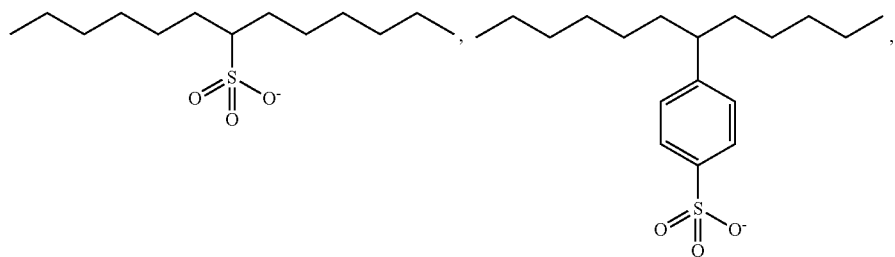
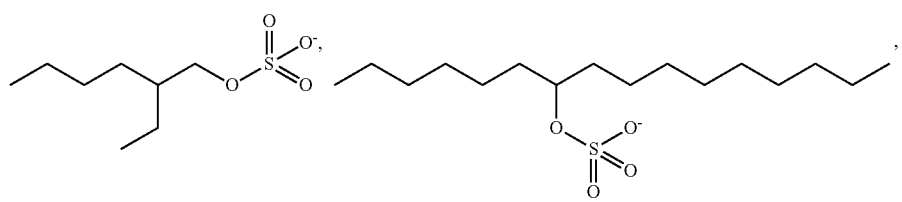
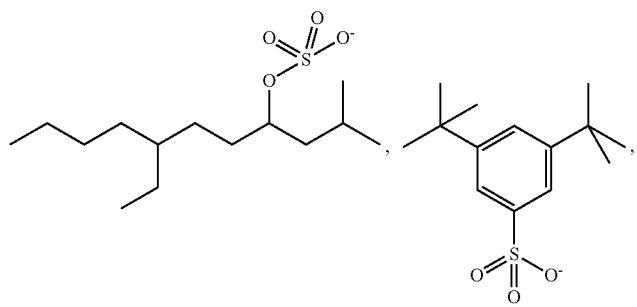
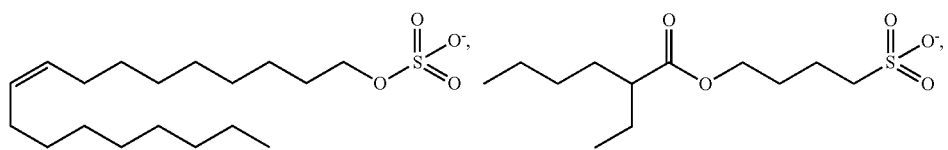
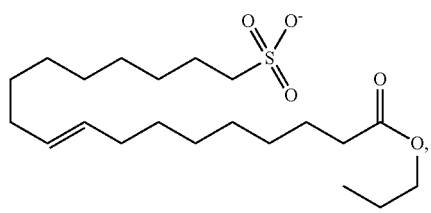

-continued
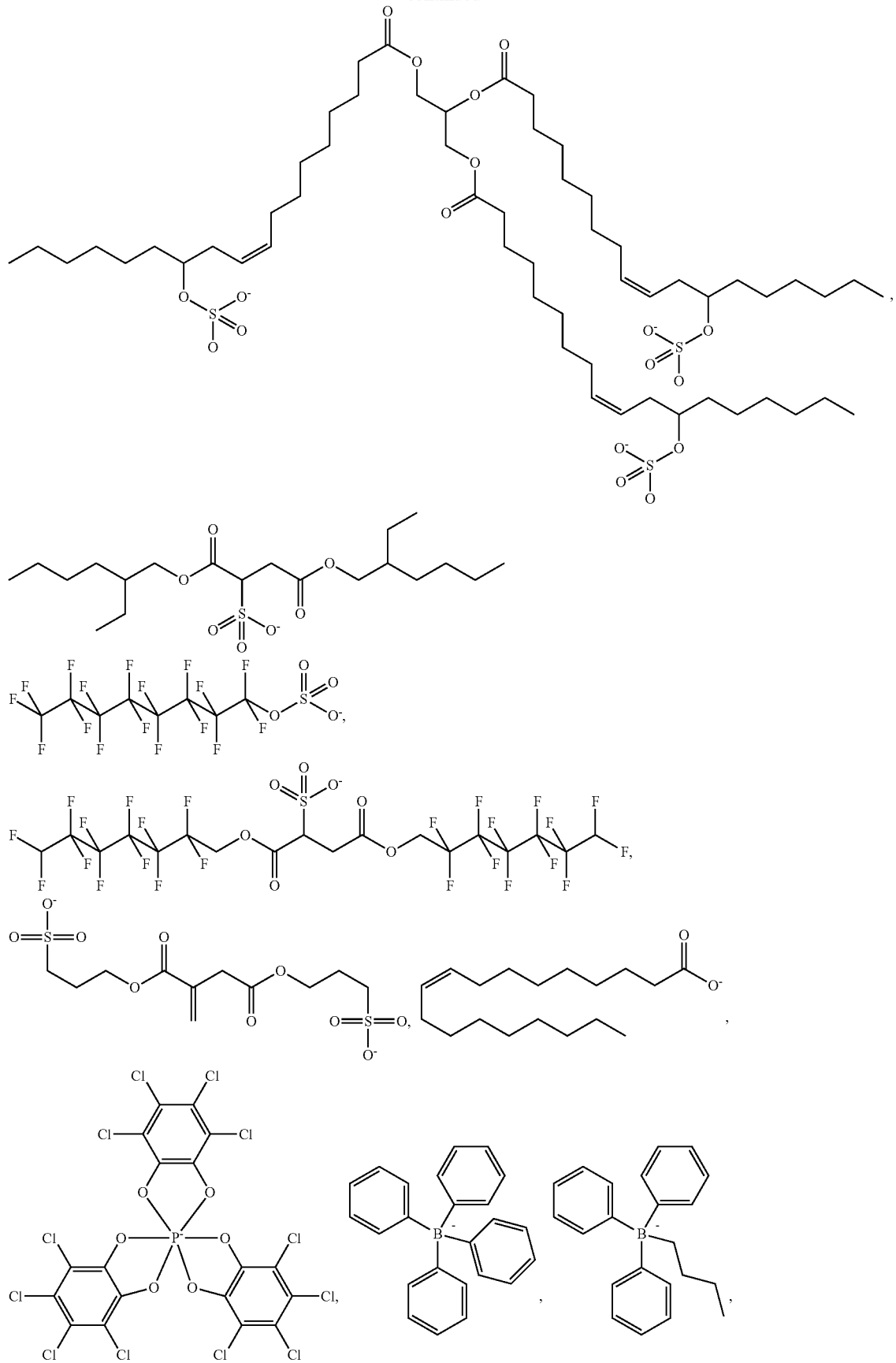

-continued
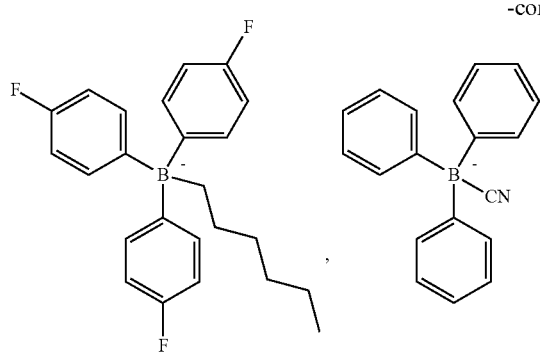
AClogP values of various anions are collated in the following Table 1:
TABLE 1
| AClogP values of selected anions | |
|---|---|
| Anion | AClogP |
| pyridine-3-sulfonate | −1.50 |
| p-toluenesulfonate | −0.11 |
| trifluoromethanesulfonate | 0.23 |
| naphthalene-1-sulfonate | 0.76 |
| naphthalene-2-sulfonate | 0.76 |
| 2-ethylhexyl sulfate | 1.07 |
| 4-(2-ethylhexanoyloxy)butane-1-sulfonate | 1.84 |

TABLE 1-continued
AClogP values of selected anions
| Anion | AClogP |
|---|---|
| 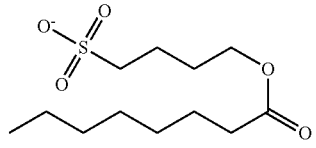 [SMILES: CCCCCCCC(=O)OCCCCS(=O)(=O)[O-]] | 1.96 |
| 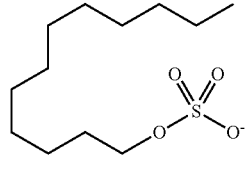 [SMILES: CCCCCCCCCCCCOS(=O)(=O)[O-]] | 3.05 |
| 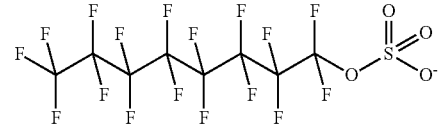 [SMILES: O=S(=O)([O-])OC(F)(F)C(F)(F)C(F)(F)C(F)(F)C(F)(F)C(F)(F)C(F)(F)C(F)(F)F] | 3.32 |
| 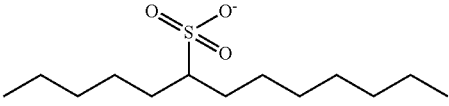 [SMILES: CCCCCCCC(CCCCC)S(=O)(=O)[O-]] | 3.45 |
| 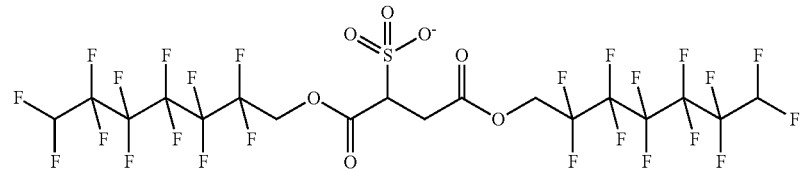 [SMILES: O=C(CC(C(=O)OCC(F)(F)C(F)(F)C(F)(F)C(F)(F)C(F)(F)C(F)F)S(=O)(=O)[O-])OCC(F)(F)C(F)(F)C(F)(F)C(F)(F)C(F)(F)C(F)F] | 3.62 |
| 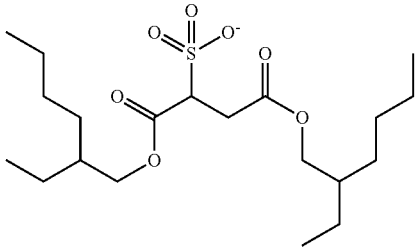 [SMILES: CCCCC(CC)COC(=O)CC(C(=O)OCC(CC)CCCC)S(=O)(=O)[O-]] | 3.67 |
| 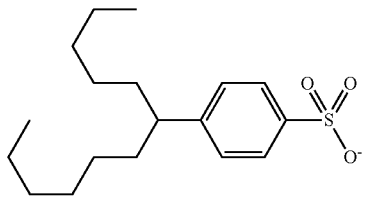 [SMILES: CCCCCCC(CCCCC)c1ccc(S(=O)(=O)[O-])cc1] | 4.85 |

TABLE 1-continued
AClogP values of selected anions
| Anion | AClogP |
|---|---|
| 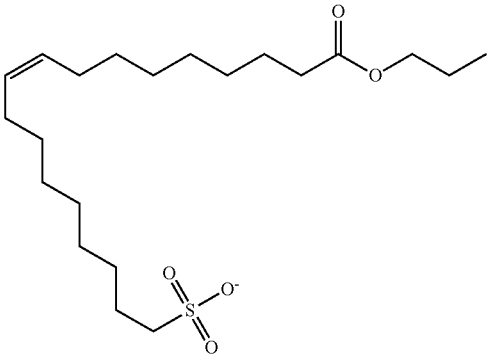 [SMILES: CCCOC(=O)CCCCCCC/C=C\CCCCCCCCS(=O)(=O)[O-]] | 5.78 |
| 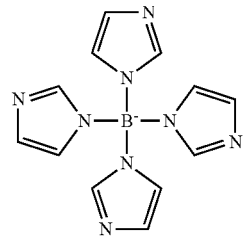 [SMILES: c1cn([B-](n2ccnc2)(n2ccnc2)n2ccnc2)cn1] | 5.81 |
| 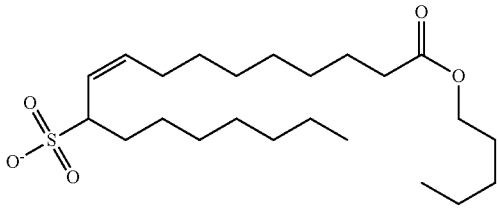 [SMILES: CCCCCCCC(/C=C\CCCCCCCC(=O)OCCCCC)S(=O)(=O)[O-]] | 6.34 |
| 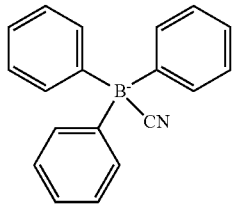 [SMILES: N#C[B-](c1ccccc1)(c1ccccc1)c1ccccc1] | 6.86 |
| 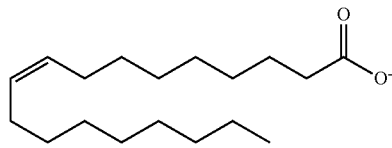 [SMILES: CCCCCCCC/C=C\CCCCCCCC(=O)[O-]] | 7.55 |
| 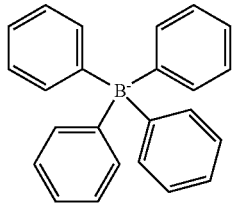 [SMILES: c1ccc([B-](c2ccccc2)(c2ccccc2)c2ccccc2)cc1] | 8.76 |

TABLE 1-continued

AClogP values of selected anions

| Anion | AClogP |
|---|---|
| butyltriphenylborate | 8.99 |
| hexyltris(4-fluorophenyl)borate | 9.16 |
| bis-sulfated triglyceride structure | 12.49 |
| tris(tetrachlorobenzenediolato)phosphate | 17.49 |

It is likewise particularly preferable for

An⁻ to represent a 4-(sec-alkyl)benzenesulphonate of formula (LI)

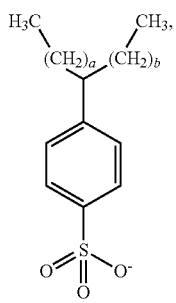
(LI)

where a and b independently of each other represent an integer from 0 to 20 subject to the proviso that a+b is ≥3.

a+b here is preferably ≥5, more preferably ≥7 and even more preferably ≥9.

The formula (LI) also subsumes mixtures of anions with various values of a and b where a+b is the same. However, the formula (LI) also subsumes mixtures of anions with different values of a and b.

Examples of anions of formula (LI) are:

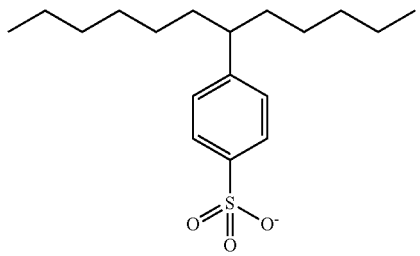 [SMILES: CCCCCCC(CCCCC)c1ccc(S(=O)(=O)[O-])cc1]

and also as mixture of all five conceivable isomers.

It is likewise particularly preferable for

An⁻ to represent a sec-alkylsulphonate of formula (LII)

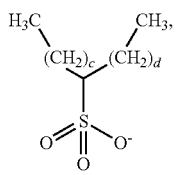
(LII)

where c and d independently of each other represent an integer from 0 to 20 subject to the proviso that c+d is ≥5.

c+d is preferably ≥7, more preferably ≥9 and even more preferably ≥11.

The formula (LII) also subsumes mixtures of anions with various values of c and d where c+d is the same. However, the formula (LII) also subsumes mixtures of anions with different values of c and d.

Examples of anions of formula (LII) are:

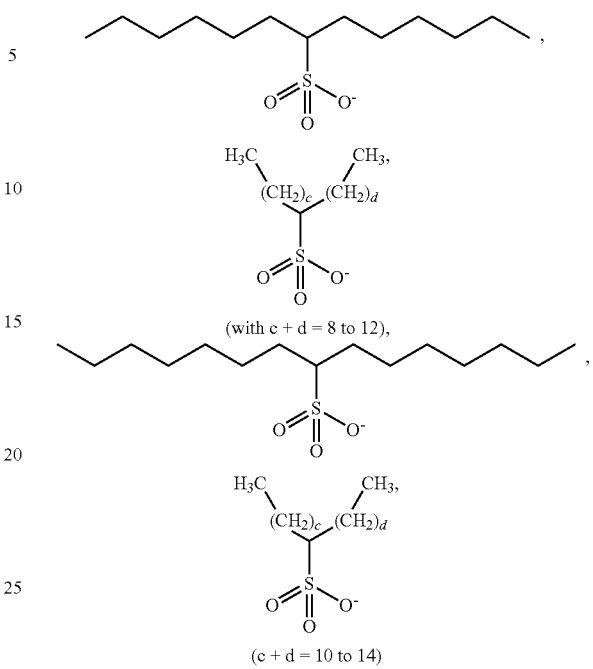

(with c + d = 8 to 12), (c + d = 10 to 14)

and also as mixture of all conceivable isomers.

It is likewise particularly preferable for

An⁻ to represent a secondary or branched alkyl sulphate of formula (LIII)

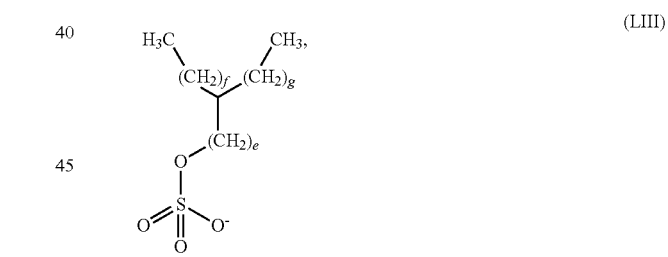
(LIII)

where e represents an integer from 0 to 5, f and g independently of each other represent an integer from 0 to 15 subject to the proviso that e+f+g is ≥5 and the $CH_2$ groups may additionally be substituted by further methyl or ethyl groups.

e+f+g is preferably ≥7, more preferably ≥9 and even more preferably ≥11.

e preferably represents 0 or 1.

It is preferable for two $CH_2$ groups to be methyl and/or ethyl substituted.

The formula (LIII) also subsumes mixtures of anions with various values of e, f and g where e+f+g is the same. However, the formula (LIII) also subsumes mixtures of anions with different values of e, f and g.

Examples of anions of formula (LIII) are:

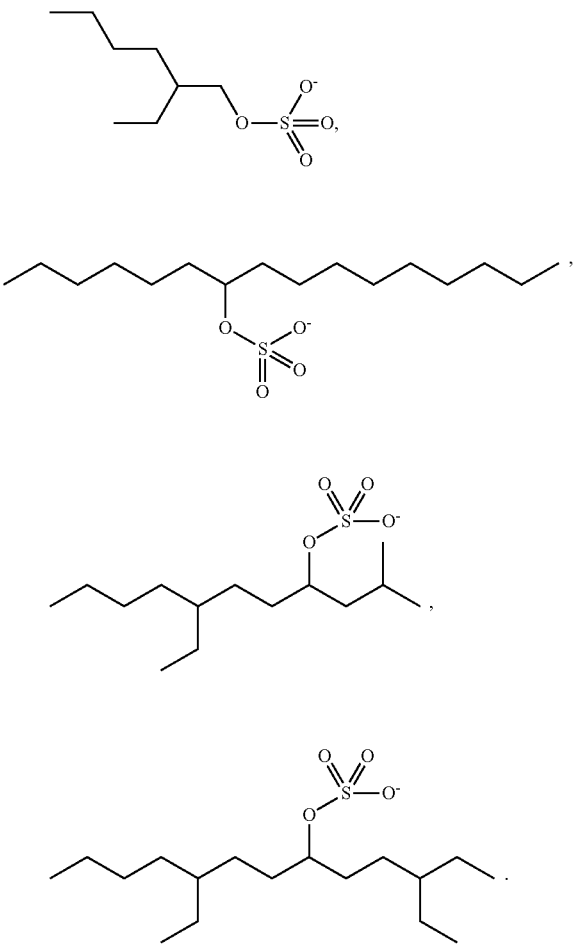

It is likewise particularly preferable for
An⁻ to represent a branched phosphate of formula (LIV)

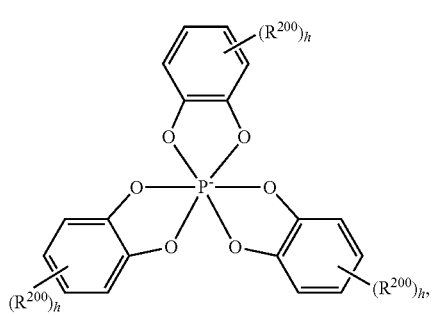

where
$R^{200}$ represents hydrogen or halogen,
h represents an integer from 1 to 4.
Preferably, $R^{200}$ represents chlorine or bromine and h represents 4.

Examples of anions of formula (LIV) are:

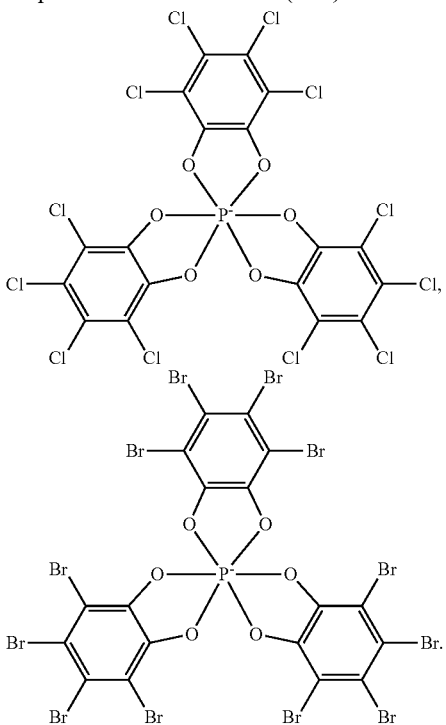

It is likewise particularly preferable for
An⁻ to represent an alkyl sulphate of formula (LV)

where
i represents an integer from 12 to 25.
Preferably, i represents an integer from 18 to 25.
Examples of anions of formula (LV) are:

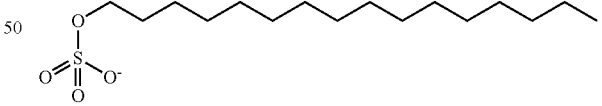

It is likewise particularly preferable for
An⁻ to represent a sulphosuccinate of formula (LVI)

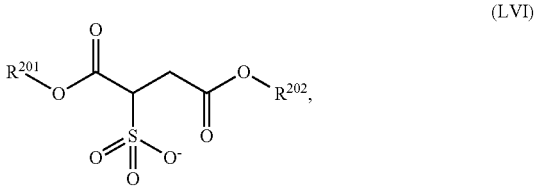

where
R²⁰¹ and R²⁰² independently of each other represents a C₄- to C₁₆-alkyl moiety, which may be branched, a C₂- to C₁₂-alkyl moiety substituted by 4 or more fluorine atoms, a C₅- to C₇-cycloalkyl moiety or a C₇- to C₁₀-aralkyl moiety. Preferably R²⁰¹ and R²⁰² are the same.

It is particularly preferable for R²⁰¹ and R²⁰² to represent a C₆- to C₁₂-alkyl moiety, which may be branched, a C₄- to C₈-alkyl moiety substituted by 6 or more fluorine atoms, cyclohexyl or benzyl. It is very particularly preferable for R²⁰¹ and R²⁰² to represent n-hexyl, n-octyl, 2-ethylhexyl or 1H,1H,7H-dodecafluoroheptyl.

Examples of anions of formula (LVI) are:

It is likewise particularly preferable for An⁻ to represent an ester sulphonate of formula (LVII)

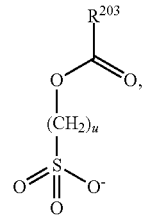

(LVII)

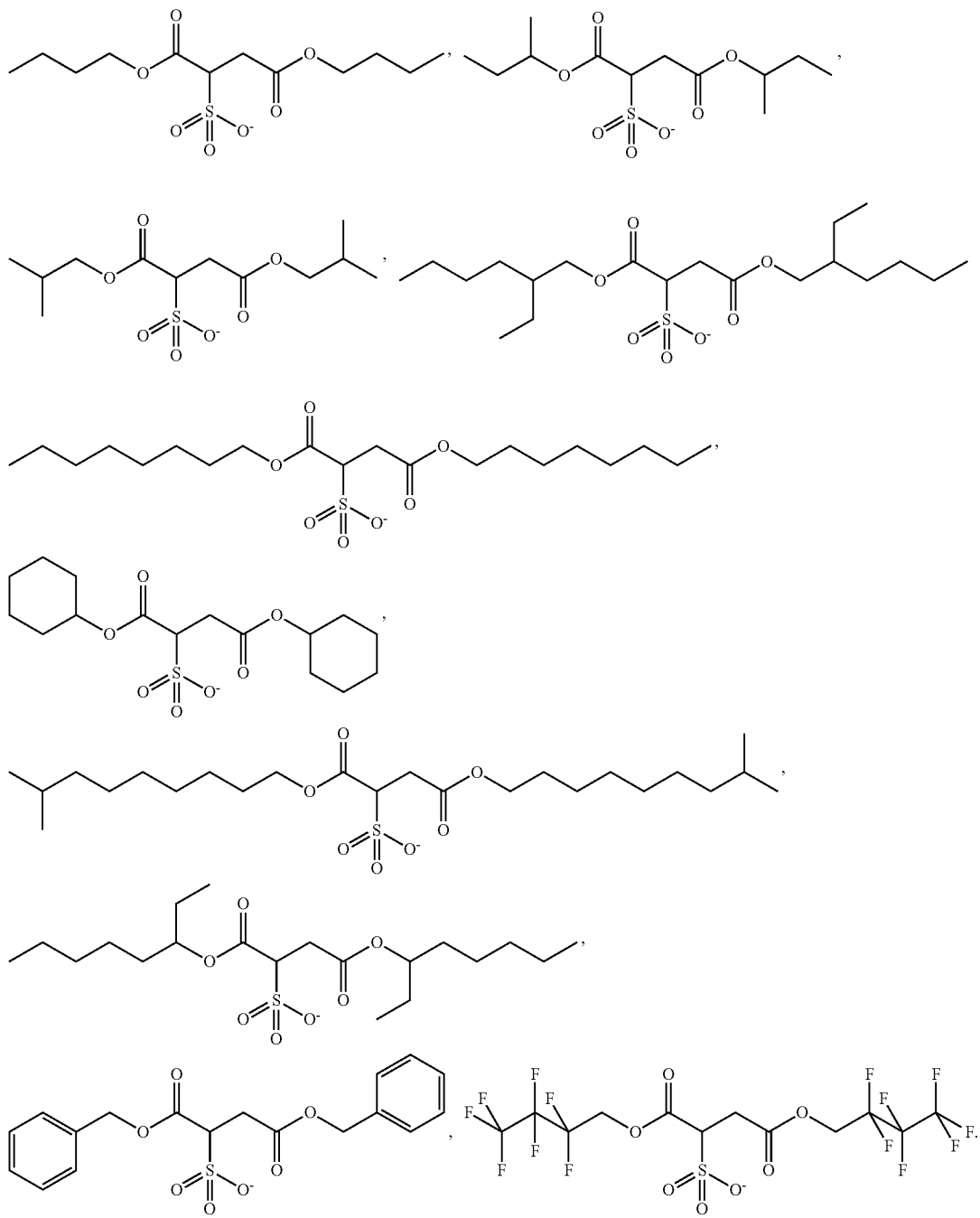

where
R$^{203}$ represents a C$_2$- to C$_{22}$-alkyl or alkenyl moiety, which may be branched or substituted, and
u represents an integer from 2 to 4.

Preferably, R$^{203}$ represents a branched or unbranched C$_6$- to C$_{17}$-alkyl or alkenyl radical or represents —CH=CH$_2$ or —C(CH$_3$)=CH$_2$, and more preferably represents a branched or unbranched C$_6$- to C$_{17}$-alkyl or alkenyl radical.

Preferably, u represents 3 or 4.

Examples of anions of formula (LVII) are:

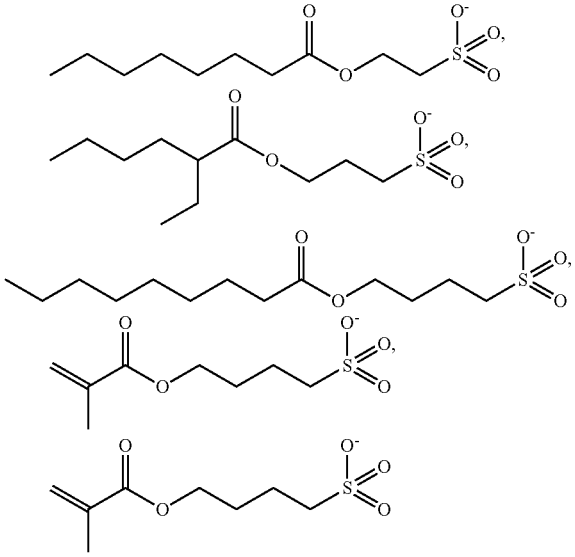

It is likewise particularly preferable for

An$^-$ to represent an ester sulphonate or ester sulphates of formula (LVIII)

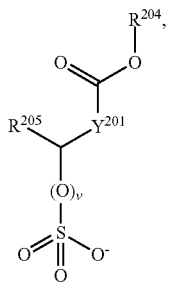

(LVIII)

where
v represents 0 or 1,
R$^{204}$ represents C$_1$- to C$_{18}$-alkyl, which may be branched and/or substituted,
R$^{205}$ represents hydrogen or C$_1$- to C$_8$-alkyl, and
Y$^{201}$ represents a direct bond, an aliphatic C$_1$ to C$_{22}$ bridge or an olefinic C$_2$ to C$_{22}$ bridge,
subject to the proviso that Y$^{201}$ and R$^{204}$ together have 7 or more carbon atoms.

Examples of anions of formula (LVIII) are:

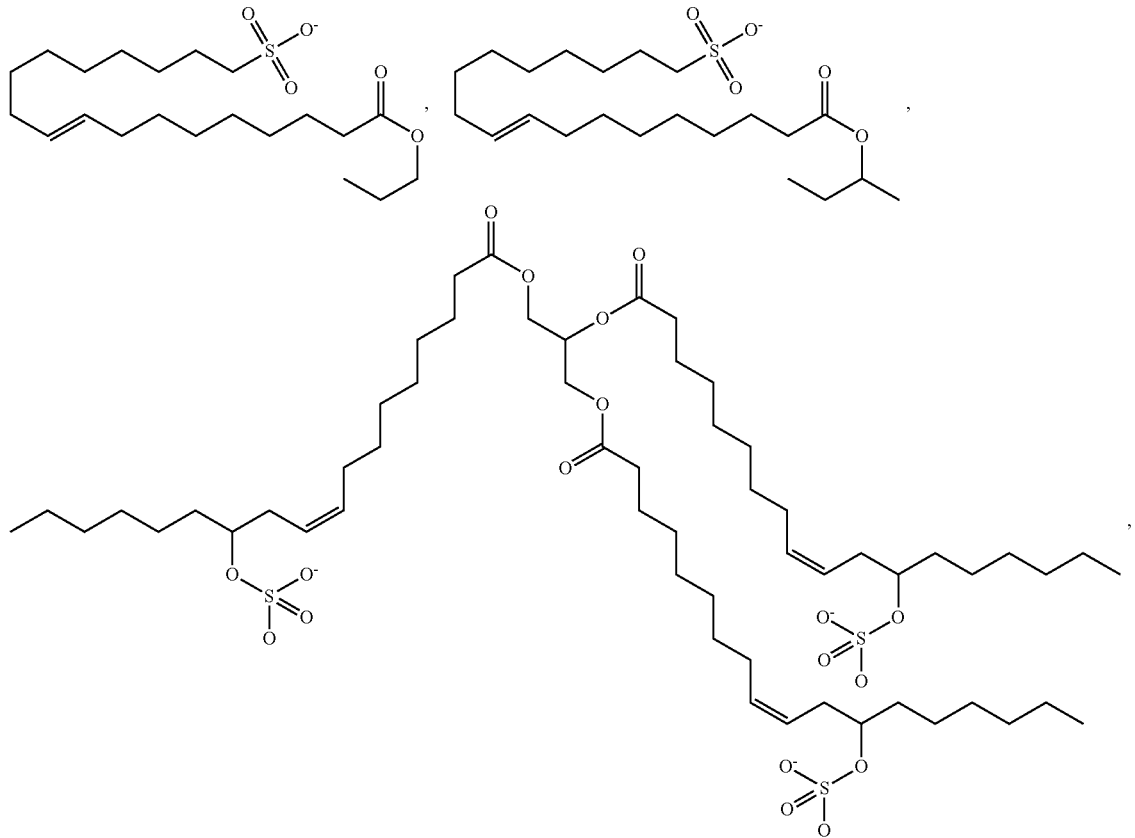

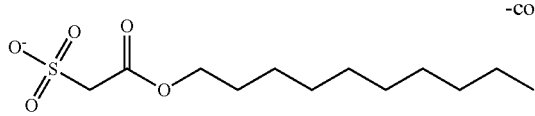

It is likewise particularly preferable for An⁻ to represent a borate of formula (LIX)

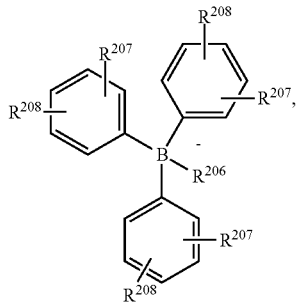
(LIX)

where
R$^{206}$ represents cyano, C$_1$- to C$_{12}$-alkyl, C$_7$- to C$_{10}$-aralkyl or a moiety of formula

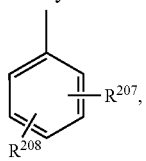

R$^{207}$ and R$^{208}$ independently of each other represents hydrogen, C$_1$- to C$_4$-alkyl, C$_1$- to C$_4$-alkoxy, halogen, cyano or nitro, or two adjacent R$^{207}$ and R$^{208}$ form a —CH=CH—CH=CH— bridge.

It is particularly preferable for
R$^{206}$ to represent cyano, butyl, pentyl, hexyl, benzyl or a moiety of formula

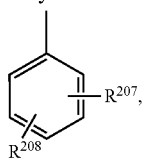

R$^{207}$ and R$^{208}$ independently of each other to represent hydrogen, methyl, methoxy, fluorine, chlorine or cyano or two adjacent R$^{207}$ and R$^{208}$ to form a —CH=CH—CH=CH— bridge.

Examples of examples of anions of formula (LIX) are:

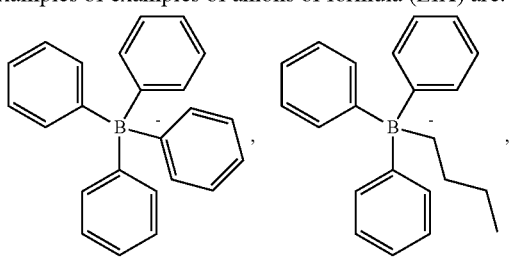

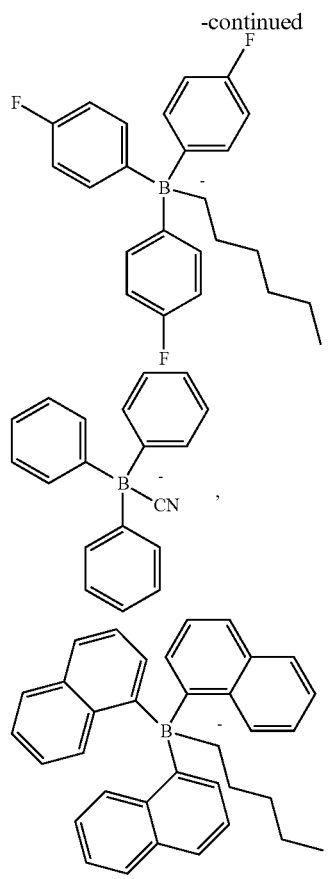

It is likewise particularly preferable for
An⁻ to represent a fluorinated alkyl sulphate of formula (LX)

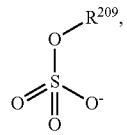
(LX)

where
R$^{209}$ represents a C$_4$- to C$_{18}$-alkyl radical bearing 4 or more fluorine atoms.

Preferably, R$^{209}$ represents a C$_8$- to C$_{18}$-alkyl moiety bearing 6 or more fluorine atoms. It is likewise preferable for R$^{209}$ to represent a perfluorinated C$_6$- to C$_{12}$-alkyl moiety.

Examples of anions of formula (LX) are:

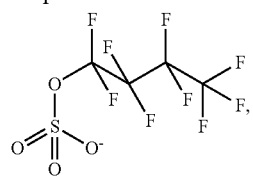

*-continued*

[Chemical structure: perfluorinated alkyl sulfate anion with 6 carbons]

[Chemical structure: perfluorinated alkyl sulfate anion with 8 carbons]

The cationic dyes and anions are either known or obtainable similarly to known processes.

Cationic dyes of formula F⁺ are preferably those of the following formulae:

[Chemical structure (I): phenoxazine/phenothiazine type dye]

where $X^1$ represents O, S, N—$R^6$ or $CR^{6a}R^{6b}$, $X^2$ represents N or C—$R^5$, $R^5$ represents hydrogen, cyano, $C_1$- to $C_4$-alkyl, $C_4$- to $C_7$-cycloalkyl, an optionally $C_1$- to $C_4$-alkoxycarbonyl- or $NR^7R^8$-substituted $C_6$- to $C_{10}$-aryl or a heterocyclic moiety, $R^6$ represents hydrogen, $C_1$- to $C_{16}$-alkyl, $C_4$- to $C_7$-cycloalkyl, $C_7$- to $C_{16}$-aralkyl, $C_6$- to $C_{10}$-aryl or a heterocyclic radical, $R^{6a}$ and $R^{6b}$ are the same and represent methyl, ethyl or conjointly a —$CH_2$—$CH_2$—$CH_2$— or —$CH_2$—$CH_2$—$CH_2$—$CH_2$— bridge, $R^1$ to $R^4$, $R^7$ and $R^8$ independently of each other represent hydrogen, $C_1$- to $C_{16}$-alkyl, $C_4$- to $C_7$-cycloalkyl, $C_7$- to $C_{16}$-aralkyl, $C_6$- to $C_{10}$-aryl or a heterocyclic moiety, or $NR^1R^2$, $NR^3R^4$ and $NR^7R^8$ independently of each other represent a five- or six-membered saturated ring which is attached via N and which may additionally contain an N or O and/or may be substituted by nonionic moieties, or $R^1$ to $R^4$, $R^7$ and $R^8$ independently of each other combine with a benzene ring carbon atom adjacent to the nitrogen atom to form a two- or three-membered bridge, which may contain an O or N and/or may be substituted by nonionic moieties, $R^9$, $R^{9a}$, $R^{9b}$, $R^{10}$, $R^{10a}$ and $R^{10b}$ independently of each other represent hydrogen, halogen or $C_1$- to $C_4$-alkyl,

[Chemical structure (II): triarylmethane type dye]

where $R^{15}$ represents hydrogen, halogen, $C_1$- to $C_4$-alkyl, $C_1$- to $C_4$-alkoxy or $NR^{18}R^{19}$, $R^{11}$ to $R^{14}$, $R^{18}$ and $R^{19}$ independently of each other represent hydrogen, $C_1$- to $C_{16}$-alkyl, $C_4$- to $C_7$-cycloalkyl, $C_7$- to $C_{16}$-aralkyl, $C_6$- to $C_{10}$-aryl or a heterocyclic moiety, or $NR^{11}R^{12}$, $NR^{13}R^{14}$ and $NR^{18}R^{19}$ independently of each other represent a five- or six-membered saturated ring which is attached via N and which may additionally contain an N or O and/or may be substituted by nonionic moieties, or $R^{12}$; $R^{17b}$, $R^{13}$; $R^{17c}$ and $R^{18}$; $R^{17a}$ independently of each other form a two- or three-membered bridge, which may contain an O or N and/or may be substituted by nonionic moieties, $R^{16}$ represents hydrogen, chlorine, methyl, methoxycarbonyl or ethoxycarbonyl, $R^{16a}$ represents hydrogen, chlorine or methyl, $R^{17a}$, $R^{17b}$ and $R^{17c}$ independently of each other represent hydrogen, chlorine, methyl or methoxy,

[Chemical structure (III)]

where

A and B together with $X^{21}$ to $X^{24}$ and the atoms connecting them independently of each other represent a five- or six-membered aromatic or quasiaromatic or partially hydrogenated heterocyclic ring, which may each contain 1 to 4 heteroatoms and/or be benzo- or naphtho-fused and/or be substituted by nonionic moieties, in which case the chain attaches to the respective ring in position 2 or 4 relative to $X^{21}$ and $X^{22}$ respectively, $X^{21}$ and $X^{22}$ represent nitrogen, or $X^{21}$—$R^{21}$ and $X^{22}$—$R^{22}$ independently of each other represent O or S, $X^{23}$ and $X^{24}$ independently of each other represent O, S, N—$R^{23}$, $CR^{24}$ or $CR^{25}R^{26}$, $Y^{21}$ represents N or C—$R^{27}$, w represents 0 or 1, $R^{21}$, $R^{22}$ and $R^{23}$ independently of each other represent $C_1$- to $C_{16}$-alkyl, $C_3$- to $C_6$-alkenyl, $C_5$- to $C_7$-cycloalkyl or $C_7$- to $C_{16}$-aralkyl, $R^{27}$, $R^{28}$ and $R^{29}$ independently of each other represent hydrogen, $C_1$- to $C_{16}$-alkyl or cyano, $R^{24}$ represents hydrogen or $C_1$- to $C_4$-alkyl, $R^{25}$ and $R^{26}$ independently of each other represent $C_1$- to $C_{16}$-alkyl or $C_7$- to $C_{10}$-aralkyl or conjointly form a —$CH_2$—$CH_2$—$CH_2$— or —$CH_2$—$CH_2$—$CH_2$—$CH_2$- bridge,

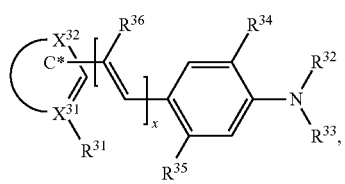
(IV)

where

C together with $X^{31}$ and $X^{32}$ and the atoms connecting them independently of each other represent a five- or six-membered aromatic or quasiaromatic or partially hydrogenated heterocyclic ring which may each contain 1 to 4 heteroatoms and/or be benzo- or naphtho-fused and/or be substituted by nonionic moieties, in which case the chain attaches to the ring in position 2 or 4 relative to $X^{31}$, $X^{31}$ represents nitrogen, or $X^{31}$—$R^{31}$ represents O or S, $X^{32}$ represent O, S, N—$R^{37}$, $CR^{38}$ or $CR^{39}R^{40}$, $R^{31}$ and $R^{37}$ independently of each other represent $C_1$- to $C_{16}$-alkyl, $C_3$- to $C_6$-alkenyl, $C_5$- to $C_7$-cycloalkyl or $C_7$- to $C_{16}$-aralkyl, $R^{38}$ represents hydrogen or $C_1$- to $C_4$-alkyl, $R^{39}$ and $R^{40}$ independently of each other represent $C_1$- to $C_4$-alkyl, $C_3$- to $C_6$-alkenyl, $C_4$- to $C_7$-cycloalkyl or $C_7$- to $C_{10}$-aralkyl or conjointly form a —$CH_2$—$CH_2$—$CH_2$— or —$CH_2$—$CH_2$—$CH_2$—$CH_2$— bridge, $R^{32}$ and $R^{33}$ independently of each other represent hydrogen, $C_1$- to $C_{16}$-alkyl, $C_4$- to $C_7$-cycloalkyl, $C_7$- to $C_{16}$-aralkyl, $C_6$- to $C_{10}$-aryl or a heterocyclic moiety, or $NR^{32}R^{33}$ represent a five- or six-membered saturated ring which is attached via N and which may additionally contain an N or O and/or be substituted by nonionic moieties, $R^{34}$ represents hydrogen, $C_1$- to $C_{16}$-alkyl, $C_1$- to $C_{16}$-alkoxy or halogen, or $R^{34}$ combines with $R^{32}$ to form a two- or three-membered bridge which may contain an O or N and/or be substituted by nonionic moieties, $R^{35}$ represents hydrogen, $C_1$- to $C_4$-alkyl, $C_1$- to $C_4$-alkoxy, halogen, cyano, $C_1$- to $C_4$-alkoxycarbonyl, O—CO—$C_1$- to $C_4$-alkyl, NH—CO—$C_1$- to $C_4$-alkyl, O—$SO_2$—$C_1$- to $C_4$-alkyl or NH—$SO_2$—$C_1$- to $C_4$-alkyl, $R^{36}$ represents hydrogen, $C_1$- to $C_4$-alkyl or cyano, x represents 0 or 1, where $Y^{42}$ represents a moiety of formulae (Va) or (Vb)

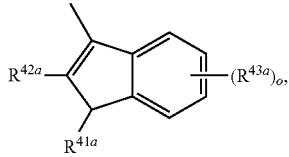
(Va)

(Vb)

$R^{41}$, $R^{41a}$ and $R^{41b}$ independently of each other represent $C_1$- to $C_{16}$-alkyl, $C_3$- to $C_6$-alkenyl, $C_5$- to $C_7$-cycloalkyl or $C_7$- to $C_{16}$-aralkyl or $C_6$- to $C_{10}$-aryl, $R^{42}$ and $R^{42a}$ independently of each other represent hydrogen, $C_1$- to $C_{16}$-alkyl, $C_3$- to $C_6$-alkenyl, $C_5$- to $C_7$-cycloalkyl or $C_7$- to $C_{16}$-aralkyl, $C_6$- to $C_{10}$-aryl or hetaryl, $R^{43}$ and $R^{43a}$ independently of each other represents hydrogen, $C_1$- to $C_4$-alkyl, $C_1$- to $C_4$-alkoxy, halogen, cyano, nitro or $C_1$- to $C_4$-alkoxycarbonyl or two adjacent $R^{43}$ or $R^{43a}$ represent —CH=CH—CH=CH—, n and o independently of each other represent an integer from 0 to 4, $Y^{41}$ represents $CR^{44}$, =$CR^{45a}$—$CR^{46}$=$CR^{45b}$— or N, $Y^{43}$ represents CH or N, $R^{44}$, $R^{45a}$, $R^{45b}$ and $R^{46}$ independently of each other represent hydrogen, $C_1$- to $C_4$-alkyl, $C_5$- to $C_6$-cycloalkyl, $C_6$-aryl, hetaryl, halogen or cyano, D together with $X^{41}$, $X^{42}$ and the carbon atom connected therebetween represents a five- or six-membered aromatic or quasiaromatic or partially hydrogenated heterocyclic ring which may contain 1 to 4 heteroatoms and/or be benzo- or naphtho-fused and/or be substituted by nonionic moieties, in which case the chain attaches to the ring in position 2 or 4 relative to $X^{41}$, $X^{41}$ represents N, or $X^{41}$—$R^{41b}$ represents O or S, $X^{42}$ represents O, S, $CR^{47}R^{48}$ or —CH=CH—, $R^{47}$ and $R^{48}$ independently of each other represent $C_1$- to $C_4$-alkyl, $C_3$- to $C_6$-alkenyl, $C_4$- to $C_7$-cycloalkyl, $C_7$- to $C_{10}$-aralkyl or $C_6$-aryl or conjointly form a —$CH_2$—$CH_2$—$CH_2$— or —$CH_2$—$CH_2$—$CH_2$—$CH_2$— bridge, (V)

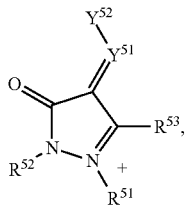
(VI)

where $Y^{52}$ represents a radical of formulae (VIa), (VIb) or (VIc)

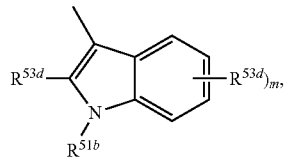
(VIa)

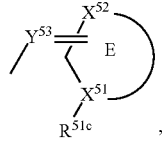
(VIb)

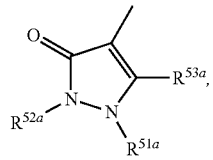
(VIc)

$R^{51}$, $R^{51a}$, $R^{51b}$ and $R^{51c}$ independently of each other represent $C_1$- to $C_{16}$-alkyl, $C_3$- to $C_6$-alkenyl, $C_5$- to $C_7$-cycloalkyl or $C_7$- to $C_{16}$-aralkyl or $C_6$- to $C_{10}$-aryl, $R^{52}$ and $R^{52a}$ independently of each other represent $C_1$- to $C_{16}$-alkyl, $C_3$- to $C_6$-alkenyl, $C_5$- to $C_7$-cycloalkyl or $C_7$- to $C_{16}$-aralkyl or $C_6$- to $C_{10}$-aryl, $R^{53}$ and $R^{53a}$ independently of each other represent $C_1$- to $C_4$-alkyl, halogen, cyano, nitro or $C_1$- to $C_4$-alkoxycarbonyl, $R^{53d}$ represents hydrogen, $C_1$- to $C_{16}$-alkyl, $C_3$- to $C_6$-alkenyl, $C_5$- to $C_7$-cycloalkyl or $C_7$- to $C_{16}$-aralkyl, $C_6$- to $C_{10}$-aryl or hetaryl, $R^{53b}$ represents hydrogen, $C_1$- to $C_4$-alkyl, $C_1$- to $C_4$-alkoxy, halogen, cyano, nitro or $C_1$- to $C_4$-alkoxycarbonyl or two adjacent $R^{53b}$ or $R^{53c}$ represent —CH=CH—CH=CH—, m represents an integer from 0 to 4, $Y^{51}$ represents $CR^{54}$, =$CR^{55a}$—$CR^{56}$=$CR^{55b}$— or N, $Y^{53}$ represents CH or N, $R^{54}$, $R^{55a}$, $R^{55b}$ and $R^{56}$ independently of each other represent hydrogen, $C_1$- to $C_4$-alkyl, $C_5$- to $C_6$-cycloalkyl, $C_6$-aryl, hetaryl, halogen or cyano, E together with $X^{51}$, $X^{52}$ and the carbon atom connected therebetween represents a five- or six-membered aromatic or quasiaromatic or partially hydrogenated heterocyclic ring which may contain 1 to 4 heteroatoms and/or be benzo- or naphtho-fused and/or be substituted by nonionic moieties, in which case the chain attaches to the ring in position 2 or 4 relative to $X^{51}$, $X^{51}$ represents N, or $X^{51}$—$R^{51c}$ represents O or S, $X^{52}$ represents O, S, $CR^{57}R^{58}$ or —CH=CH—, $R^{57}$ and $R^{58}$ independently of each other represent $C_1$- to $C_4$-alkyl, $C_3$- to $C_6$-alkenyl, $C_4$- to $C_7$-cycloalkyl, $C_7$- to $C_{10}$-aralkyl or $C_6$-aryl or conjointly form a —$CH_2$—$CH_2$—$CH_2$— or —$CH_2$—$CH_2$—$CH_2$—$CH_2$— bridge,

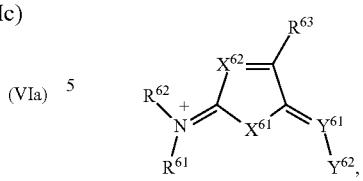
(VII)

where $Y^{62}$ represents a radical of formulae

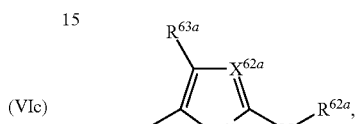
(VIIa)

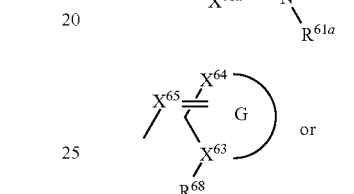
(VIIb)

or

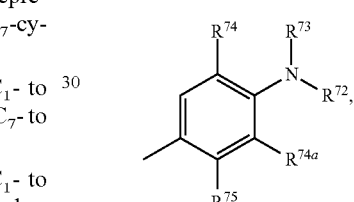
(VIIc)

$X^{61}$ and $X^{61a}$ independently of each other represent O or S, $X^{62}$ and $X^{62a}$ independently of each other represent $CR^{66}$ or N, $R^{63}$ and $R^{63a}$ independently of each other represent hydrogen, $C_1$- to $C_6$-alkyl, halogen, hydroxyl, $C_6$- to $C_{10}$-aryl or $NR^{64}R^{65}$ or $R^{63}$ and $R^{63a}$ together represent a —$C(CH_3)_2$— bridge when $Y^{61}$ represents CH and $Y^{62}$ represents a moiety of formula (VIIa), $R^{61}$, $R^{61a}$, $R^{62}$, $R^{62a}$, $R^{64}$ and $R^{65}$ independently of each other represent hydrogen, $C_1$- to $C_6$-alkyl, $C_5$- to $C_7$-cycloalkyl, $C_6$- to $C_{10}$-aryl or $C_7$- to $C_{15}$-aralkyl, or $NR^{61}R^{62}$ and $NR^{64}R^{65}$ independently of each other represent pyrrolidino, morpholino, piperazino or piperidino, $R^{66}$ represents hydrogen, cyano, $C_1$- to $C_6$-alkyl, halogen or $C_6$- to $C_{10}$-aryl, $Y^{61}$ represents =$Y^{63}$—$(Y^{64}=Y^{65})_p$—, $Y^{63}$ to $Y^{65}$ independently of each other represent N or C—$R^{67}$, P represents 0 or 1, $R^{67}$ represents hydrogen, cyano or $C_1$- to $C_3$-alkyl, or $R^{67}$ represents a radical of formula (VIIa), when p represents 1, G together with $X^{63}$, $X^{64}$ and the carbon atom connected therebetween represents a five- or six-membered aromatic or quasiaromatic or partially hydrogenated heterocyclic ring which may contain 1 to 4 heteroatoms and/or be benzo- or naphtho-fused and/or be substituted by nonionic moieties, in which case the chain attaches to the ring in position 2 or 4 relative to $X^{63}$, $X^{63}$ represents nitrogen, or $X^{63}$—$R^{68}$ represents O or S, $X^{64}$ represents O, S, N—$R^{69}$ or $CR^{70}R^{71}$, $X^{65}$ represents N or C—$R^{67}$, $R^{68}$ and $R^{69}$ independently of each other represent $C_1$- to $C_{16}$-alkyl, $C_3$- to $C_6$-alkenyl, $C_5$- to $C_7$-cycloalkyl or $C_7$- to $C_{16}$-aralkyl, $R^{76}$ and $R^{71}$ independently of each other represent $C_1$- to $C_4$-alkyl or $C_7$- to $C_{10}$-aralkyl or conjointly form a —$CH_2$—$CH_2$—$CH_2$— or —$CH_2$—$CH_2$—$CH_2$—$CH_2$— bridge, $R^{72}$ and $R^{73}$ independently of each other represent hydrogen, $C_1$- to $C_{16}$-alkyl, to cycloalkyl, $C_7$- to $C_{16}$-aralkyl, $C_6$- to $C_{10}$-aryl or a heterocyclic radical, or $NR^{72}R^{73}$ represent a five- or six-membered saturated ring which is attached via N which may additionally contain an N or O and/or be substituted by nonionic moieties, $R^{74}$ and $R^{74a}$ independently of each other represent hydrogen, $C_1$- to $C_4$-alkyl, $C_1$- to $C_4$-alkoxy or halogen, or $R^{74}$; $R^{73}$ and/or $R^{74a}$; $R^{72}$ form a two- or three-membered bridge which may contain an O or N and/or be substituted by nonionic moieties, $R^{75}$ represents hydrogen, $C_1$- to $C_4$-alkyl, $C_1$- to $C_4$-alkoxy, halogen, cyano, $C_1$- to $C_4$-alkoxycarbonyl, O—CO—$C_1$- to $C_4$-alkyl, NH—CO—$C_1$- to $C_4$-alkyl, O—$SO_2$—$C_1$- to $C_4$-alkyl or NH—$SO_2$—$C_1$- to $C_4$-alkyl,

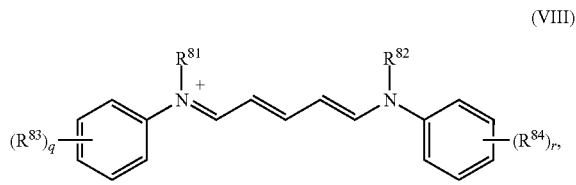

(VIII)

where $R^{81}$ and $R^{82}$ independently of each other represent hydrogen, $C_1$- to $C_{16}$-alkyl, $C_3$- to $C_6$-alkenyl, $C_5$- to $C_7$-cycloalkyl or $C_7$- to $C_{16}$-aralkyl or $C_6$- to $C_{10}$-aryl, $R^{83}$ and $R^{84}$ independently of each other represents hydrogen, $C_1$- to $C_4$-alkyl, $C_1$- to $C_4$-alkoxy, halogen, cyano, nitro or $C_1$- to $C_4$-alkoxycarbonyl or two adjacent $R^{83}$ or $R^{84}$ represent —CH=CH—CH=CH—, or $R^{83}$; $R^{81}$ and/or $R^{84}$; $R^{82}$ form a two- or three-membered bridge which may be substituted by nonionic moieties, q and r independently of each other represent an integer from 0 to 4,

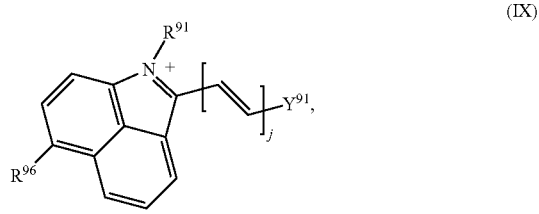

(IX)

where $Y^{91}$ represents a moiety of formulae (IXa) or (LXb)

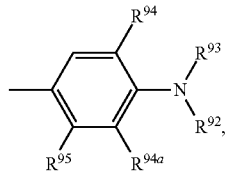

(IXa)

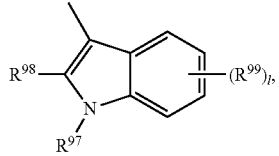

(IXb)

$R^{91}$ represent $C_1$- to $C_{16}$-alkyl, $C_3$- to $C_6$-alkenyl, $C_5$- to $C_7$-cycloalkyl or $C_7$- to $C_{16}$-aralkyl, $R^{92}$ and $R^{93}$ independently of each other represent hydrogen, $C_1$- to $C_{16}$-alkyl, $C_4$- to $C_7$-cycloalkyl, $C_7$- to $C_{16}$-aralkyl, $C_6$- to $C_{10}$-aryl or a heterocyclic radical, or $NR^{92}R^{93}$ represent a five- or six-membered saturated ring which is attached via nitrogen and which may additionally contain an N or O and/or be substituted by nonionic moieties, $R^{94}$ and $R^{94a}$ independently of each other represent hydrogen, $C_1$- to $C_4$-alkyl, $C_1$- to $C_4$-alkoxy or halogen, or $R^{94}$; $R^{93}$ and/or $R^{94a}$; $R^{92}$ form a two- or three-membered bridge which may contain an O or N and/or be substituted by nonionic moieties, $R^{95}$ represents hydrogen, $C_1$- to $C_4$-alkyl, $C_1$- to $C_4$-alkoxy, halogen, cyano, $C_1$- to $C_4$-alkoxycarbonyl, O—CO—$C_1$- to $C_4$-alkyl, NH—CO—$C_1$- to $C_4$-alkyl, O—$SO_2$—$C_1$- to $C_4$-alkyl or NH—$SO_2$—$C_1$- to $C_4$-alkyl, $R^{96}$ represents hydrogen, halogen, O—$C_1$- to $C_4$-alkyl or S—$C_1$- to $C_4$-alkyl, j represents 0 or 1, $R^{97}$ represents $C_1$- to $C_{16}$-alkyl, $C_3$- to $C_6$-alkenyl, $C_5$- to $C_7$-cycloalkyl or $C_7$- to $C_{16}$-aralkyl or $C_6$- to $C_{10}$-aryl, $R^{91}$ represents hydrogen, $C_1$- to $C_{16}$-alkyl, $C_3$- to $C_6$-alkenyl, $C_5$- to $C_7$-cycloalkyl or $C_7$- to $C_{16}$-aralkyl, $C_6$- to $C_{10}$-aryl or hetaryl, $R^{99}$ represents hydrogen, $C_1$- to $C_4$-alkyl, $C_1$- to $C_4$-alkoxy, halogen, cyano, nitro or $C_1$- to $C_4$-alkoxycarbonyl or two adjacent $R^{99}$ represent —CH=CH—CH=CH—, l represents an integer from 0 to 4,

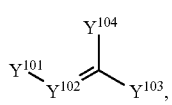

(X)

where $Y^{101}$ represents a radical of formulae

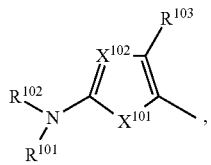

(Xa)

-continued

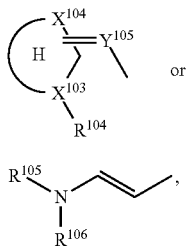

(Xb)

(Xc)

$X^{101}$ represents O or S, $X^{102}$ represents $CR^{107}$ or N, $R^{103}$ represents hydrogen, $C_1$- to $C_6$-alkyl, halogen, hydroxyl, $C_6$- to $C_{10}$-aryl or $NR^{101a}R^{102a}$, $R^{101}$, $R^{102}$, $R^{101a}$ and $R^{102a}$ independently of each other represent hydrogen, $C_1$- to $C_6$-alkyl, $C_5$- to $C_7$-cycloalkyl, $C_6$- to $C_{10}$-aryl or $C_7$- to $C_{15}$-aralkyl, or $NR^{101}R^{102}$ and/or $NR^{101a}R^{102a}$ represent pyrrolidino, morpholino, piperazino or piperidino, $R^{107}$ represents hydrogen, cyano, $C_1$- to $C_6$-alkyl, halogen or $C_6$- to $C_{10}$-aryl, H together with $X^{103}$, $X^{104}$ and the carbon atom connected therebetween represents a five- or six-membered aromatic or quasiaromatic or partially hydrogenated heterocyclic ring which may contain 1 to 4 heteroatoms and/or be benzo- or naphtho-fused and/or be substituted by nonionic moieties, in which case the chain attaches to the ring in position 2 or 4 relative to $X^{103}$, $X^{103}$ represents N, or $X^{103}$—$R^{104}$ represents O or S, $X^{104}$ represents O, S, $CR^{115}R^{116}$ or —CH=CH—, $R^{115}$ and $R^{116}$ independently of each other represent $C_1$- to $C_4$-alkyl, $C_3$- to $C_6$-alkenyl, $C_4$- to $C_7$-cycloalkyl, $C_7$- to $C_{10}$-aralkyl or $C_6$-aryl or conjointly form a —CH$_2$—CH$_2$—CH$_2$— or —CH$_2$—CH$_2$—CH$_2$—CH$_2$— bridge, $R^{104}$ represents $C_1$- to $C_{16}$-alkyl, $C_3$- to $C_6$-alkenyl, $C_5$- to $C_7$-cycloalkyl or $C_7$- to $C_{16}$-aralkyl or $C_6$- to $C_{10}$-aryl, $R^{105}$ and $R^{106}$ independently of each other represent hydrogen, $C_1$- to $C_{16}$-alkyl, $C_4$- to $C_7$-cycloalkyl, $C_7$- to $C_{16}$-aralkyl, $C_6$- to $C_{10}$-aryl or a heterocyclic moiety, or $NR^{105}R^{106}$ represent a five- or six-membered saturated ring which is attached via N and which may additionally contain an N or O and/or be substituted by nonionic moieties, $Y^{102}$ and $Y^{105}$ independently of each other represent N or $CR^{108}$, $R^{108}$ represents hydrogen, cyano or $C_1$- to $C_4$-alkyl, $Y^{103}$ represents CN, CO—$R^{109}$, COO—$R^{110}$, CONHR$^{110}$ or CONR$^{110}$R$^{111}$, $Y^{104}$ represents a cationic moiety of formula

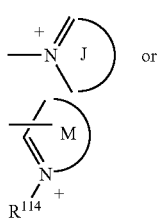

or $CY^{103}Y^{104}$ together represents a moiety of formulae

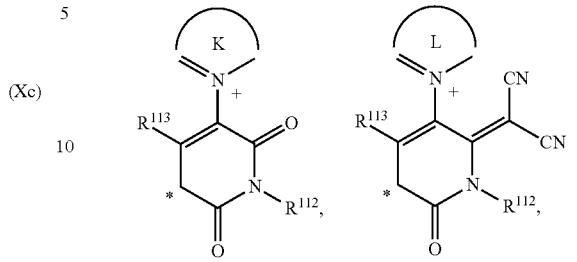

where the asterisk (*) indicates the ring atom from which the double bond emanates, $R^{109}$ to $R^{112}$ independently of each other represent hydrogen, $C_1$- to $C_6$-alkyl, $C_3$- to $C_6$-alkenyl, $C_5$- to $C_7$-cycloalkyl, $C_6$- to $C_{10}$-aryl or $C_7$- to $C_{15}$-aralkyl, $R^{113}$ represents hydrogen, cyano, COO—$R^{110}$ or $C_1$- to $C_4$-alkyl, J, K and L independently of each other combine with the nitrogen atom to represent a five- or six-membered aromatic or quasiaromatic or partially hydrogenated heterocyclic ring which may contain 1 to 4 heteroatoms and/or benzo- or naphtho-fused and/or be substituted by nonionic moieties, M combines with the nitrogen atom to represent a five- or six-membered aromatic or quasiaromatic or partially hydrogenated heterocyclic ring which may contain 1 to 4 heteroatoms and/or benzo- or naphtho-fused and/or be substituted by nonionic moieties, in which case the chain attaches to the ring in position 2 or 4 relative to the N atom, $R^{114}$ represents $C_1$- to $C_6$-alkyl, $C_3$- to $C_6$-alkenyl, $C_5$ to $C_7$-cycloalkyl, $C_6$- to $C_{10}$-aryl or $C_7$- to $C_{15}$-aralkyl, wherein two or more of these dye formulae (I) to (X) may be connected via a bridge and this bridge takes the place of $R^{21}$, $R^{22}$, $R^{31}$, $R^{32}$, $R^{41}$, $R^{41a}$, $R^{41b}$, $R^{51b}$, $R^{51c}$, $R^{61}$, $R^{61a}$, $R^{66}$, $R^{72}$, $R^{91}$, $R^{92}$, $R^{101}$, $R^{104}$ and/or $R^{105}$.

Cationic dyes of formula F$^+$ preferably also include those of the following formula:

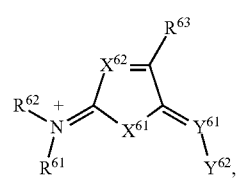

(VII)

where $Y^{62}$ represents a moiety of the formulae

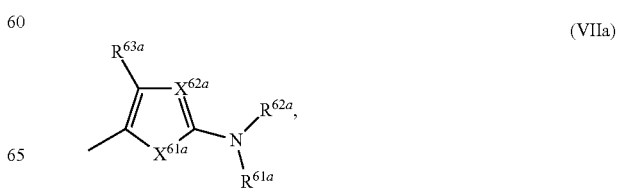

(VIIa)

-continued

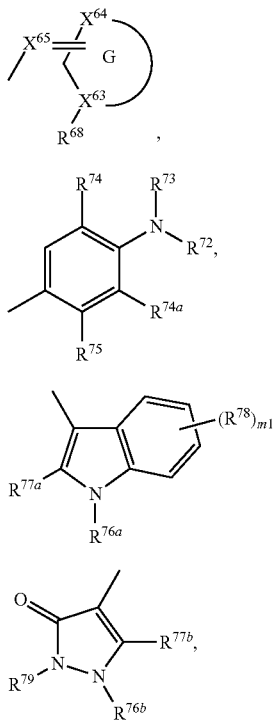

(VIIb)

(VIIc)

(VIId)

(VIIe)

$X^{61}$ and $X^{61a}$ independently of each other represent O or S, $X^{62}$ and $X^{62a}$ independently of each other represent $CR^{66}$ or N, $R^{63}$ and $R^{63a}$ independently of each other represent hydrogen, $C_1$- to $C_6$-alkyl, halogen, hydroxyl, $C_6$- to $C_{10}$-aryl or $NR^{64}R^{65}$ or $R^{63}$ and $R^{63a}$ together represent a $-C(CH_3)_2$ bridge when $Y^{61}$ represents CH and $Y^{62}$ represents a moiety of formula (VIIa), $R^{61}$, $R^{61a}$, $R^{62}$, $R^{62a}$, $R^{64}$ and $R^{65}$ independently of each other represent hydrogen, $C_1$- to $C_6$-alkyl, $C_5$- to $C_7$-cycloalkyl, $C_6$- to $C_{10}$-aryl or $C_7$- to $C_{15}$-aralkyl, or $NR^{61}R^{62}$ and $NR^{64}R^{65}$ independently of each other represent pyrrolidino, morpholino, piperazino or piperidino, $R^{66}$ represents hydrogen, cyano, $C_1$- to $C_6$-alkyl, halogen or $C_6$- to $C_{10}$-aryl, $Y^{61}$ represents $=Y^{63}-(Y^{64}=Y^{65})_p-$, $Y^{63}$ to $Y^{65}$ independently of each other represent N or $C-R^{67}$, p represents 0 or 1, $R^{67}$ represents hydrogen, cyano or $C_1$- to $C_3$-alkyl, or $R^{67}$ represents a moiety of formulae (VIIa), (VIIc) or represents in the case of p representing 1 a phenyl moiety optionally substituted by one or more $C_1$- to $C_4$-alkyl, halogen, $C_1$- to $C_4$-alkoxy, cyano, nitro or $C_1$- to $C_4$-alkoxycarbonyl, G together with $X^{63}$, $X^{64}$ and the carbon atom bound therebetween represents a five- or six-membered aromatic or quasiaromatic or partially hydrogenated heterocyclic ring which may contain 1 to 4 heteroatoms and/or may be benzo- or naphtho-fused and/or be substituted by nonionic moieties, in which case the chain attaches to the ring in position 2 or 4 relative to $X^{63}$, $X^{63}$ represents nitrogen, or $X^{63}-R^{68}$ represents O or S, $X^{64}$ represents O, S, $N-R^{69}$ or $CR^{70}R^{71}$, $X^{65}$ represents N or $C-R^{67}$, $R^{68}$ and $R^{69}$ independently of each other represent $C_1$- to $C_{16}$-alkyl, $C_3$- to $C_6$-alkenyl, $C_5$- to $C_7$-cycloalkyl or $C_7$- to $C_{16}$-aralkyl, $R^{70}$ and $R^{71}$ independently of each other represent $C_1$- to $C_4$-alkyl or $C_7$- to $C_{10}$-aralkyl or together form a $-CH_2-CH_2-CH_2-$ or $-CH_2-CH_2-CH_2-CH_2-$ bridge, $R^{72}$ and $R^{73}$ independently of each other represent hydrogen, $C_1$- to $C_{16}$-alkyl, $C_4$- to $C_7$-cycloalkyl, $C_7$- to $C_{16}$-aralkyl, $C_6$- to $C_{10}$-aryl or a heterocyclic moiety, or $NR^{72}R^{73}$ represents a five- or six-membered saturated ring which is attached via N and which may additionally contain an N or O and/or be substituted by nonionic moieties, $R^{74}$ and $R^{74a}$ independently of each other represent hydrogen, $C_1$- to $C_4$-alkyl, $C_1$- to $C_4$-alkoxy or halogen, or $R^{74}$; $R^{73}$ and/or $R^{74a}$; $R^{72}$ form a two- or three-membered bridge which may contain an O or N and/or be substituted by nonionic moieties, $R^{76a}$, $R^{76b}$ and $R^{79}$ independently of each other represent $C_1$- to $C_{10}$-alkyl, $C_3$- to $C_6$-alkenyl, $C_5$- to $C_7$-cycloalkyl, $C_7$- to $C_{16}$-aralkyl or $C_6$- to $C_{10}$-aryl, $R^{77a}$ represents hydrogen, $C_1$- to $C_{16}$-alkyl, $C_3$- to $C_6$-alkenyl, $C_5$- to $C_7$-cycloalkyl, $C_7$- to $C_{16}$-aralkyl, $C_6$- to $C_{10}$-aryl or hetaryl, $R^{77b}$ represents $C_1$- to $C_4$-alkyl, halogen, cyano, nitro or $C_1$- to $C_4$-alkoxycarbonyl, $R^{78}$ represents hydrogen, $C_1$- to $C_4$-alkyl, $C_1$- to $C_4$-alkoxy, halogen, cyano, nitro or $C_1$- to $C_4$-alkoxycarbonyl or two adjacent $R^{78}$ moieties represent $-CH=CH-CH=CH-$, $m^1$ represents an integer from 0 to 4.

Cationic dyes of formula $F^+$ preferably also include those of the following formula:

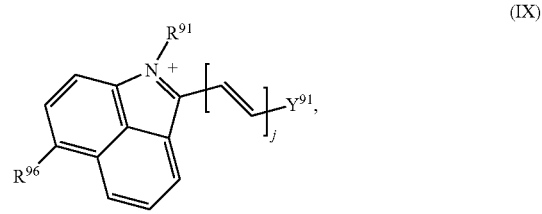

(IX)

where $Y^{91}$ represents a moiety of formulae (IXc)

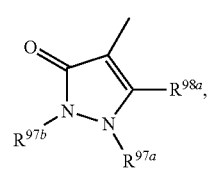

(IXc)

$R^{91}$ represents $C_1$- to $C_{16}$-alkyl, $C_3$- to $C_6$-alkenyl, $C_5$- to $C_7$-cycloalkyl or $C_7$- to $C_{16}$-aralkyl, j represents 0 or 1, $R^{97a}$ and $R^{97b}$ independently of each other represent $C_1$- to $C_{16}$-alkyl, $C_3$- to $C_6$-alkenyl, $C_5$- to $C_7$-cycloalkyl, $C_7$- to $C_{16}$-aralkyl or $C_6$- to $C_{10}$-aryl, $R^{98a}$ represents $C_1$- to $C_4$-alkyl, halogen, cyano, nitro or $C_1$- to $C_4$-alkoxycarbonyl.

Suitable bridges are for example those of formulae:

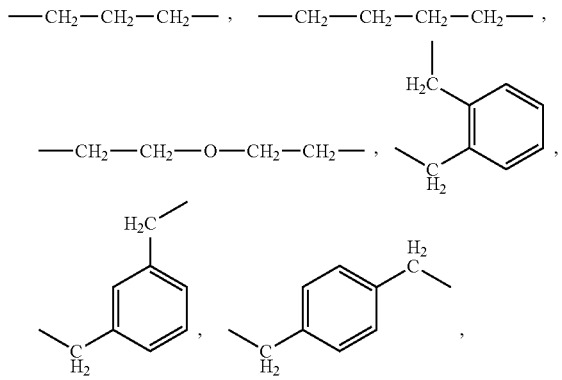

Nonionic moieties are $C_1$- to $C_4$-alkyl, $C_1$- to $C_4$-alkoxy, halogen, cyano, nitro, $C_1$- to $C_4$-alkoxycarbonyl, $C_1$- to $C_4$-alkylthio, $C_1$- to $C_4$-alkanoylamino, benzoylamino, mono- or di-$C_1$- to $C_4$-alkylamino.

Alkyl, alkoxy, cycloalkyl, aryl and heterocyclic moieties may optionally bear further moieties such as alkyl, halogen, nitro, cyano, CO—NH$_2$, alkoxy, trialkylsilyl, trialkylsiloxy or phenyl, the alkyl and alkoxy moieties may be straight-chain or branched, the alkyl moieties may be partially halogenated or perhalogenated, the alkyl and alkoxy moieties may be ethoxylated or propoxylated or silylated, adjacent alkyl and/or alkoxy moieties on aryl or heterocyclic moieties may conjointly form a three- or four-membered bridge, and the heterocyclic moieties may be benzo-fused and/or quaternized.

Halogen is to be understood as meaning fluorine, chlorine, bromine or iodine, preferably fluorine, chlorine or bromine.

Examples of substituted alkyl moieties are trifluoromethyl, chloroethyl, cyanomethyl, cyanoethyl, methoxyethyl. Examples of branched alkyl moieties are isopropyl, tert-butyl, 2-butyl, neopentyl. Examples of alkoxy moieties are methoxy, ethoxy, methoxyethoxy.

Preferred optionally substituted $C_1$- to $C_4$-alkyl moieties are methyl, ethyl, n-propyl, isopropyl, n-butyl, 2-butyl, isobutyl, tert-butyl, perfluorinated methyl, perfluorinated ethyl, 2,2-trifluoroethyl, 3,3,3-trifluoroethyl, perfluorobutyl, cyanoethyl, methoxyethyl, chloroethyl.

Preferred aralkyl may be for example benzyl, phenethyl or phenylpropyl.

Examples of $C_6$- to $C_{10}$-aryl are phenyl and naphthyl. Examples of substituted aryl moieties are tolyl, chlorophenyl, dichlorophenyl, methoxyphenyl, nitrophenyl, cyanophenyl, dimethylaminophenyl, diethylaminophenyl.

Examples of hetaryl moieties, particularly of five- or six-membered heterocyclic moieties, are indolyl, pyridyl, quinolyl, benzothiazolyl. Examples of substituted heterocyclic moieties are 1,2-dimethylindol-3-yl, 1-methyl-2-phenylindol-3-yl.

Examples of the rings A and C of formulae

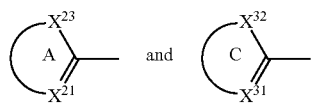

respectively
are: 2- or 4-pyridyl, 2- or 4-quinolyl, 2- or 4-pyrimidyl, pyrimid-2-on-4-yl, 2-pyrazinyl, 1,3-thiazol-2-yl, 1,3-thiazolin-2-yl, benzothiazol-2-yl, 1,3-oxazol-2-yl, 1,3-oxazolin-2-yl, benzoxazol-2-yl, imidazol-2-yl, imidazolin-2-yl, benzimidazol-2-yl, pyrrolin-2-yl, pyrrol-2-yl, 3-H-indol-2-yl, 3-H-benzindol-2-yl, 1,3,4-thiadiazol-2-yl, 1,2,4-thiadiazol-3-yl, benz-1,4-thiazin-3-yl, quinoxalin-2-yl or quinoxalin-3-on-2-yl, which may each be substituted by $C_1$- to $C_6$-alkyl, $C_1$- to $C_6$-alkoxy, fluorine, chlorine, bromine, iodine, cyano, nitro, $C_1$- to $C_6$-alkoxycarbonyl, $C_1$- to $C_6$-alkylthio, $C_1$- to $C_6$-acylamino, $C_6$- to $C_{10}$-aryl, $C_6$- to $C_{10}$-aryloxy, $C_6$- to $C_{10}$-arylcarbonylamino, mono- or di-$C_1$- to $C_6$-alkylamino, N—$C_1$- to $C_6$-alkyl-N—$C_6$- to $C_{10}$-arylamino, pyrrolidino, morpholine, piperidino or piperazino.

3-H-Indol-2-yl is to be understood as meaning particularly the 3,3-dialkyl derivatives, for example those of formulae

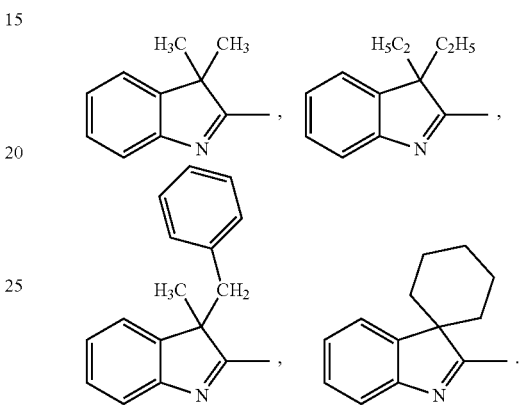

Examples of the rings A and C of formulae

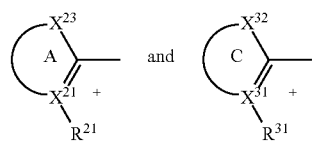

respectively
are: pyrylium-2- or -4-yl, thiopyrylium-2- or -4-yl, which may each be substituted by $C_1$- to $C_6$-alkyl or $C_6$- to $C_{10}$-aryl.

Examples of the rings B, D, E, G and H of formulae

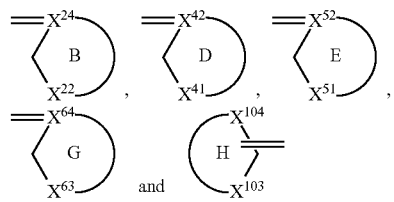

respectively
are: pyridin-2- or -4-ylene, quinolin-2- or -4-ylene, pyrimidin-2- or -4-ylene, pyrimid-2-on-4-ylene, pyrazin-2-ylene, 1,3-thiazol-2-ylene, 1,3-thiazolin-2-ylene, benzothiazol-2-ylene, 1,3-oxazol-2-ylene, 1,3-oxazolin-2-ylene, benzoxazol-2-ylene, imidazol-2-ylene, imidazolin-2-ylene, benzimidazol-2-ylene, pyrrolin-2-ylene, pyrrol-2-ylene, 3-H-indol-2-ylene, 3-H-benzindol-2-ylene, benz[c,d]indol-2-ylene, 1,3,4-thiadiazol-2-ylene, 1,2,4-thiadiazol-3-ylene, benz-1,4-thiazin-3-ylene, quinoxalin-2-ylene or quinoxalin-3-on-2-ylene, which may each be substituted by $C_1$- to $C_6$-alkyl, $C_1$- to $C_6$-alkoxy, fluorine, chlorine, bromine, iodine, cyano, nitro, $C_1$- to $C_6$-alkoxycarbonyl, $C_1$- to $C_6$-alkylthio, $C_1$- to $C_6$-acylamino, $C_6$- to $C_{10}$-aryl, $C_6$- to $C_{10}$-aryloxy, $C_6$- to $C_{10}$-arylcarbonylamino, mono- or di-$C_1$- to $C_6$-alkylamino, N—$C_1$- to $C_6$-alkyl-N—$C_6$- to $C_{10}$-arylamino, pyrrolidino, morpholino, piperidino or piperazino.

3-H-Indol-2-ylene is to be understood as meaning particularly the 3,3-dialkyl derivatives, for example, those of formulae

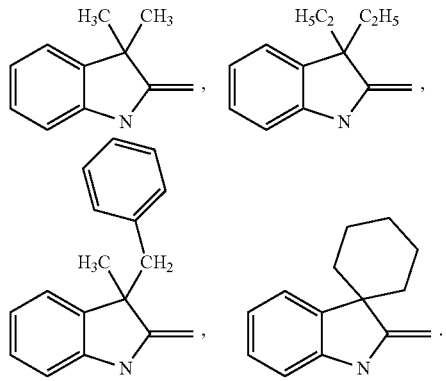

Examples of the rings B, D, E, G and H of formulae

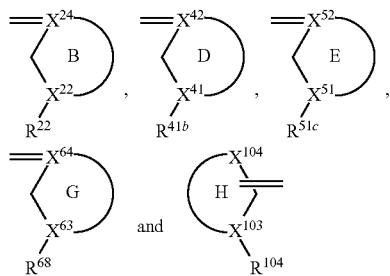

respectively
are: 2H-pyran-2-ylene, 4H-pyran-4-ylene, 2H-thiopyran-2-ylene, 4H-thiopyran-4-ylene, which may each be substituted by $C_1$- to $C_6$-alkyl or $C_6$- to $C_{10}$-aryl.

It is also possible for two or more, preferably two, dyes of formulae (I) to (X) to be connected via a bridge. Preferably, two identical dyes are connected to each other. Such a bridge may have, for example, one of the formulae —$CH_2$—[$CH_2$]$_k$—$CH_2$— or

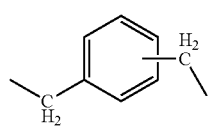

where
k represents an integer from 0 to 4, and
the two methylene groups on the benzene ring are disposed in o-, m- or p-position relative to each other.

Very particular preference is given to cationic dyes of formula (I)

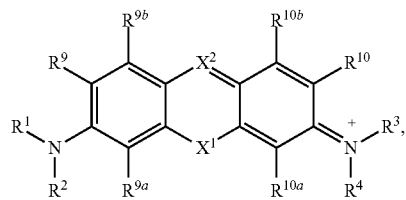

where
$X^1$ represents O, S or $CR^{6a}R^{6b}$,
$X^2$ represents C—$R^5$,
$R^5$ represents hydrogen, cyano, methyl, ethyl, cyclohexyl, phenyl, 2-methoxycarbonylphenyl, 2-ethoxycarbonylphenyl or 4-($R^7R^8N$)-phenyl,
$R^{6a}$ and $R^{6b}$ represent methyl,
$R^1$ to $R^4$, $R^7$ and $R^8$ independently of each other represent hydrogen, methyl, ethyl, propyl, butyl, chloroethyl, cyanomethyl, cyanoethyl, methoxyethyl, cyclopentyl, cyclohexyl, cyclohexylmethyl, benzyl, phenyl, tolyl, anisyl or chlorophenyl, or
$NR^1R^2$, $NR^3R^4$ and $NR^7R^8$ independently of each other represent pyrrolidino, piperidino, morpholino or N-methylpiperazino,
$R^9$, $R^{9a}$, $R^{9b}$, $R^{10}$, $R^{10a}$ and $R^{10b}$ represent hydrogen or in each case one of $R^9$, $R^{9a}$, $R^{9b}$ and/or one of $R^{10}$, $R^{10a}$ and $R^{10b}$ represents methyl, or
$R^1$; $R^9$, $R^2$; $R^{9a}$, $R^3$; $R^{10}$ and $R^4$; $R^{10a}$ independently of each other form a —$CH_2CH_2$—, —$CH_2CH_2CH_2$— or —$CH_2CH_2$—O— bridge which may bear up to three methyl groups.

Of outstanding preference are cationic dyes of formula (I), where
$X^1$ represents O, S or $CR^{6a}R^{6b}$,
$X^2$ represents C—$R^5$,
$R^5$ represents hydrogen, cyano, phenyl, 2-methoxycarbonylphenyl, 2-ethoxycarbonylphenyl or 4-($R^7R^8N$)-phenyl,
$R^{6a}$ and $R^{6b}$ represent methyl,
$R^1$ to $R^4$, $R^7$ and $R^8$ independently of each other represent methyl, ethyl, cyanoethyl, benzyl or phenyl, and
$R^1$, $R^3$ and $R^7$ may additionally represent hydrogen, or
$NR^1R^2$, $NR^3R^4$ and $NR^7R^8$ independently of each other represent pyrrolidino, piperidino or morpholino,
$R^9$, $R^{9a}$, $R^{9b}$, $R^{10}$, $R^{10a}$ and $R^{10b}$ represent hydrogen or in each case one of $R^9$, $R^{9a}$, $R^{9b}$ and/or one of $R^{10}$, $R^{10a}$ and $R^{10b}$ represents methyl.

Very particular preference is likewise given to cationic dyes of formula (I)

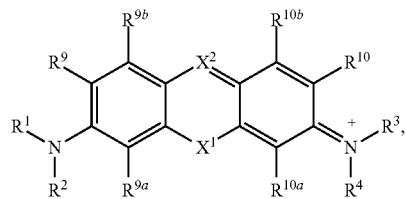

where
$X^1$ represents O, S or N—$R^6$,
$X^2$ represents N,
$R^6$ represents hydrogen, methyl, ethyl, propyl, butyl, cyclohexyl, benzyl, phenyl, tolyl, anisyl or chlorophenyl, R$^1$ to R$^4$ independently of each other represent hydrogen, methyl, ethyl, propyl, butyl, chloroethyl, cyanomethyl, cyanoethyl, methoxyethyl, cyclopentyl, cyclohexyl, cyclohexylmethyl, benzyl, phenyl, tolyl, anisyl or chlorophenyl, or NR$^1$R$^2$ and NR$^3$R$^4$ independently of each other represent pyrrolidino, piperidino, morpholino or N-methylpiperazino, R$^9$, R$^{9a}$, R$^{9b}$, R$^{10}$, R$^{10a}$ and R$^{10b}$ represent hydrogen or in each case one of R$^9$, R$^{9a}$, R$^{9b}$ and/or one of R$^{10}$, R$^{10a}$ and R$^{10b}$ represents methyl, or R$^1$; R$^9$, R$^2$; R$^{9a}$, R$^3$; R$^{10}$ and R$^4$; R$^{10a}$ independently of each other form a —CH$_2$CH$_2$—, —CH$_2$CH$_2$CH$_2$— or —CH$_2$CH$_2$—O— bridge which may bear up to three methyl groups.

Of outstanding preference are cationic dyes of formula (I), where

X$^1$ represents O, S or N—R$^6$,
X$^2$ represents N,
R$^6$ represents phenyl,
R$^1$ to R$^4$ independently of each other represent hydrogen, methyl, ethyl, cyanoethyl or phenyl,
R$^9$, R$^{9a}$, R$^{9b}$, R$^{10}$, R$^{10a}$ and R$^{10b}$ represent hydrogen or in each case one of R$^9$, R$^{9a}$, R$^{9b}$ and/or one of R$^{10}$, R$^{10a}$ and R$^{10b}$ represents methyl.

Likewise of outstanding preference are cationic dyes of formula (I),
where
X$^1$ represents O,
X$^2$ represents N,
NR$^1$R$^2$ represents dimethylamino or diethylamino,
NR$^3$R$^4$ represents dimethylamino, diethylamino, N-methyl-N-(2-cyanoethyl)amino, bis(2-cyanoethyl)amino or anilino,
R$^9$ represents hydrogen or methyl, and
R$^{9a}$, R$^{9b}$, R$^{10}$, R$^{10a}$ and R$^{10b}$ represent hydrogen.

Preference is likewise given to mixtures of dyes of formula (I) where X$^2$ represents N.

Particular preference is given to those mixtures of dyes of formula (I)
where
X$^1$ represents S or N—R$^6$,
X$^2$ represents N,
R$^6$ represents phenyl or tolyl,
R$^1$ to R$^4$ independently of each other represent hydrogen, methyl, ethyl, cyanoethyl or phenyl, or
NR$^1$R$^2$ and NR$^3$R$^4$ independently of each other represent pyrrolidino, piperidino or morpholino or N-methylpiperazino, and
in each case one of the moieties of the groups
R$^9$, R$^{9a}$, R$^{9b}$ and R$^{10}$, R$^{10a}$, R$^{10b}$ represents methyl and the other two represent hydrogen.

Particular preference is likewise given to those mixtures of dyes of formula (I)
where
X$^1$ represents S or N—R$^6$,
X$^2$ represents N,
R$^6$ represents phenyl or tolyl,
R$^1$ and R$^3$ independently of each other represent hydrogen, methyl, ethyl, cyanoethyl or phenyl,
R$^2$ and R$^4$ independently of each other represent hydrogen, methyl or ethyl,
R$^9$ and R$^{10}$ represent hydrogen or methyl and are identical to each other, and
R$^{9a}$, R$^{9b}$, R$^{10a}$ and R$^{10b}$ represent hydrogen.

Examples of such mixtures are:

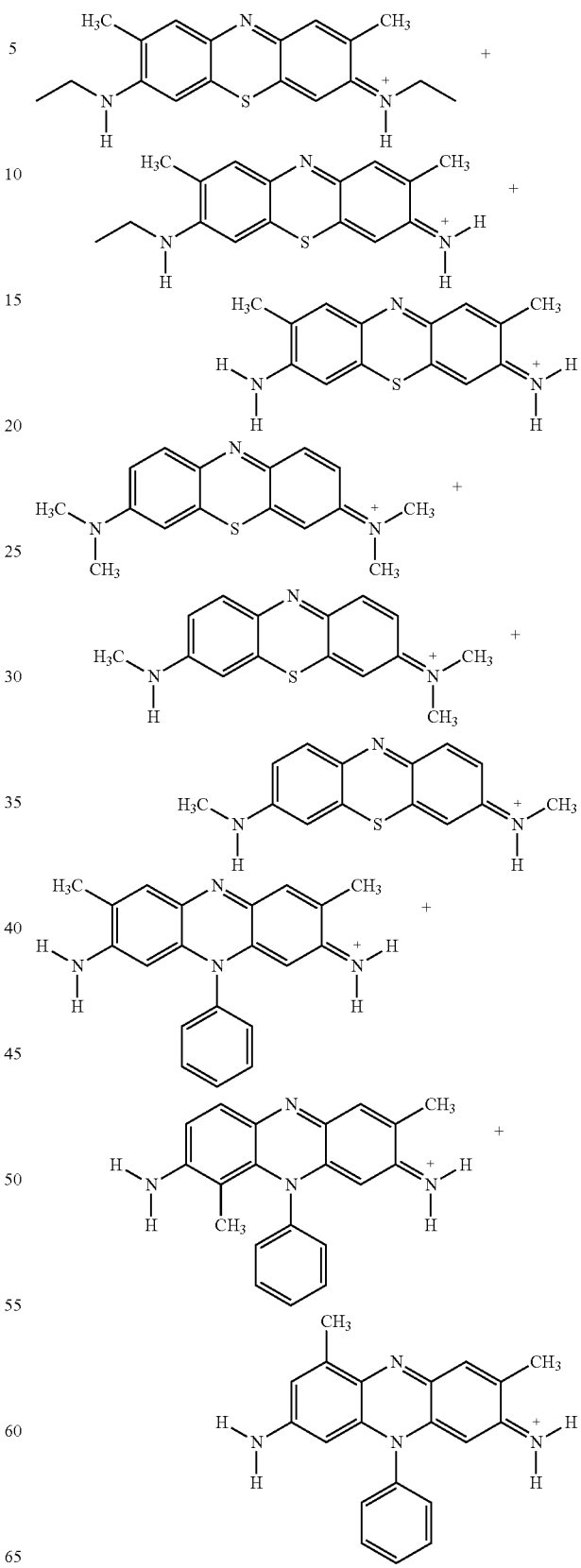

Very particular preference is likewise given to cationic dyes of formula (II)

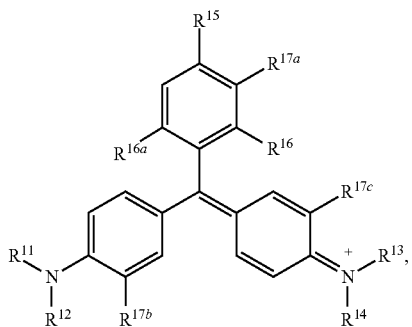

(II)

where
$R^{15}$ represents hydrogen, chlorine, methyl, methoxy, $NR^{18}R^{19}$ or $N^+R^{18}R^{19}N^{20}An^-$, $R^{11}$ to $R^{14}$, $R^{18}$, $R^{19}$ and $R^{20}$ independently of each other represent hydrogen, methyl, ethyl, propyl, butyl, chloroethyl, cyanomethyl, cyanoethyl, methoxyethyl, cyclopentyl, cyclohexyl, cyclohexylmethyl, benzyl, phenyl, tolyl, anisyl or chlorophenyl, or $NR^{11}R^{12}$, $NR^{13}R^{14}$ and $NR^{18}R^{19}$ independently of each other represent pyrrolidino, piperidino, morpholino or N-methylpiperazino, or $R^{12}$; $R^{17b}$, $R^{13}$; $R^{17c}$ and $R^{18}$; $R^{17a}$ independently of each other form a —CH$_2$CH$_2$—, —CH$_2$CH$_2$CH$_2$— or —CH$_2$CH$_2$—O— bridge which may bear up to three methyl groups, An$^-$ represents an anion, $R^{16}$ represents hydrogen, chlorine, methoxycarbonyl or ethoxycarbonyl, $R^{16a}$ represents hydrogen or chlorine, and $R^{17a}$, $R^{17b}$ and $R^{17c}$ independently of each other represent hydrogen or methyl.

Of outstanding preference are cationic dyes of formula (II), where $R^{15}$ represents hydrogen or $NR^{18}R^{19}$, $NR^{11}R^{12}$, $NR^{13}R^{14}$ and $NR^{18}R^{19}$ independently of each other represent amino, methylamino, ethylamino, cyanoethylamino, dimethylamino, diethylamino, bis(2-cyanoethyl)amino or anilino, $R^{16}$ and $R^{16a}$ represent hydrogen, or $R^{16}$ may additionally represent chlorine when $R^{15}$ represents hydrogen, $R^{17a}$, $R^{17b}$ and $R^{17c}$ represent hydrogen, or $R^{17a}$, $R^{17b}$ and $R^{17c}$ independently of each other may additionally represent methyl when the respective adjacent group $NR^{11}R^{12}$, $NR^{13}R^{14}$ or $NR^{18}R^{19}$ represents amino, methylamino, ethylamino or cyanoethylamino.

Very particular preference is likewise given to cationic dyes of formula (III)

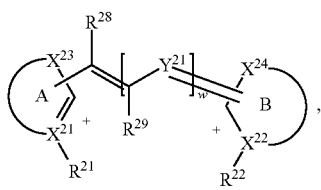

(III)

where
A together with $X^{21}$ and $X^{23}$ and the atoms connecting them represents 2- or 4-quinolyl, 1,3-thiazol-2-yl, 1,3-thiazolin-2-yl, benzothiazol-2-yl, 1,3-oxazolin-2-yl, benzoxazol-2-yl, imidazol-2-yl, imidazolin-2-yl, benzimidazol-2-yl, pyrrolin-2-yl, 3H-indol-2-yl or quinoxalin-2-yl, which may each be substituted by methyl, ethyl, benzyl, methoxy, chlorine, cyano, nitro or methoxycarbonyl, while in the case of imidazol-2-yl, imidazolin-2-yl and benzimidazol-2-yl both the nitrogen atoms are substituted by $R^{21}$, or A together with $X^{21}$—$R^{21}$ and $X^{23}$ and the atoms connecting them represents pyrylium-2- or -4-yl, thiopyrylium-2- or -4-yl which are substituted by 2 moieties from the group phenyl, tolyl or anisyl, B together with $X^{22}$ and $X^{24}$ and the atoms connecting them represents pyridin-2- or -4-ylene, quinolin-2- or -4-ylene, 1,3-thiazol-2-ylene, 1,3-thiazolin-2-ylene, benzothiazol-2-ylene, 1,3-oxazolin-2-ylene, benzoxazol-2-ylene, imidazol-2-ylene, imidazolin-2-ylene, benzimidazol-2-ylene, pyrrolin-2-ylene, 3-H-indol-2-ylene, 1,3,4-thiadiazol-2-ylene, 1,2,4-thiadiazol-3-ylene or quinoxalin-2-ylene, which may each be substituted by methyl, ethyl, benzyl, methoxy, chlorine, cyano, nitro, methoxycarbonyl, dimethylamino, diethylamino, dipropylamino, dibutylamino, pyrrolidino, morpholino or piperidino, while in the case of imidazol-2-ylene, imidazolin-2-ylene and benzimidazol-2-ylene both the nitrogen atoms are substituted by $R^{22}$, $Y^{21}$ represents N or C—$R^{27}$, w represents 0 or 1, $R^{21}$ and $R^{22}$ independently of each other represent methyl, ethyl, propyl, butyl, benzyl or phenethyl, $R^{27}$ and $R^{28}$ independently of each other represent hydrogen or cyano, and $R^{29}$ represents hydrogen.

Of outstanding preference are cationic dyes of formula (III), where

A together with $X^{21}$ and $X^{23}$ and the atoms connecting them represents 2- or 4-quinolyl, 1,3-thiazol-2-yl, 1,3-thiazolin-2-yl, benzothiazol-2-yl, imidazol-2-yl, imidazolin-2-yl, benzimidazol-2-yl, pyrrolin-2-yl or 3H-indol-2-yl, which may each be substituted by methyl, methoxy, chlorine, nitro or methoxycarbonyl, while in the case of imidazol-2-yl, imidazolin-2-yl and benzimidazol-2-yl both the nitrogen atoms are substituted by $R^{21}$, B together with $X^{22}$ and $X^{24}$ and the atoms connecting them represents quinolin-2- or -4-ylene, 1,3-thiazol-2-ylene, 1,3-thiazolin-2-ylene, benzothiazol-2-ylene, imidazol-2-ylene, imidazolin-2-ylene, benzimidazol-2-ylene, pyrrolin-2-ylene or 3-H-indol-2-ylene, which may each be substituted by methyl, methoxy, chlorine, nitro or methoxycarbonyl, while in the case of imidazol-2-ylene, imidazolin-2-ylene and benzimidazol-2-ylene both the nitrogen atoms are substituted by $R^{22}$, $Y^{21}$ represents C—$R^{27}$, w represents 0 or 1 and preferably represents 1, $R^{21}$ and $R^{22}$ independently of each other represent methyl, ethyl or benzyl, $R^{27}$ represents hydrogen or cyano, and $R^{28}$ and $R^{29}$ represent hydrogen.

Likewise of outstanding preference are cationic dyes of formula (III) where

A together with $X^{21}$ and $X^{23}$ and the atoms connecting them represents 2- or 4-quinolyl, 1,3-thiazol-2-yl, 1,3-thiazolin-2-yl, benzothiazol-2-yl, imidazol-2-yl, imidazolin-2-yl, benzimidazol-2-yl, pyrrolin-2-yl or 3H-indol-2-yl, which may each be substituted by methyl, methoxy, chlorine, nitro or methoxycarbonyl, while in the case of imidazol-2- yl, imidazolin-2-yl and benzimidazol-2-yl both the nitrogen atoms are substituted by $R^{21}$, B together with $X^{22}$ and $X^{24}$ and the atoms connecting them represents 1,3-thiazol-2-ylene, benzothiazol-2-ylene, imidazol-2-ylene, benzimidazol-2-ylene, which may each be substituted by methyl, ethyl, methoxy, chlorine, cyano, phenyl, methoxycarbonyl, represents 1,3,4-thiadiazol-2-ylene, which may be substituted by methyl, methoxy, methylthio, bromine, dimethylamino, diethylamino, dipropylamino, N-methyl-N-(2-cyanoethyl)amino, N-methylanilino, pyrrolidino, morpholino or piperidino, or represents 1,2,4-thiadiazol-3-ylene; which may be substituted by methyl, ethyl, methylthio or phenyl, while in the case of imidazol-2-ylene and benzimidazol-2-ylene both the nitrogen atoms are substituted by $R^{22}$, $Y^{21}$ represents N,
w represents 1,
$R^{21}$ and $R^{22}$ independently of each other represent methyl, ethyl or benzyl, and
$R^{28}$ and $R^{29}$ represent hydrogen.

Very particular preference is likewise given to cationic dyes of formula (IV)

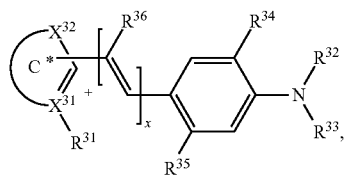

(IV)

where
C together with $X^{31}$ and $X^{32}$ and the atoms connecting them represents 2- or 4-pyridyl, 2- or 4-quinolyl, 1,3-thiazol-2-yl, 1,3-thiazolin-2-yl, benzothiazol-2-yl, 1,3-oxazolin-2-yl, benzoxazol-2-yl, imidazol-2-yl, imidazolin-2-yl, benzimidazol-2-yl, pyrrolin-2-yl, 3H-indol-2-yl or quinoxalin-2-yl, which may each be substituted by methyl, ethyl, benzyl, methoxy, chlorine, cyano, nitro or methoxycarbonyl, while in the case of imidazol-2-yl, imidazolin-2-yl and benzimidazol-2-yl both the nitrogen atoms are substituted by $R^{31}$, or C together with $X^{31}$—$R^{31}$ and $X^{32}$ and the atoms connecting them represents pyrylium-2- or thiopyrylium-2- or -4-yl which are substituted by 2 moieties from the group phenyl, tolyl or anisyl, $R^{31}$ represents methyl, ethyl, propyl, butyl, benzyl or phenethyl, $R^{32}$ and $R^{33}$ independently of each other represent methyl, ethyl, propyl, butyl, chloroethyl, cyanomethyl, cyanoethyl, methoxyethyl, cyclopentyl, cyclohexyl, cyclohexylmethyl, benzyl, phenyl, tolyl, anisyl, 4-ethoxyphenyl or chlorophenyl, and $R^{32}$ may additionally represent hydrogen, or
$NR^{32}R^{33}$ represents pyrrolidino, piperidino, morpholino or N-methylpiperazino, $R^{34}$ represents hydrogen, chlorine, methyl or methoxy, or $R^{34}$ combines with $R^{32}$ to form a —$CH_2CH_2$—, —$CH_2CH_2CH_2$— or —$CH_2CH_2$—O— bridge in which up to three hydrogen atoms may be replaced by methyl groups, $R^{35}$ represents hydrogen, chlorine, methyl, methoxy, acetamino, propionylamino or methanesulphonylamino, $R^{36}$ represents hydrogen or cyano,
x represents 1, and x may additionally represent 0 when C represents 1,3-thiazol-2-yl, 1,3-thiazolin-2-yl, benzothiazol-2-yl, 1,3-oxazolin-2-yl, benzoxazol-2-yl, imidazol-2-yl, imidazolin-2-yl or benzimidazol-2-yl.

Of outstanding preference are cationic dyes of formula (IV)

where
C together with $X^{31}$ and $X^{32}$ and the atoms connecting them represents 2- or 4-quinolyl, 1,3-thiazol-2-yl, 1,3-thiazolin-2-yl, benzothiazol-2-yl, imidazol-2-yl, imidazolin-2-yl, benzimidazol-2-yl, pyrrolin-2-yl or 3H-indol-2-yl which may each be substituted by methyl, methoxy, chlorine, nitro or methoxycarbonyl, while in the case of imidazol-2-yl, imidazolin-2-yl and benzimidazol-2-yl both the nitrogen atoms are substituted by $R^{21}$, or C together with $X^{31}$—$R^{31}$ and $X^{32}$ and the atoms connecting them represents pyrylium-2-yl, thiopyryliumyl which are substituted by 2 phenyl moieties, $R^{31}$ represents methyl, ethyl or benzyl,
$R^{32}$ and $R^{33}$ independently of each other represent methyl, ethyl, chloroethyl, cyanomethyl, cyanoethyl, benzyl, phenyl, anisyl or 4-ethoxyphenyl or $NR^{32}R^{33}$ represents pyrrolidino, piperidino or morpholino,
$R^{34}$ represents hydrogen,
$R^{35}$ represents hydrogen or methyl,
$R^{36}$ represents hydrogen or cyano, and
x represents 1.

Very particular preference is likewise given to cationic dyes of formula (V)

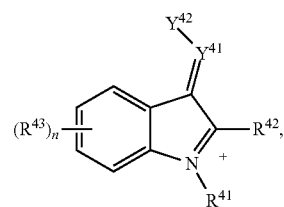

(V)

where
$Y^{42}$ represents a radical of formulae (Va) or (Vb)

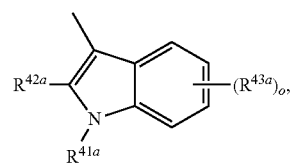

(Va)

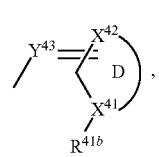

(Vb)

$R^{41}$, $R^{41a}$ and $R^{41b}$ independently of each other represent methyl, ethyl, propyl, butyl, benzyl or phenethyl and $R^{41}$ and $R^{41a}$ may additionally represent hydrogen, $R^{42}$ and $R^{42a}$ independently of each other represent hydrogen, methyl, ethyl, cyclohexyl, phenyl, tolyl, anisyl or chlorophenyl, $R^{43}$ and $R^{43a}$ independently of each other represent hydrogen, methyl, methoxy or chlorine, or two adjacent $R^{43}$ or $R^{43a}$ represent —CH=CH—CH=CH—, n and o independently of each other represent an integer from 0 to 2, $Y^{41}$ represents $CR^{44}$ or $=CR^{45a}-CR^{46}=CR^{45b}-$ when $Y^{42}$ represents a moiety of formula (Va), or $Y^{41}$ represents $CR^{44}$ when $Y^{42}$ represents a moiety of formula (Vb), $Y^{43}$ represents CH, or $Y^{41}$ and $Y^{43}$ both represent N, $R^{44}$, $R^{45a}$, $R^{45b}$ and $R^{46}$ represent hydrogen, and D together with $X^{41}$ and $X^{42}$ and the atoms connecting them represents pyridin-2- or -4-ylene, quinolin-2- or -4-ylene, 1,3-thiazol-2-ylene, 1,3-thiazolin-2-ylene, benzothiazol-2-ylene, 1,3,4-thiadizol-2-ylene, 1,3-oxazolin-2-ylene, benzoxazol-2-ylene, imidazol-2-ylene, imidazolin-2-ylene, benzimidazol-2-ylene, pyrrolin-2-ylene, 1,3,4-triazol-2-ylene, 3-H-indol-2-ylene or quinoxalin-2-ylene, which may each be substituted by methyl, ethyl, benzyl, methoxy, chlorine, cyano, nitro or methoxycarbonyl, while in the case of imidazol-2-ylene, imidazolin-2-ylene and benzimidazol-2-ylene both the nitrogen atoms are substituted by $R^{41b}$, and in the case of 1,3,4-thiadizol-2-ylene possible additional substituents are dimethylamino, diethylamino, dipropylamino, dibutylamino, N-methyl, N-cyanoethylamino, bis(cyanoethyl)amino, N-methyl-N-phenylamino, pyrrolidino, piperidino or morpholino, or D together with together with $X^{41}-R^{41b}$ and $X^{42}$ and the atoms connecting them represents 2H-pyran-2-ylene, 4H-pyran-4-ylene, 2H-thiopyran-2-ylene, 4H-thiopyran-4-ylene, which are substituted by 2 moieties from the group phenyl, tolyl or anisyl.

Of outstanding preference are cationic dyes of formula (V), where $Y^{42}$ represents a moiety of formulae (Va) or (Vb)

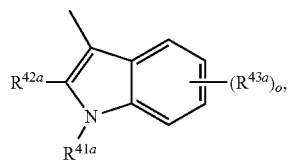

(Va)

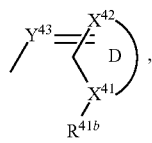

(Vb)

$R^{41}$, $R^{41a}$ and $R^{41b}$ independently of each other represent methyl, ethyl or benzyl, $R^{42}$ and $R^{42a}$ independently of each other represent hydrogen, methyl or phenyl, $R^{43}$ and $R^{42a}$ represent hydrogen, n and o independently of each other represent 1, $Y^{41}$ represents $CR^{44}$ or $=CR^{45a}-CR^{46}=CR^{45b}-$ when $Y^{42}$ represents a moiety of formula (Va), or $Y^{41}$ represents $CR^{44}$ when $Y^{42}$ represents a moiety of formula (Vb), $Y^{43}$ represents CH, $R^{44}$, $R^{45a}$, $R^{45b}$ and $R^{46}$ represent hydrogen, and D together with $X^{41}$ and $X^{42}$ and the atoms connecting them represents quinolin-2- or -4-ylene, 1,3-thiazol-2-ylene, benzothiazol-2-ylene, imidazol-2-ylene, imidazolin-2-ylene, benzimidazol-2-ylene, pyrrolin-2-ylene or 3-H-indol-2-ylene, which may each be substituted by methyl, methoxy, chlorine, cyano, nitro or methoxycarbonyl, while in the case of imidazol-2-ylene, imidazolin-2-ylene and benzimidazol-2-ylene both the nitrogen atoms are substituted by $R^{41b}$, or D together with together with $X^{41}-R^{41b}$ and $X^{42}$ and the atoms connecting them represents 2H-pyran-2-ylene, 4H-pyran-4-ylene, 2H-thiopyran-2-ylene, 4H-thiopyran-4-ylene, which are substituted by 2 phenyl moieties.

Likewise of outstanding preference are cationic dyes of formula (V) where the pairs $R^{41}$ and $R^{41a}$, $R^{42}$ and $R^{42a}$, $R^{43}$ and $R^{43a}$ and also n and o have the same meaning in each case.

Very particular preference is likewise given to cationic dyes of formula (VI)

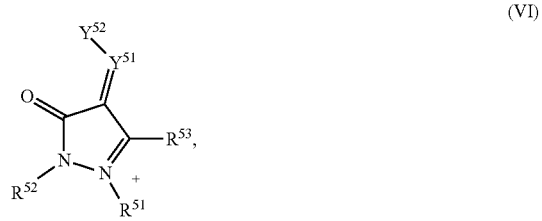

where $Y^{52}$ represents a moiety of formulae (VIa), (VIb) or (VIc)

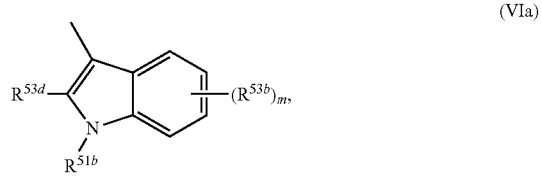

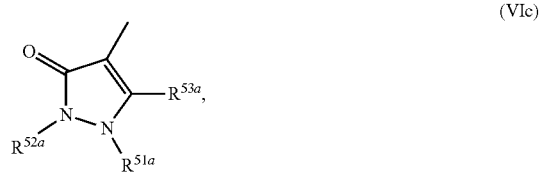

$R^{51}$, $R^{51a}$, $R^{51b}$ and $R^{51c}$ independently of each other represent methyl, ethyl, propyl, butyl, benzyl or phenethyl, $R^{52}$ and $R^{52a}$ independently of each other represent cyclohexyl, phenyl, tolyl, anisyl or chlorophenyl, $R^{53}$ and $R^{53a}$ independently of each other represent methyl, cyano, methoxycarbonyl or ethoxycarbonyl, $R^{53d}$ represents methyl, ethyl, cyclohexyl, phenyl, tolyl, anisyl or chlorophenyl, $R^{53b}$ represents hydrogen, methyl, methoxy or chlorine or two adjacent $R^{53b}$ represents $-CH=CH-CH=CH-$, m represents an integer from 0 to 2, $Y^{51}$ represents $CR^{54}$ or $=CR^{55a}-CR^{56}=CR^{55b}-$ when $Y^{52}$ represents a moiety of formulae (VIa) or (VIc), or $Y^{51}$ represents $CR^{54}$ when $Y^{52}$ represents a moiety of formula (VIb), $Y^{53}$ represents CH, or $Y^{51}$ and $Y^{53}$ both represent N, $R^{54}$, $R^{55a}$, $R^{55b}$ and $R^{56}$ represent hydrogen, E together with $X^{51}$ and $X^{52}$ and the atoms connecting them represents pyridin-2- or -4-ylene, quinolin-2- or -4-ylene, 1,3-thiazol-2-ylene, 1,3-thiazolin-2-ylene, benzothiazol-2-ylene, 1,3,4-thiadiazol-2-ylene, 1,3-oxazolin-2-ylene, benzoxazol-2-ylene, imidazol-2-ylene, imidazolin-2-ylene, benzimidazol-2-ylene, pyrrolin-2-ylene, 1,3,4-triazol-2-ylene, 3-H-indol-2-ylene or quinoxalin-2-ylene, which may each be substituted by methyl, ethyl, benzyl, methoxy, chlorine, cyano, nitro or methoxycarbonyl, while in the case of imidazol-2-ylene, imidazolin-2-ylene and benzimidazol-2-ylene both the nitrogen atoms are substituted by $R^{51c}$, and in the case of 1,3,4-thiadizol-2-ylene possible additional substituents are dimethylamino, diethylamino, dipropylamino, dibutylamino, N-methyl, N-cyanoethylamino, bis(cyanoethyl)amino, N-methyl-N-phenylamino, pyrrolidino, piperidino or morpholino, or E together with together with $X^{51}$—$R^{51c}$ and $X^{52}$ and the atoms connecting them represents 2H-pyran-2-ylene, 4H-pyran-4-ylene, 2H-thiopyran-2-ylene, 4H-thiopyran-4-ylene, which are substituted by 2 moieties from the group phenyl, tolyl or anisyl.

Of outstanding preference are cationic dyes of formula (VI), where the pairs $R^{51}$ and $R^{51a}$, $R^{52}$ and $R^{52a}$ and also $R^{53}$ and $R^{53a}$ have the same meaning in each case.

Of outstanding preference are cationic dyes of formula (VI)

where $Y^{52}$ represents a moiety of formulae (VIa), (VIb) or (VIc)

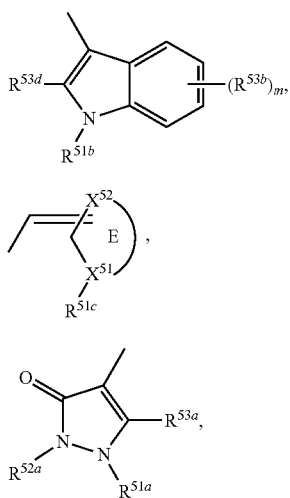

(VIa)

(VIb)

(VIc)

$R^{51}$, $R^{51a}$, $R^{51b}$ and $R^{51c}$ independently of each other represent methyl, ethyl or benzyl, $R^{52}$ and $R^{52a}$ independently of each other represent phenyl, tolyl, anisyl or chlorophenyl, $R^{53}$ and $R^{53a}$ independently of each other represent methyl or methoxycarbonyl, $R^{53d}$ represents methyl or phenyl, $R^{53b}$ represents hydrogen, m represents 1, $Y^{51}$ represents $CR^{54}$ or =$CR^{55a}$—$CR^{56}$=$CR^{55b}$— when $Y^{52}$ represents a moiety of formulae (VIa) or (VIc), or $Y^{51}$ represents $CR^{54}$ when $Y^{52}$ represents a moiety of formula (VIb), $Y^{53}$ represents CH, $R^{54}$, $R^{55a}$, $R^{55b}$ and $R^{56}$ represent hydrogen, E together with $X^{51}$ and $X^{52}$ and the atoms connecting them represents quinolin-2- or -4-ylene, 1,3-thiazol-2-ylene, benzothiazol-2-ylene, imidazol-2-ylene, imidazolin-2-ylene, benzimidazol-2-ylene, pyrrolin-2-ylene or 3-H-indol-2-ylene, which may each be substituted by methyl, methoxy, chlorine, cyano, nitro or methoxycarbonyl, while in the case of imidazol-2-ylene, imidazolin-2-ylene and benzimidazol-2-ylene both the nitrogen atoms are substituted by $R^{41b}$, or E together with together with $X^{51}$—$R^{51c}$ and $X^{52}$ and the atoms connecting them represents 2H-pyran-2-ylene, 4H-pyran-4-ylene, 2H-thiopyran-2-ylene, 4H-thiopyran-4-ylene, which are substituted by 2 phenyl moieties.

Very particular preference is likewise given to cationic dyes of formula (VII)

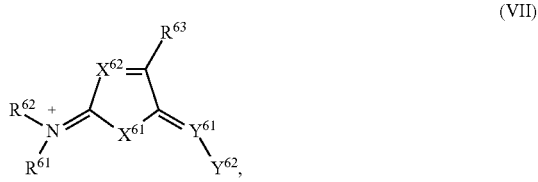

(VII)

where $Y^{62}$ represents a moiety of formulae

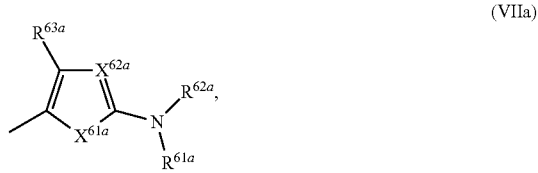

(VIIa)

(VIIb)

or

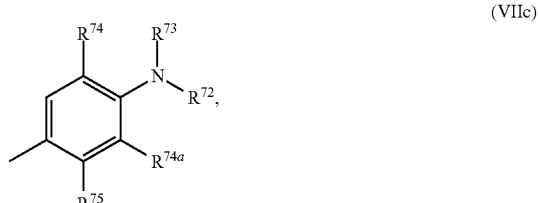

(VIIc)

$X^{61}$ and $X^{61a}$ independently of each other represent O or S, $X^{62}$ and $X^{62a}$ independently of each other represent $CR^{66}$ or N, $R^{63}$ and $R^{63a}$ independently of each other represent hydrogen, methyl, 2-propyl, tert-butyl, chlorine, phenyl, tolyl, anisyl, chlorophenyl or $NR^{64}R^{65}$, $R^{61}$, $R^{61a}$, $R^{62}$, $R^{62a}$, $R^{64}$ and $R^{65}$ independently of each other represent methyl, ethyl, propyl, butyl, chloroethyl, cyanomethyl, cyanoethyl, methoxyethyl, cyclopentyl, cyclohexyl, cyclohexylmethyl, benzyl, phenyl, tolyl, anisyl or chlorophenyl, or $NR^{61}R^{62}$ and $NR^{64}R^{65}$ independently of each other represent pyrrolidino, piperidino, morpholino or N-methylpiperazino, $Y^{61}$ represents =$CR^{67}$— or N,
$R^{67}$ represents hydrogen or a moiety of formula (VIIa),
G together with $X^{63}$ and $X^{64}$ and the atoms connecting them represents pyridin-2- or -4-ylene, quinolin-2- or -4-ylene, 1,3-thiazol-2-ylene, 1,3-thiazolin-2-ylene, benzothiazol-2-ylene, 1,3-oxazolin-2-ylene, benzoxazol-2-ylene, imidazol-2-ylene, imidazolin-2-ylene, benzimidazol-2-ylene, pyrrolin-2-ylene, 3-H-indol-2-ylene or quinoxalin-2-ylene, which may each be substituted by methyl, ethyl, benzyl, methoxy, chlorine, cyano, nitro or methoxycarbonyl, while in the case of imidazol-2-ylene, imidazolin-2-ylene
$R^{68}$ represents methyl, ethyl, propyl, butyl, benzyl or phenethyl,
$X^{65}$ represents N or C—$R^{67}$,
$R^{66}$ and $R^{67}$ independently of each other represents hydrogen or cyano,
$R^{72}$ and $R^{73}$ independently of each other represent methyl, ethyl, propyl, butyl, chloroethyl, cyanomethyl, cyanoethyl, methoxyethyl, cyclopentyl, cyclohexyl, cyclohexylmethyl, benzyl, phenyl, tolyl, anisyl or chlorophenyl, and
$R^{72}$ may additionally represent hydrogen, or
$NR^{72}R^{73}$ represent pyrrolidino, piperidino, morpholino or N-methylpiperazino,
$R^{74a}$ represents hydrogen,
$R^{74}$ represents hydrogen, methyl, methoxy or chlorine, or
$R^{74}$; $R^{73}$ form a —$CH_2CH_2$—, —$CH_2CH_2CH_2$— or —$CH_2CH_2$—O— bridge in which up to three hydrogen atoms may be replaced by methyl groups,
$R^{75}$ represents hydrogen, chlorine, methyl, methoxy, acetamino, propionylamino or methanesulphonylamino.
Of outstanding preference are cationic dyes of formula (VII),
where
$Y^{62}$ represents a moiety of formulae

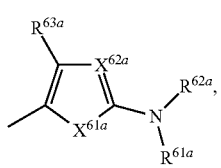

(VIIa)

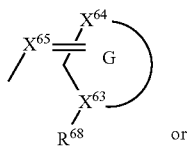

(VIIb)

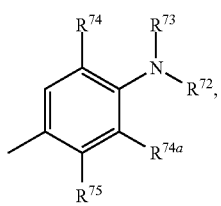

(VIIc)

$X^{61}$ and $X^{61a}$ independently of each other represent S,
$X^{62}$ and $X^{62a}$ independently of each other represent $CR^{66}$ or N,
$R^{63}$ and $R^{63a}$ independently of each other represent hydrogen, methyl, phenyl or $NR^{64}R^{65}$,
$R^{61}$, $R^{61a}$, $R^{62}$, $R^{62a}$, $R^{64}$ and $R^{65}$ independently of each other represent methyl, ethyl, propyl, butyl, cyanoethyl, benzyl or phenyl, or $NR^{61}R^{62}$ and $NR^{64}R^{65}$ independently of each other represent pyrrolidino, piperidino or morpholino,
$Y^{61}$ represents =$CR^{67}$—,
$R^{67}$ represents hydrogen or a moiety of formula (VIIa),
G together with $X^{63}$ and $X^{64}$ and the atoms connecting them represents quinolin-2- or -4-ylene, 1,3-thiazol-2-ylene, benzothiazol-2-ylene, imidazol-2-ylene, imidazolin-2-ylene, benzimidazol-2-ylene, pyrrolin-2-ylene or 3-H-indol-2-ylene, which may each be substituted by methyl, methoxy, chlorine, cyano, nitro or methoxycarbonyl, while in the case of imidazol-2-ylene, imidazolin-2-ylene and benzimidazol-2-ylene both the nitrogen atoms are substituted by $R^{41b}$,
$R^{68}$ represents methyl, ethyl or benzyl,
$X^{65}$ represents C—$R^{67}$,
$R^{66}$ and $R^{67}$ represent hydrogen,
$R^{72}$ and $R^{73}$ independently of each other represent methyl, ethyl, chloroethyl, cyanomethyl, cyanoethyl, benzyl or phenyl, or
$NR^{72}R^{73}$ represent pyrrolidino, piperidino or morpholino,
$R^{74}$ and $R^{74a}$ represent hydrogen,
$R^{75}$ represents hydrogen or methyl.
Likewise of outstanding preference are cationic dyes of formula (VII) where $X^{61}$ and $X^{61a}$, $X^{62}$ and $X^{62a}$, $R^{61}$ and $R^{61a}$, $R^{62}$ and $R^{62a}$, $R^{63}$ and $R^{63a}$ are pairwise identical in each case.
Very particular preference is likewise given to cationic dyes of formula (VIII)

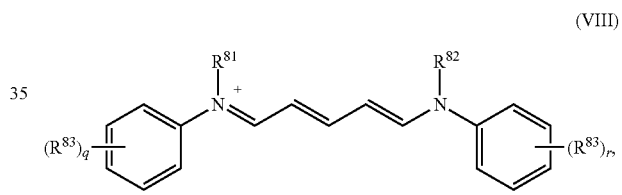

(VIII)

where
$R^{81}$ and $R^{82}$ independently of each other represent methyl, ethyl, propyl, butyl, chloroethyl, cyanomethyl, cyanoethyl, methoxyethyl, cyclopentyl, cyclohexyl, cyclohexylmethyl, benzyl, phenyl, tolyl, anisyl or chlorophenyl,
$R^{83}$ and $R^{84}$ independently of each other represents hydrogen, methyl, methoxy, chlorine, cyano, nitro, methoxycarbonyl or ethoxycarbonyl, or two adjacent $R^{83}$ or $R^{84}$ represent —CH=CH—CH=CH—, or
$R^{83}$; $R^{81}$ and/or $R^{84}$; $R^{82}$ form a —$CH_2CH_2$—, —$CH_2CH_2CH_2$— or —$CH_2CH_2$—O— bridge in which up to three hydrogen atoms may be replaced by methyl groups,
q and r independently of each other represent an integer from 0 to 2.
Of outstanding preference are cationic dyes of formula (VIII)
where
$R^{81}$ and $R^{82}$ independently of each other represent methyl or ethyl,
$R^{83}$ and $R^{84}$ independently of each other represents hydrogen, methyl, methoxy, chlorine, cyano, nitro, methoxycarbonyl or ethoxycarbonyl, or two adjacent $R^{83}$ or $R^{84}$ represent —CH=CH—CH=CH—, or
$R^{83}$; $R^{81}$ and/or $R^{84}$; $R^{82}$ form a —$CH_2CH_2$— or —$CH_2CH_2CH_2$— bridge, and
q and r represent 1.

Likewise of outstanding preference are cationic dyes of formula (VIII),
where
the pairs $R^{81}$ and $R^{82}$, $R^{83}$ and $R^{84}$ and also q and r are identical.

Very particular preference is likewise given to cationic dyes of formula (IX)

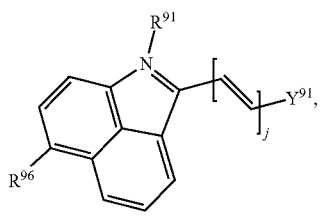
(IX)

where
$Y^{91}$ represents a moiety of formulae (IXa) or (IXb)

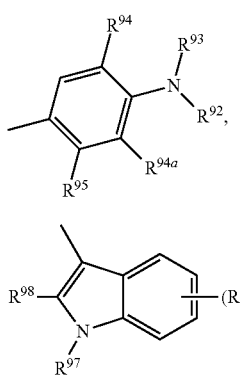
(IXa)

(IXb)

$R^{91}$ represents methyl, ethyl, propyl, butyl, cyanoethyl, benzyl or phenethyl, $R^{92}$ and $R^{93}$ independently of each other represent methyl, ethyl, propyl, butyl, chloroethyl, cyanomethyl, cyanoethyl, methoxyethyl, cyclopentyl, cyclohexyl, cyclohexylmethyl, benzyl, phenyl, tolyl, anisyl, 4-ethoxyphenyl or chlorophenyl, or $NR^{92}R^{93}$ represent pyrrolidino, piperidino, morpholino or N-methylpiperazino, $R^{94a}$ represents hydrogen, $R^{94}$ represents hydrogen, methyl, methoxy or chlorine, or $R^{94}$; $R^{93}$ form a —$CH_2CH_2$— or —$CH_2CH_2CH_2$— bridge in which up to three hydrogen atoms may be replaced by methyl groups, $R^{95}$ represents hydrogen, chlorine, methyl, methoxy, acetamino, propionylamino, or methanesulphonylamino, $R^{96}$ represents hydrogen or bromine, $R^{97}$ represents methyl, ethyl, propyl, butyl, benzyl or phenethyl, $R^{98}$ represents hydrogen, methyl, ethyl, cyclohexyl, phenyl, tolyl, anisyl or chlorophenyl, $R^{99}$ represents hydrogen, methyl, methoxy or chlorine, or two adjacent $R^{99}$ represents —CH=CH—CH=CH—, l represents an integer from 0 to 2, and j 0 or 1.

Of outstanding preference are cationic dyes of formula (IX)

where
$R^{91}$ represents methyl or ethyl, $R^{92}$ and $R^{93}$ independently of each other represent methyl, ethyl, chloroethyl, cyanoethyl, benzyl, phenyl, tolyl, anisyl or 4-ethoxyphenyl, or $NR^{92}R^{93}$ represents pyrrolidino, piperidino or morpholino, $R^{94}$ and $R^{94a}$ represent hydrogen, or $R^{94}$; $R^{93}$ form a —$CH_2CH_2$— or —$CH_2CH_2CH_2$— bridge in which up to three hydrogen atoms may be replaced by methyl groups, $R^{95}$ represents hydrogen or methyl, $R^{96}$ represents hydrogen or bromine, $R^{97}$ represents methyl, ethyl or benzyl, $R^{98}$ represents hydrogen, methyl or phenyl, $R^{99}$ represents hydrogen, l represents 1, and j represents 0 or 1.

Very particular preference is likewise given to cationic dyes of formula (X)

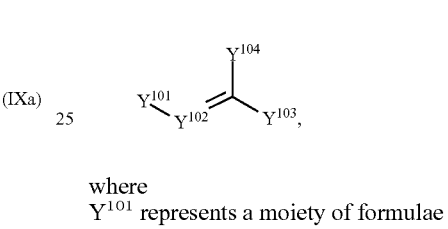
(X)

where
$Y^{101}$ represents a moiety of formulae

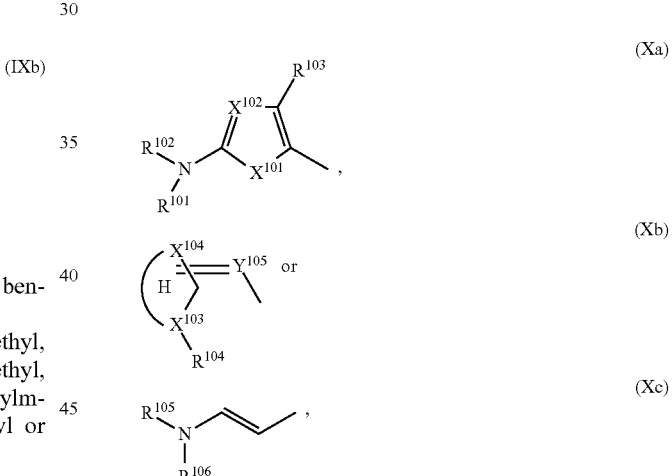
(Xa)

(Xb)

(Xc)

$X^{101}$ represents O or S, $X^{102}$ represents $CR^{107}$ or N, $R^{103}$ represents hydrogen, methyl, 2-propyl, tert-butyl, chlorine, phenyl, tolyl, anisyl, chlorophenyl or $NR^{101a}R^{102a}$, $R^{101}$, $R^{102}$, $R^{101a}$, $R^{102a}$ $R^{105}$ and $R^{106}$ independently of each other represent methyl, ethyl, propyl, butyl, chloroethyl, cyanomethyl, cyanoethyl, methoxyethyl, cyclopentyl, cyclohexyl, cyclohexylmethyl, benzyl, phenyl, tolyl, anisyl or chlorophenyl, or $NR^{101}R^{102}$ and/or $NR^{101a}R^{102a}$ and/or $NR^{105}R^{106}$ represent pyrrolidino, morpholino, piperazino or piperidino, $R^{107}$ represents hydrogen or cyano, H together with $X^{103}$ and $X^{104}$ and the atoms connecting them represents pyridin-2- or -4-ylene, quinolin-2- or -4-ylene, 1,3-thiazol-2-ylene, 1,3-thiazolin-2-ylene, benzothiazol-2-ylene, 1,3-oxazolin-2-ylene, benzoxazol-2-ylene, imidazol-2-ylene, imidazolin-2-ylene, benzimidazol-2-ylene, pyrrolin-2-ylene, 3-H-indol-2-ylene or quinoxalin-2- ylene, which may each be substituted by methyl, ethyl, benzyl, methoxy, chlorine, cyano, nitro or methoxycarbonyl, while in the case of imidazol-2-ylene, imidazolin-2-ylene and benzimidazol-2-ylene both the nitrogen atoms are substituted by $R^{104}$, $R^{104}$ and $R^{114}$ independently of each other represent methyl, ethyl, propyl, butyl, benzyl or phenethyl, $Y^{102}$ represents CH, $Y^{105}$ represents N or CH, $Y^{103}$ represents CN, $Y^{104}$ represents a cationic moiety of formulae

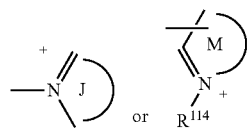

or $CY^{103}Y^{104}$ together represents a moiety of formulae

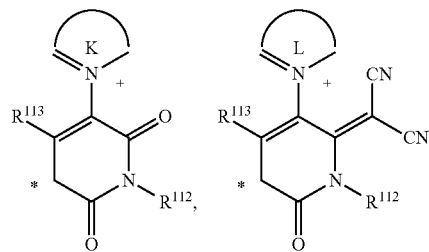

where the asterisk (*) indicates the ring atom from which the double bond emanates, $R^{112}$ represents hydrogen, methyl, ethyl, cyanoethyl, benzyl or phenyl, $R^{113}$ represents methyl, cyano, methoxycarbonyl or ethoxycarbonyl, J, K and L represents a moiety of formulae

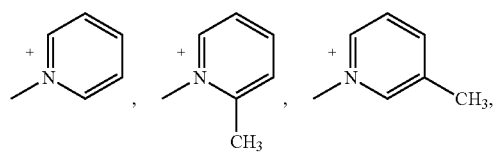

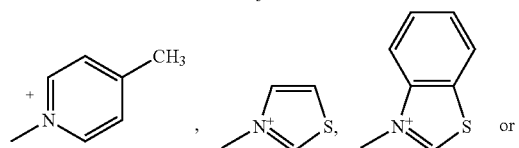

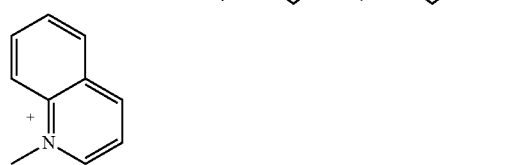

and

M represents a moiety of formulae

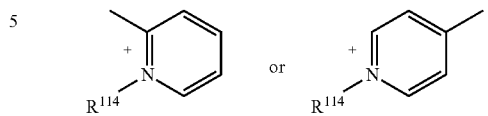

Of outstanding preference are cationic dyes of formula (X), where $Y^{101}$ represents a moiety of formulae

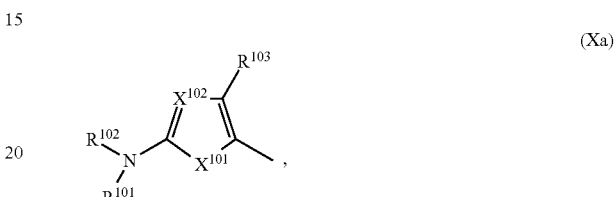

(Xa)

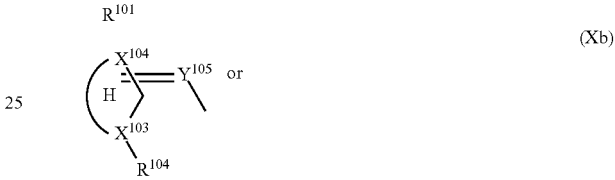

(Xb)

(Xc)

$X^{101}$ represents S, $X^{102}$ represents $CR^{107}$ or N, $R^{103}$ represents hydrogen, methyl, phenyl or $NR^{101a}R^{102a}$, $R^{101}$, $R^{102}$, $R^{101a}$, $R^{102a}$ $R^{105}$ and $R^{106}$ independently of each other represent methyl, ethyl, cyanoethyl, benzyl or phenyl, or $NR^{101}R^{102}$ and/or $NR^{101a}R^{102a}$ and/or $NR^{105}R^{106}$ represent pyrrolidino, morpholino or piperazino, $R^{107}$ represents hydrogen or cyano, H together with $X^{103}$ and $X^{104}$ and the atoms connecting them represents quinolin-2- or -4-ylene, 1,3-thiazol-2-ylene, benzothiazol-2-ylene, imidazol-2-ylene, imidazolin-2-ylene, benzimidazol-2-ylene, pyrrolin-2-ylene or 3-H-indol-2-ylene, which may each be substituted by methyl, methoxy, chlorine, cyano, nitro or methoxycarbonyl, while in the case of imidazol-2-ylene, imidazolin-2-ylene and benzimidazol-2-ylene both the nitrogen atoms are substituted by $R^{104}$, $R^{104}$ and $R^{114}$ independently of each other represent methyl, ethyl or benzyl, $Y^{102}$ represents CH, $Y^{105}$ represents CH, $Y^{103}$ represents CN, $Y^{104}$ represents a cationic moiety of formulae

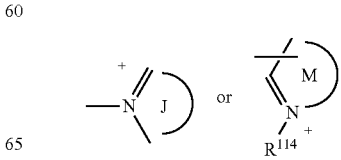

or
CY$^{103}$Y$^{104}$ together represents a moiety of formulae

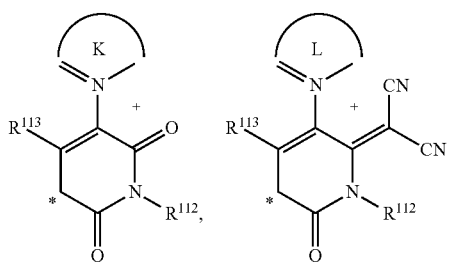

where the asterisk (*) indicates the ring atom from which the double bond emanates,
R$^{112}$ represents methyl, ethyl, cyanoethyl or benzyl,
R$^{113}$ represents methyl, cyano or methoxycarbonyl,
J, K and L represents a moiety of formulae

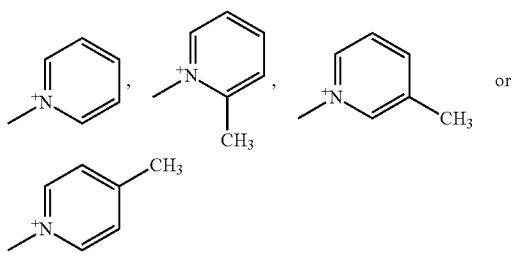

and
M represents a moiety of formulae

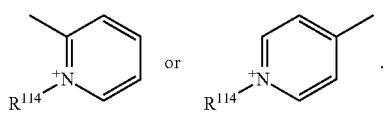

The invention further provides dyes of formula F$^+$An$^-$, where
F$^+$ has the abovementioned general or preferred meaning, particularly the general to outstandingly preferred meaning indicated for formulae (I) to (X),
An$^-$ represents a 4-(sec-alkyl)benzenesulphonate of formula (LI)

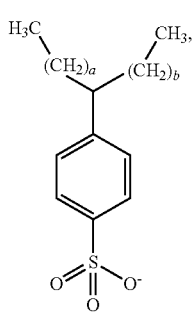

(LI)

a and b independently of each other represent an integer from 0 to 20 subject to the proviso that a+b is ≥3.

a+b is preferably ≥5, more preferably ≥7 and even more preferably ≥9.

Formula (LI) also subsumes mixtures of anions with different values of a and b where a+b is identical. However, formula (LI) also subsumes mixtures of anions with different values of a and b.

Examples of anions of formula (LI) are:

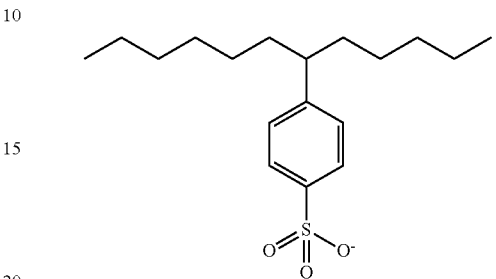

and also as mixture of all five conceivable isomers.

The invention further provides dyes of formula F$^+$An$^-$, where
F$^+$ has the abovementioned general or preferred meaning, particularly the
An$^-$ represents a sec-alkylsulphonate of formula (LII)

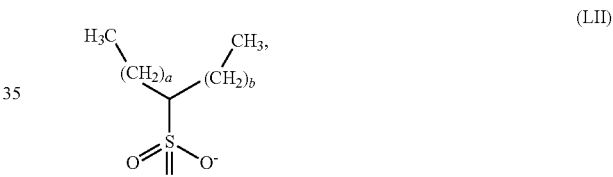

(LII)

c and d independently of each other represent an integer from 0 to 20 subject to the proviso that c+d is ≥5.

c+d is preferably ≥7, more preferably ≥9 and even more preferably ≥11.

Formula (LII) also subsumes mixtures of anions with different values of c and d where c+d is identical. However, formula (LII) also subsumes mixtures of anions with different values of c and d.

Examples of anions of formula (LII) are:

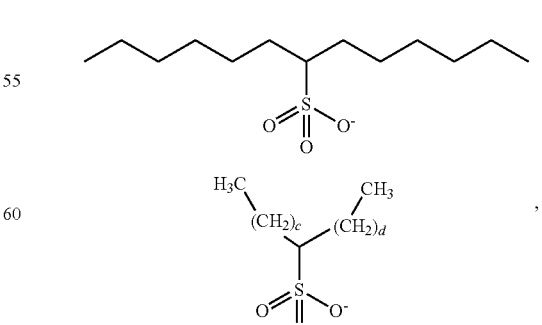

(with c + d = 8 to 12),

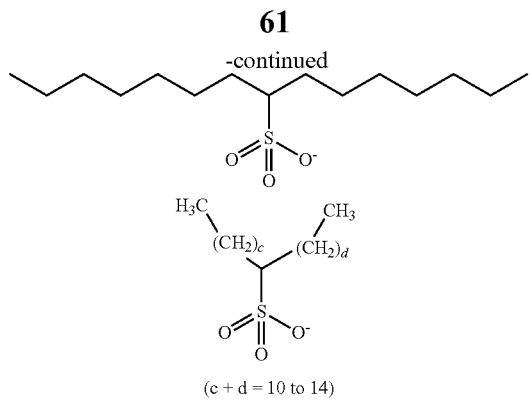

(c + d = 10 to 14)

and also as mixture of all conceivable isomers.

The invention further provides dyes of formula $F^+An^-$, where $F^+$ has the abovementioned general or preferred meaning, particularly the general to outstandingly preferred meaning indicated for formulae (I) to (X), $An^-$ represents a branched alkyl sulphate of formula (LIII)

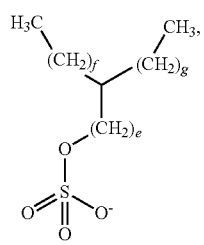
(LIII)

e represents an integer from 0 to 5, f and g independently of each other represent an integer from 0 to 15 subject to the proviso that e+f+g is ≥5 and the $CH_2$ groups may additionally be substituted by further methyl or ethyl groups.

e+f+g is preferably ≥7, more preferably ≥9 and even more preferably ≥11.

e preferably represents 0 or 1.

Preferably two $CH_2$ groups are methyl and/or ethyl substituted.

Formula (LIII) also subsumes mixtures of anions with different values of e, f and g, where e+f+g is identical. However, formula (LIII) also subsumes mixtures of anions with different values of e, f and g.

Examples of anions of formula (LIII) are:

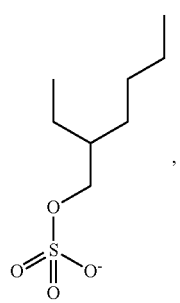

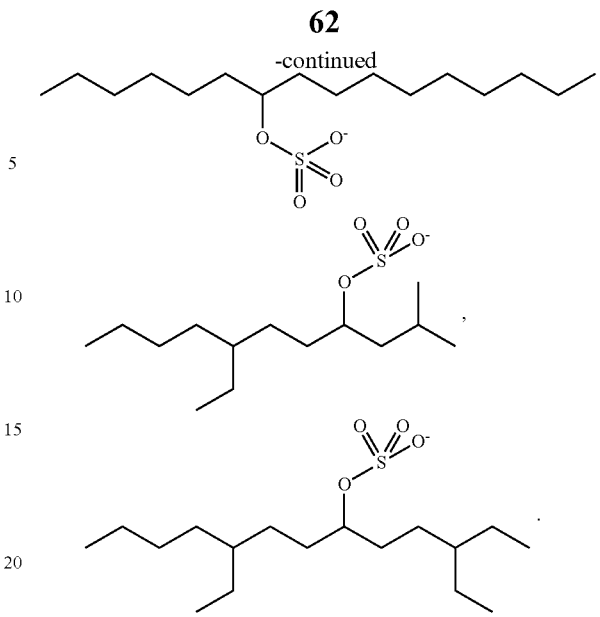

The invention further provides dyes of formula $F^+An^-$, where $F^+$ has the abovementioned general or preferred meaning, particularly the general to outstandingly preferred meaning indicated for formulae (I) to (X), $An^-$ represents a cyclic phosphoric ester of formula (LIV)

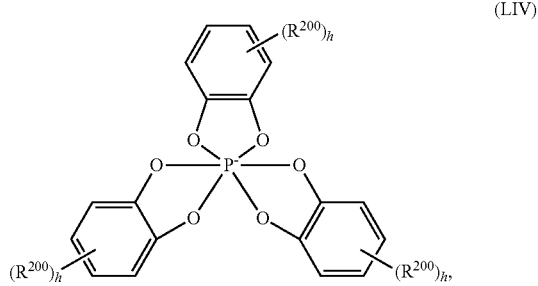
(LIV)

$R^{200}$ represents hydrogen or halogen, h represents an integer from 1 to 4.

Preferably $R^{200}$ represents chlorine or bromine and h represents 4.

Examples of anions of formula (LIV) are:

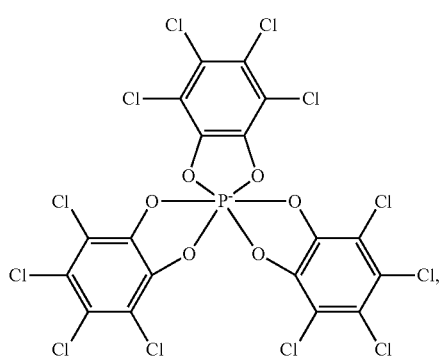

-continued

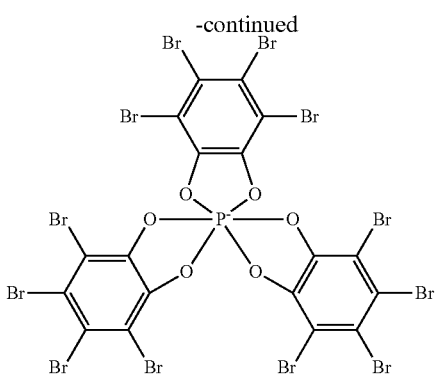

The invention further provides dyes of formula F$^+$An$^-$, where

F$^+$ has the abovementioned general or preferred meaning, particularly the general to outstandingly preferred meaning indicated for formulae (III) to (X), An$^-$ represents an alkyl sulphate of formula (LV)

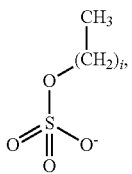

(LV)

i represents an integer from 8 to 25.

The invention further provides dyes of formula F$^+$An$^-$, where

F$^+$ has the abovementioned general or preferred meaning, particularly the general to outstandingly preferred meaning indicated for formulae (I) and (II), An$^-$ represents an alkyl sulphate of formula (LV)

(LV)

i represents an integer from 12 to 25, or i represents an integer from 18 to 25 when F$^+$ represents formula (I), X$^2$ represents N, X$^1$ represents O or S and R$^1$ to R$^4$ are the same and represent methyl or ethyl, or F$^+$ represents formula (II) and NR$^{11}$R$^{12}$, NR$^{13}$R$^{14}$ and R$^{18}$R$^{19}$ are the same and represent dimethylamino, and all other moieties have the indicated general to outstandingly preferred meaning.

Preferably i represents an integer from 18 to 25.

Examples of anions of formula (LV) are:

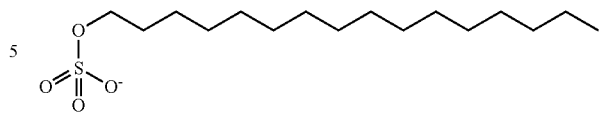

The invention further provides dyes of formula F$^+$An$^-$, where

F$^+$ has the abovementioned general or preferred meaning, particularly the general to outstandingly preferred meaning indicated for formulae (I) to (X), An$^-$ represents a sulphosuccinate of formula (LVI)

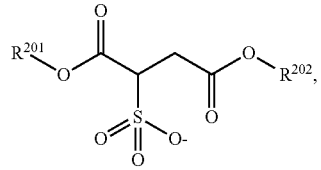

(LVI)

R$^{201}$ and R$^{202}$ independently of each other represent an unbranched C$_4$- to C$_{16}$-alkyl moiety.

Preferably R$^{201}$ and R$^{202}$ are the same.

The invention further provides dyes of formula F$^+$An$^-$, where

F$^+$ has the abovementioned general or preferred meaning, particularly the general to outstandingly preferred meaning indicated for formulae (I) to (X), An$^-$ represents a sulphosuccinate of formula (LVI)

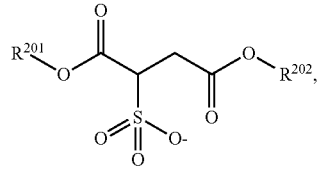

(LVI)

R$^{201}$ and R$^{202}$ independently of each other represent a C$_2$- to C$_{12}$-alkyl moiety substituted by 4 or more fluorine atoms, a C$_5$- to C$_7$-cycloalkyl moiety or a C$_7$- to C$_{10}$-aralkyl moiety.

Preferably R$^{201}$ and R$^{202}$ are the same.

The invention further provides dyes of formula F$^+$An$^-$, where

F$^+$ has the abovementioned general or preferred meaning, particularly the general to outstandingly preferred meaning indicated for formulae (I) where X$^2$=C—R$^5$ and (III), (VI) to (X), An$^-$ represents a sulphosuccinate of formula (LVI)

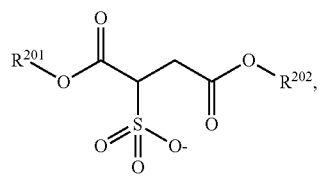

(LVI)

$R^{201}$ and $R^{202}$ independently of each other represent a $C_4$- to $C_{16}$-alkyl moiety, which may be branched, a $C_2$- to $C_{12}$-alkyl moiety substituted by 4 or more fluorine atoms, a $C_5$- to $C_7$-cycloalkyl moiety or a $C_7$- to $C_{10}$-aralkyl moiety. Preferably $R^{201}$ and $R^{202}$ are the same.

The invention further provides dyes of formula $F^+An^-$, where
$F^+$ represents formula (I) where $X^2$=N and (II), where
$X^1$ represents O, S, N—$R^6$ or $CR^{6a}R^{6b}$,
$R^6$ represents hydrogen, methyl, ethyl, propyl, butyl, cyclohexyl, benzyl, phenyl, tolyl, anisyl or chlorophenyl,
$R^{6a}$ and $R^{6b}$ are the same and represent methyl, ethyl or conjointly a —$CH_2$—$CH_2$—$CH_2$— or —$CH_2$—$CH_2$—$CH_2$—$CH_2$— bridge,
$R^1$ to $R^4$ independently of each other represent hydrogen, methyl, ethyl, propyl, butyl, chloroethyl, cyanomethyl, cyanoethyl, methoxyethyl, cyclopentyl, cyclohexyl, cyclohexylmethyl, benzyl, phenyl, tolyl, anisyl or chlorophenyl, although at least one of $R^1$ to $R^4$ does not represent methyl when $X^1$ represents S, or $NR^1R^2$ does not represent diethylamino when $X^1$ represents O,
$NR^1R^2$ and $NR^3R^4$ independently of each other represent pyrrolidino, piperidino, morpholino or N-methylpiperazino,
$R^9$, $R^{9a}$, $R^{9b}$, $R^{10}$, $R^{10a}$ and $R^{10b}$ represent hydrogen or in each case one of $R^9$, $R^{9a}$, $R^{9b}$ and/or one of $R^{10}$, $R^{10a}$ and $R^{10b}$ represents methyl, or
$R^1$; $R^9$, $R^2$; $R^{9a}$, $R^3$; $R^{10}$ and $R^4$; $R^{10a}$ independently of each other form a —$CH_2CH_2$— or —$CH_2CH_2CH_2$— bridge,
$R^{15}$ represents hydrogen, chlorine, methyl, methoxy or $NR^{18}R^{19}$,
$R^{11}$ to $R^{14}$, $R^{18}$ and $R^{19}$ independently of each other represent hydrogen, ethyl, propyl, butyl, chloroethyl, cyanomethyl, cyanoethyl, methoxyethyl, cyclopentyl, cyclohexyl, cyclohexylmethyl, benzyl, phenyl, tolyl, anisyl or chlorophenyl, and
$R^{13}$, $R^{14}$, $R^{18}$ and $R^{19}$ may additionally represent methyl, or
$NR^{11}R^{12}$, $NR^{13}R^{14}$ and $NR^{18}R^{19}$ independently of each other represent pyrrolidino, piperidino, morpholino or N-methylpiperazino, or
$R^{12}$; $R^{17b}$, $R^{13}$; $R^{17c}$ and $R^{18}$; $R^{17a}$ independently of each other form a —$CH_2CH_2$—, —$CH_2CH_2CH_2$— or —$CH_2CH_2$—O— bridge in which up to three hydrogen atoms may be replaced by methyl groups,
$R^{16}$ represents hydrogen, chlorine, methoxycarbonyl or ethoxycarbonyl,
$R^{16a}$ represents hydrogen, and
$R^{17a}$, $R^{17b}$ and $R^{17c}$ independently of each other represent hydrogen or methyl,
$An^-$ represents a sulphosuccinate of formula (LVI)

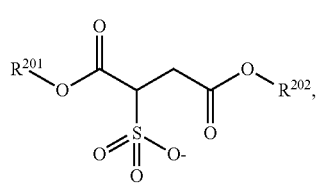

(LVI)

$R^{201}$ and $R^{202}$ independently of each other represent a $C_4$- to $C_{16}$-alkyl moiety, which may be branched, a $C_2$- to $C_{12}$-alkyl moiety substituted by 4 or more fluorine atoms, a $C_5$- to $C_7$-cycloalkyl moiety or a $C_7$- to $C_{10}$-aralkyl moiety.

The invention further provides dyes of formula $F^+An^-$, where
$F^+$ represents formula (II),
$R^{15}$ represents hydrogen, chlorine, methyl, methoxy or $NR^{18}R^{19}$,
$R^{11}$ to $R^{14}$, $R^{18}$, $R^{19}$ and $R^{20}$ independently of each other represent hydrogen, ethyl, propyl, butyl, chloroethyl, cyanomethyl, cyanoethyl, methoxyethyl, cyclopentyl, cyclohexyl, cyclohexylmethyl, benzyl, phenyl, tolyl, anisyl or chlorophenyl, or
$NR^{11}R^{12}$, $NR^{13}R^{14}$ and $NR^{18}R^{19}$ independently of each other represent pyrrolidino, piperidino, morpholino or N-methylpiperazino, or
$R^{12}$; $R^{17b}$, $R^{13}$; $R^{17c}$ and $R^{18}$; $R^{17a}$ independently of each other form a —$CH_2CH_2$—, —$CH_2CH_2CH_2$— or —$CH_2CH_2$—O— bridge which may bear up to three methyl groups,
$R^{16}$ represents hydrogen, chlorine, methoxycarbonyl or ethoxycarbonyl,
$R^{16a}$ represents hydrogen, and
$R^{17a}$, $R^{17b}$ and $R^{17c}$ independently of each other represent hydrogen or methyl.
$An^-$ represents a sulphosuccinate of formula (LVI)

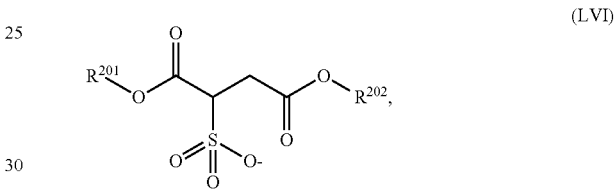

(LVI)

$R^{201}$ and $R^{202}$ independently of each other represent a $C_4$- to $C_{16}$-alkyl moiety, which may be branched, a $C_2$- to $C_{12}$-alkyl moiety substituted by 4 or more fluorine atoms, a $C_5$- to $C_7$-cycloalkyl moiety or a $C_7$- to $C_{10}$-aralkyl moiety.

The invention further provides dyes of formula $F^+An^-$, where
$F^+$ represents formula (IV) and (V), where
C together with $X^{31}$ and $X^{32}$ and the atoms connecting them represents 2- or 4-pyridyl, 2- or 4-quinolyl, 1,3-thiazol-2-yl, 1,3-thiazolin-2-yl, benzothiazol-2-yl, 1,3-oxazolin-2-yl, benzoxazol-2-yl, imidazol-2-yl, imidazolin-2-yl, benzimidazol-2-yl, pyrrolin-2-yl, 3H-indol-2-yl or quinoxalin-2-yl, which may each be substituted by methyl, ethyl, benzyl, methoxy, chlorine, cyano, nitro or methoxycarbonyl, while in the case of imidazol-2-yl, imidazolin-2-yl and benzimidazol-2-yl both the nitrogen atoms are substituted by $R^{31}$, or
C together with $X^{31}$—$R^{31}$ and $X^{32}$ and the atoms connecting them represents pyrylium-2- or -4-yl, thiopyrylium-2- or -4-yl which are substituted by 2 moieties from the group phenyl, tolyl or anisyl,
$R^{31}$ represents methyl, ethyl, propyl, butyl, benzyl or phenethyl,
$R^{32}$ and $R^{33}$ independently of each other represent methyl, propyl, butyl, chloroethyl, cyanomethyl, methoxyethyl, cyclopentyl, cyclohexyl, cyclohexylmethyl, benzyl, phenyl, tolyl, anisyl or chlorophenyl, and
$R^{32}$ may additionally represent hydrogen or ethyl, or
$NR^{32}R^{33}$ represents pyrrolidino, piperidino, morpholino or N-methylpiperazino,
$R^{34}$ represents hydrogen, chlorine, methyl or methoxy, or
$R^{34}$ combines with $R^{32}$ to form a —$CH_2CH_2$—, —$CH_2CH_2CH_2$— or —$CH_2CH_2$—O— bridge in which up to three hydrogen atoms may be replaced by methyl groups, $R^{35}$ represents hydrogen, chlorine, methyl, methoxy, acetamino, propionylamino or methanesulphonylamino, $R^{36}$ represents hydrogen or cyano, $Y^{42}$ represents a moiety of formulae (Va) or (Vb)

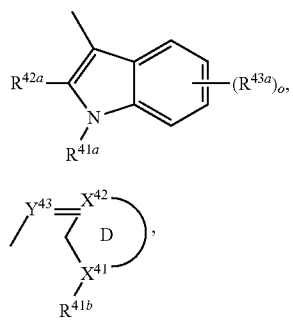

$R^{41}$, $R^{41a}$ and $R^{41b}$ independently of each other represent methyl, ethyl, propyl, butyl, benzyl or phenethyl and $R^{41}$ and $R^{41a}$ may additionally represent hydrogen, $R^{42}$ and $R^{42a}$ independently of each other represent hydrogen, ethyl, cyclohexyl, phenyl, tolyl, anisyl or chlorophenyl, $R^{43}$ and $R^{43a}$ independently of each other represents hydrogen, methyl, methoxy or chlorine, or two adjacent $R^{43}$ or $R^{43a}$ represent —CH═CH—CH═CH—, n and o independently of each other represent an integer from 0 to 2, $Y^{41}$ represents $CR^{44}$ or ═$CR^{45a}$—$CR^{46}$═$CR^{45b}$— when $Y^{42}$ represents a moiety of formula (Va), or $Y^{41}$ represents $CR^{44}$ when $Y^{42}$ represents a moiety of formula (Vb), $Y^{43}$ represents CH, or $Y^{41}$ and $Y^{43}$ both represent N, $R^{44}$, $R^{45a}$, $R^{45b}$ and $R^{46}$ represent hydrogen, and D together with $X^{41}$ and $X^{42}$ and the atoms connecting them represents pyridin-2- or -4-ylene, quinolin-2- or -4-ylene, 1,3-thiazol-2-ylene, 1,3-thiazolin-2-ylene, benzothiazol-2-ylene, 1,3,4-thiadiazol-2-ylene, 1,3-oxazolin-2-ylene, benzoxazol-2-ylene, imidazol-2-ylene, imidazolin-2-ylene, benzimidazol-2-ylene, pyrrolin-2-ylene, 1,3,4-triazol-2-ylene, 3-H-indol-2-ylene or quinoxalin-2-ylene, which may each be substituted by methyl, ethyl, benzyl, methoxy, chlorine, cyano, nitro or methoxycarbonyl, while in the case of imidazol-2-ylene, imidazolin-2-ylene and benzimidazol-2-ylene both the nitrogen atoms are substituted by $R^{41b}$, and in the case of 1,3,4-thiadizol-2-ylene possible additional substituents are dimethylamino, diethylamino, dipropylamino, dibutylamino, N-methyl, N-cyanoethylamino, bis(cyanoethyl)amino, N-methyl-N-phenylamino, pyrrolidino, piperidino or morpholino, or D together with together with $X^{41}$—$R^{41b}$ and $X^{42}$ and the atoms connecting them represents 2H-pyran-2-ylene, 4H-pyran-4-ylene, 2H-thiopyran-2-ylene, 4H-thiopyran-4-ylene, which are substituted by 2 moieties from the group phenyl, tolyl or anisyl, $An^-$ represents a sulphosuccinate of formula (LVI)

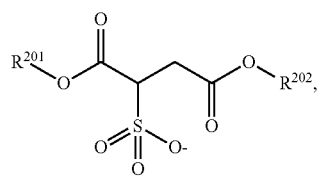

$R^{201}$ and $R^{202}$ independently of each other represent a $C_4$- to $C_{16}$-alkyl moiety, which may be branched, a $C_2$- to $C_{12}$-alkyl moiety substituted by 4 or more fluorine atoms, a $C_5$- to $C_7$-cycloalkyl moiety or a $C_7$- to $C_{10}$-aralkyl moiety.

It is particularly preferable for $R^{201}$ and $R^{202}$ to represent a $C_6$- to $C_{12}$-alkyl moiety, which may be branched, or to represent cyclohexyl or benzyl. It is very particularly preferable for $R^{201}$ and $R^{202}$ to represent n-hexyl, n-octyl or 2-ethylhexyl. It is likewise very particularly preferable for $R^{201}$ and $R^{202}$ to represent 2,2,3,3-tetrafluoropropyl, 1H,1H-heptafluorobutyl, perfluorooctyl, 1H,1H,7H-dodecafluoroheptyl, 1H,1H,2H,2H-tridecafluorooctyl.

Examples of anions of formula (LVI) are:

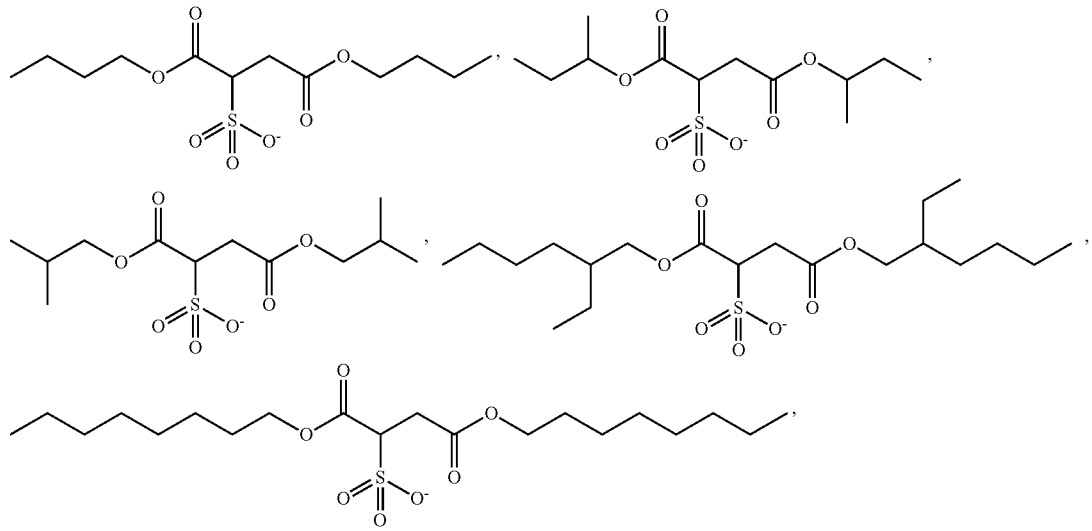

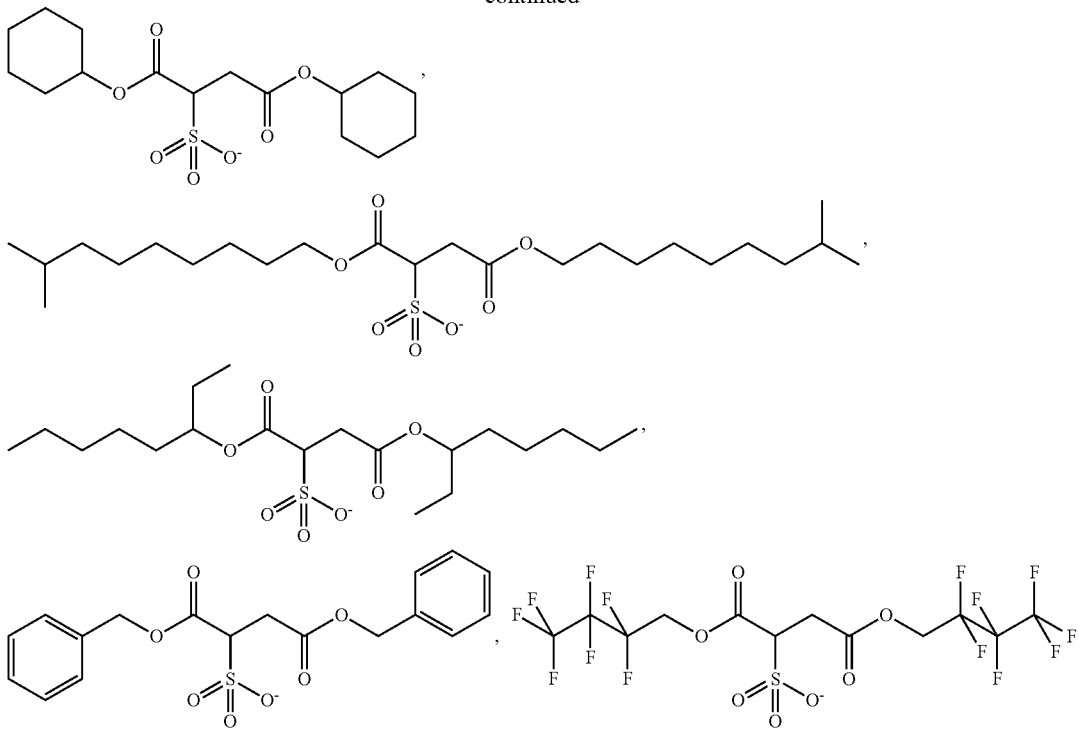

The invention further provides dyes of formula F⁺An⁻, where

F⁺ has the abovementioned general or preferred meaning, particularly the general to outstandingly preferred meaning indicated for formulae (I) to (X), An⁻ represents an ester sulphonate of formula (LVII)

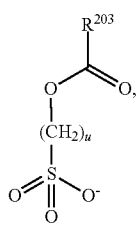

(LVII)

$R^{203}$ represents a $C_2$- to $C_{22}$-alkyl or alkenyl moiety, which may be branched or substituted, and u represents an integer from 2 to 4.

Examples of anions of formula (LVII) are:

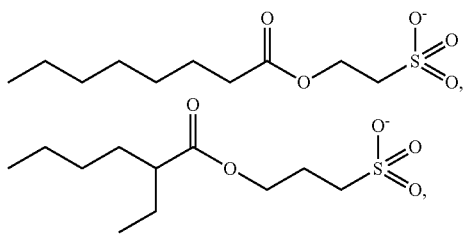

-continued

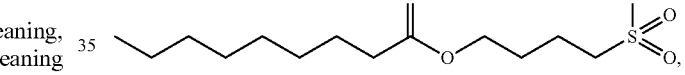

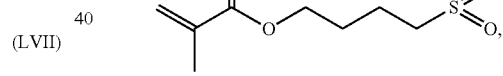

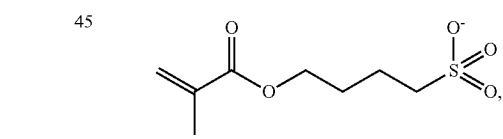

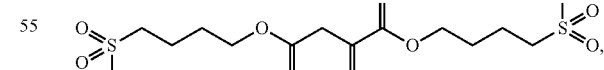

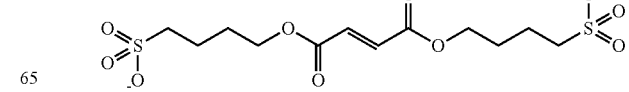

The invention further provides dyes of formula $F^+An^-$, where
$F^+$ has the abovementioned general or preferred meaning, particularly the general to outstandingly preferred meaning indicated for formulae (I) to (X),
$An^-$ represents an ester sulphonate or ester sulphates of formula (LVIII)

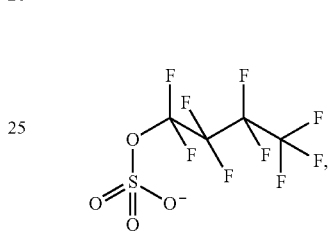
(LVIII)

v represents 0 or 1,
$R^{204}$ represents $C_1$- to $C_{18}$-alkyl, which may be branched and/or substituted,
$R^{205}$ represents hydrogen or $C_1$- to $C_8$-alkyl, and
$Y^{201}$ represents a direct bond, an aliphatic $C_1$ to $C_{22}$ bridge or an olefinic $C_2$ to $C_{22}$ bridge,
where $Y^{201}$ and $R^{204}$ together have 7 or more carbon atoms.

The invention further provides dyes of formula $F^+An^-$, where
$F^+$ has the abovementioned general or preferred meaning, particularly the general to outstandingly preferred meaning indicated for formulae (I) to (X),
$An^-$ represents a fluorinated alkyl sulphate of formula (LX)

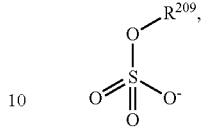
(LX)

where
$R^{209}$ represents a $C_4$- to $C_{18}$-alkyl moiety bearing 4 or more fluorine atoms.

Examples of anions of formula (LX) are:

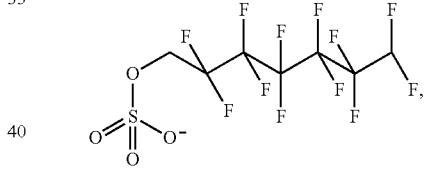

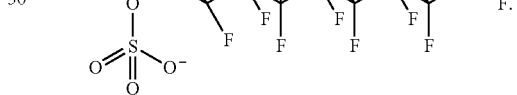

Examples of anions of formula (LVIII) are:

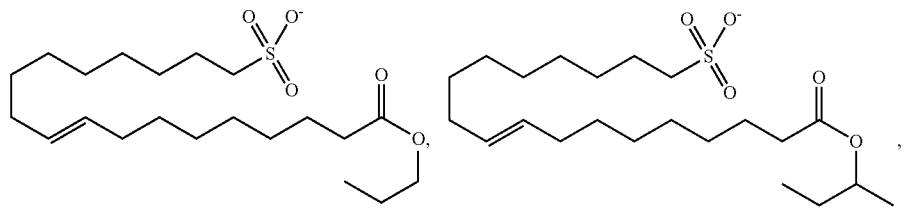

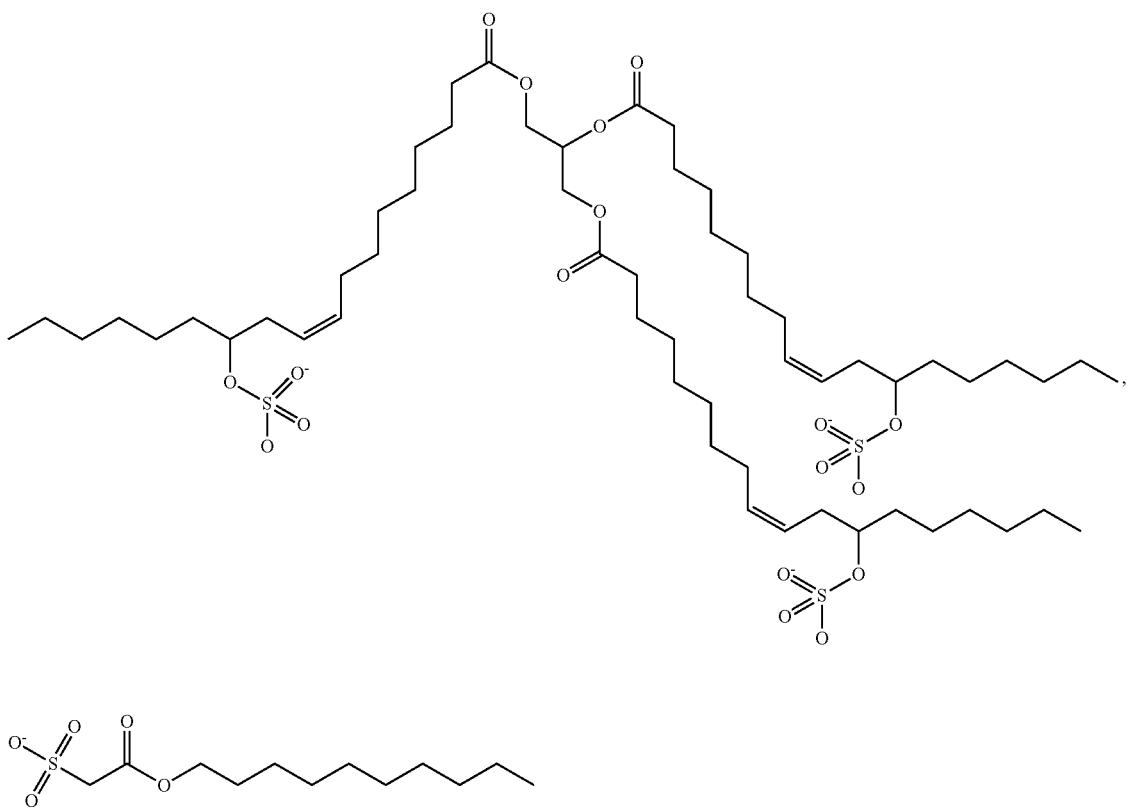

The invention further provides solutions of the dyes of formula F$^+$An$^-$ which are according to the present invention.

Preference is given to such solutions in esters and ketones and also mixtures thereof. Suitable esters are the ethyl, propyl and butyl esters of formic acid, acetic acid and propionic acid. Propyl is to be understood as meaning 1-propyl and 2-propyl, butyl is to be understood as meaning 1-butyl, 2-butyl and also 2-methyl-1-propyl. Preferred esters are ethyl acetate and 1-butyl acetate. Suitable ketones are acetone, butanone and pentanone. Butanone is the preferred ketone. Preferred mixtures consist of ethyl acetate and/or 1-butyl acetate and/or butanone. The butanone fraction in such mixtures is preferably ≤50% and more preferably ≤20%.

The concentration in such solutions of dye according to the present invention is in the range from 1% to 50% by weight, preferably in the range from 5% to 40% by weight and more preferably in the range from 10% to 30% by weight.

Preference is given to such solutions which have a water content <0.3%, more preferably <0.2% and even more preferably <0.1%.

The invention further provides a process for producing the dyes of formula (I), characterized in that they are isolated from a suspension.

In this process, the dye of formula F$^+$An'$^-$ where F$^+$ is as defined above and An'$^-$ represents an anion which stems from the synthesis or isolation of the dye is dissolved or suspended in a suitable solvent or solvent mixture. A salt of the anion M$^+$An$^-$ according to the present invention, where M$^+$ represents a cation or one equivalent of a cation and An$^-$ has the abovementioned meaning of an anion, is likewise dissolved in a solvent or solvent mixture, while the solvents for the dye and the salt need not be the same but have to be miscible. This solution of the salt M$^+$An$^-$, then, is added at room temperature or elevated temperature, to the solution or suspension of the dye F$^+$An'$^-$, and the dye of formula F$^+$An$^-$ according to the present invention precipitates. It is filtered off, washed and, if necessary, can be triturated with a solvent in which it is only minimally soluble, if at all, or is recrystallized from this solvent. This provides the dye of formula F$^+$An$^-$ where F$^+$ and An$^-$ have the abovementioned meaning.

Examples of anions An'$^-$ are chloride, bromide, sulphate, hydrogensulphate, nitrate, methosulphate.

Examples of cations M$^+$ are Na$^+$, K$^+$, NH$_4^+$.

The temperature can be between room temperature and the boiling point of the mixture. Particular preference is given to between room temperature and 50° C.

Suitable solvents are alcohols such as methanol, ethanol, 2-propanol, nitriles such as acetonitrile, acids such as glacial acetic acid, dipolar solvents such as N-ethylpyrrolidone, ethers such as tetrahydrofuran or water.

Examples of solvents suitable for trituration are diethyl ether and tert-butyl methyl ether. Examples of solvents suitable for recrystallization are glacial acetic acid and acetonitrile. It may be the case that the precipitation can be improved by addition of, for example, methanol or water.

Another version of this process is possible when a dye of formula F$^+$An'$^-$ which is deprotonatable to an anhydrobase or forms a carbinol base of formula F-OH. Deprotonatable dyes of formula F$^+$An'$^-$ are those of formula F'-H$^+$An'$^-$, where F'-H$^+$ has the same meaning as F$^+$. Such dyes can be converted with bases into the neutral anhydrobase F' which are converted with an acid H$^+$An$^-$ into the invention dye F'-H$^+$An$^-$=F$^+$An$^-$.

Examples are:

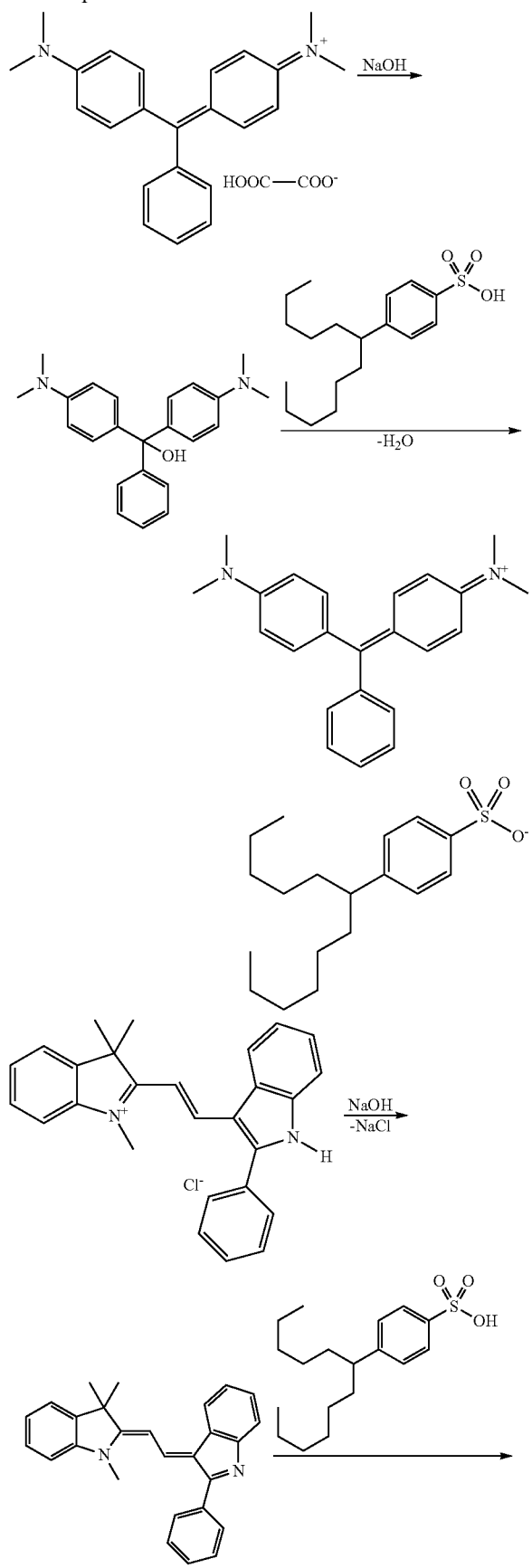

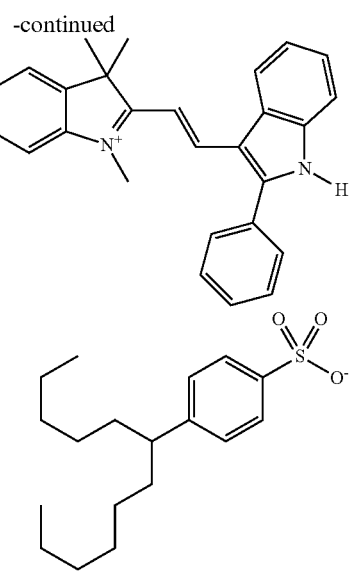

The invention further provides a process for producing the dyes of formula (I), characterized in that a two-phase mixture of water and a water-immiscible solvent is used.

In this process, the dye of formula $F^+An'^-$, where $F^+$ is as defined above and $An'^-$ represents an anion stemming from the synthesis or isolation of the dye, is stirred together with a salt of the anion $M^+An^-$ according to the present invention, where $M^+$ represents a cation or one equivalent of a cation and $An^-$ has the abovementioned meaning of a sulphosuccinate, in a mixture of water and a water-immiscible solvent at room temperature or higher temperature. The aqueous phase is separated off. This can be done at room temperature or at higher temperature. Advantageously, the organic phase containing the dye of formula $F^+An^-$ is stirred together with fresh water one or more times. The aqueous phase is separated off each time. The organic phase is suitably dried and finally evaporated. If necessary, the dry residue can additionally be triturated with a solvent in which it is only minimally soluble, if at all, or be recrystallized from this solvent. This provides the dye of formula $F^+An^-$ where $F^+$ and $An^-$ have the abovementioned meaning.

Examples of anions $An'^-$ are chloride, bromide, sulphate, hydrogensulphate, nitrate, methosulphate.

Examples of cations $M^+$ are $Na^+$, $K^+$ and $NH_4^+$.

The temperature can be between room temperature and the boiling point of the mixture. Particular preference is given to between room temperature and 40 to 50° C.

Suitable water-immiscible solvents are halogenated alkanes such as dichloromethane, trichloromethane, tetrachloroethane and also aromatics such as toluene or chlorobenzene.

Examples of solvents suitable for trituration are diethyl ether and tert-butyl methyl ether. Examples of solvents suitable for recrystallization are glacial acetic acid and acetonitrile.

The invention further provides a process for producing the sulphosuccinates, characterized in that a two-phase mixture of water and an ester is used.

In this process, the dye of formula $F^+An'^-$, where $F^+$ is as defined above and $An'^-$ represents an anion stemming from the synthesis or isolation of the dye, is stirred together with a salt of the anion $M^+An^-$ according to the present invention, where $M^+$ represents a cation or one equivalent of a cation and $An^-$ has the abovementioned meaning of a sulphosuccinate, in a mixture of water and an ester at room temperature or higher temperature. The aqueous phase is separated off. This can be done at room temperature or at higher temperature. Advantageously, the ester phase containing the dye of formula $F^+An^-$ is stirred together with fresh water one or more times. The aqueous phase is separated off each time. The ester phase is suitably dried. This provides a solution of a dye of formula $F^+An^-$ where $F^+$ and $An^-$ have the abovementioned meaning.

Examples of anions $An'^-$ are chloride, bromide, sulphate, hydrogensulphate, nitrate, methosulphate.

Ester refers to esters of formic acid, acetic acid, propionic acid and butyric acid, preferably esters of acetic acid and propionic acid.

Examples of esters are propyl formate, butyl formate, ethyl acetate, butyl acetate, methoxypropyl acetate, ethoxypropyl acetate, methyl propionate, ethyl propionate, methyl butyrate. Ethyl acetate and butyl acetate are preferred.

Examples of cations $M^+$ are $Na^+$, $K^+$ and $NH_4^+$.

The temperature can be between room temperature and the boiling point of the mixture. Particular preference is given to between room temperature and 50° C.

Drying the ester phase is to be understood as removing entrained and/or dissolved water. Entrained water can be removed for example by filtration through a suitable membrane or a hydrophobicized filter paper. Suitable drying methods are drying over anhydrous salts such as sodium sulphate or magnesium sulphate or over molecular sieve. A further drying method is the distillative removal of water as azeotrope. Advantageously, various of these methods are carried out in succession.

The invention further provides a process for producing the sulphosuccinates, characterized in that an ester is used in the absence of water.

In this process, the dye of formula $F^+An'^-$, where $F^+$ is as defined above and $An'^-$ represents an anion stemming from the synthesis or isolation of the dye, is stirred together with a salt of the anion $M^+An^-$ according to the present invention, where $M^+$ represents a cation or one equivalent of a cation and $An^-$ has the abovementioned meaning of a sulphosuccinate, in an ester at room temperature or higher temperature and undissolved matter is filtered off. This provides a solution of a dye of formula $F^+An^-$, where $F^+$ and $An^-$ have the abovementioned meaning, useful without further drying. However, in an individual case—when the starting materials used were not completely water-free for example—additional drying can also be necessary, and this is carried out as described above.

Examples of anions $An'^-$ are chloride, bromide, sulphate, hydrogensulphate, nitrate, methosulphate.

Ester refers to the above-recited esters.

Preferred esters are ethyl acetate and butyl acetate.

Examples of cations $M^+$ are $Na^+$, $K^+$ and $NH_4^+$.

The temperature can be between room temperature and the boiling point of the acetic ester. Particular preference is given to between room temperature and 60° C.

The undissolved matter comprises mainly the salt of the composition $M^+An'^-$.

The invention further provides dyes of formulae (Vc) and (Vd)

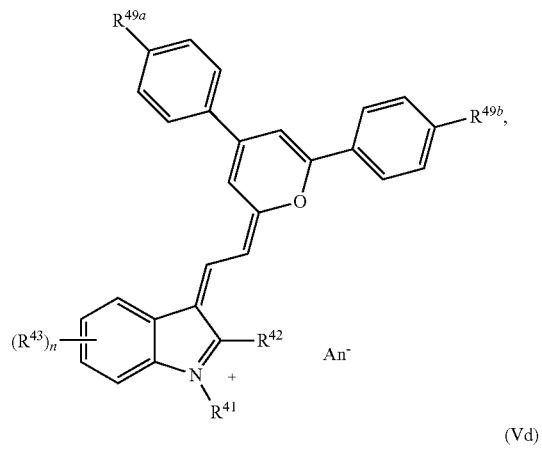

(Vc)

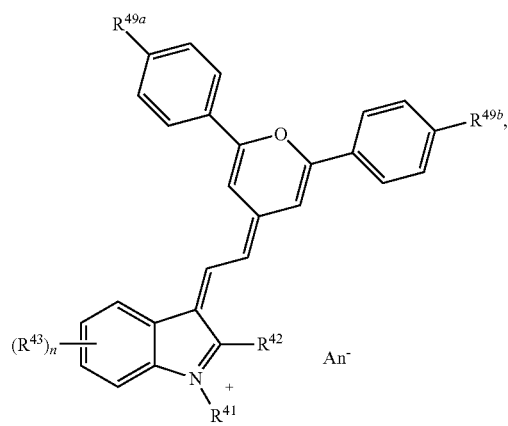

(Vd)

where
$R^{49a}$ and $R^{49b}$ represent hydrogen, $C_1$- to $C_4$-alkyl, $C_1$- to $C_4$-alkoxy, cyano or halogen and preferably are the same,
$R^{41}$ represents hydrogen, $C_1$- to $C_{16}$-alkyl, $C_3$- to $C_6$-alkenyl, $C_5$- to $C_7$-cycloalkyl or $C_7$- to $C_{16}$-aralkyl or $C_6$- to $C_{10}$-aryl,
$R^{42}$ represents $C_1$- to $C_{16}$-alkyl, $C_3$- to $C_6$-alkenyl, $C_5$- to $C_7$-cycloalkyl or $C_7$- to $C_{16}$-aralkyl, $C_6$- to $C_{10}$-aryl or hetaryl,
$R^{43}$ represents hydrogen, $C_1$- to $C_4$-alkyl, $C_1$- to $C_4$-alkoxy, halogen, cyano, nitro or $C_1$- to $C_4$-alkoxycarbonyl or two adjacent $R^{43}$ represent —CH=CH—CH=CH—,
n represents an integer from 0 to 2,
$An^-$ represents an anion, preferably an anion according to the present invention.

Preference is given to dyes of formulae (Vc) and (Vd), where
$R^{49a}$ and $R^{49b}$ represent hydrogen,
$R^{41}$ represents hydrogen, methyl, ethyl, cyanoethyl, allyl or benzyl,
$R^{42}$ represents methyl, ethyl, cyclohexyl, phenyl, tolyl, anisyl or chlorophenyl,
$R^{43}$ represents hydrogen, chlorine, cyano, methyl, methoxy, methoxycarbonyl or ethoxycarbonyl,
n represents 1,
$An^-$ represents an anion, preferably an anion according to the present invention.

As polyisocyanate component a) there can be used any compounds known per se to a person skilled in the art, or mixtures thereof, which on average contain two or more NCO functions per molecule. These can be aromatic, araliphatic, aliphatic or cycloaliphatic based. Monoisocyanates and/or unsaturation-containing polyisocyanates can also be used, in minor amounts.

Suitable examples are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis(4,4'-isocyanatocyclohexyl)methane and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-tolylene diisocyanate, 1,5-naphthylene diisocyanate, 2,4'- or 4,4'-diphenylmethane diisocyanate and/or triphenylmethane 4,4',4"-triisocyanate.

It is likewise possible to use derivatives of monomeric di- or triisocyanates having urethane, urea, carbodiimide, acylurea, isocyanurate, allophanate, biuret, oxadiazinetrione, uretdione and/or iminooxadiazinedione structures.

Preference is given to using polyisocyanates based on aliphatic and/or cycloaliphatic di- or triisocyanates.

It is particularly preferable for the polyisocyanates of component a) to comprise di- or oligomerized aliphatic and/or cycloaliphatic di- or triisocyanates.

Very particular preference is given to isocyanurates, uretdiones and/or iminooxadiazinediones based on HDI and also 1,8-diisocyanato-4-(isocyanatomethyl)octane or mixtures thereof.

Likewise useful as component a) are NCO-functional prepolymers having urethane, allophanate, biuret and/or amide groups. Prepolymers of component a) are obtained in a well-known conventional manner by reacting monomeric, oligomeric or polyisocyanates a1) with isocyanate-reactive compounds a2) in suitable stoichiometry in the presence or absence of catalysts and solvents.

Useful polyisocyanates a1) include all aliphatic, cycloaliphatic, aromatic or araliphatic di- and triisocyanates known per se to a person skilled in the art, it being immaterial whether they were obtained by phosgenation or by phosgene-free processes. In addition, it is also possible to use the well-known conventional higher molecular weight descendant products of monomeric di- and/or triisocyanates having a urethane, urea, carbodiimide, acylurea, isocyanurate, allophanate, biuret, oxadiazinetrione, uretdione or iminooxadiazinedione structure each individually or in any desired mixtures among each other.

Examples of suitable monomeric di- or triisocyanates useful as component a1) are butylene diisocyanate, hexamethylene diisocyanate (HDI), isophorone diisocyanate (IPDI), trimethylhexamethylene diisocyanate (TMDI), 1,8-diisocyanato-4-(isocyanatomethyl)octane, isocyanatomethyl-1,8-octane diisocyanate (TIN), 2,4- and/or 2,6-toluene diisocyanate.

The isocyanate-reactive compounds a2) for constructing the prepolymers are preferably OH-functional compounds. These are analogous to the OH-functional compounds described hereinbelow for component b).

The use of amines for prepolymer preparation is also possible. For example, ethylenediamine, diethylenetriamine, triethylenetetramine, propylenediamine, diaminocyclohexane, diaminobenzene, diaminobisphenyl, difunctional polyamines, such as, for example, the Jeffamine® amine-terminated polymers having number average molar masses of up to 10 000 g/mol and any desired mixtures thereof with one another are suitable.

For the preparation of prepolymers containing biuret groups, isocyanate is reacted in excess with amine, a biuret group forming. All oligomeric or polymeric, primary or secondary, difunctional amines of the abovementioned type are suitable as amines in this case for the reaction with the di-, tri- and polyisocyanates mentioned.

Preferred prepolymers are urethanes, allophanates or biurets obtained from aliphatic isocyanate-functional compounds and oligomeric or polymeric isocyanate-reactive compounds having number average molar masses of 200 to 10 000 g/mol; particular preference is given to urethanes, allophanates or biurets obtained from aliphatic isocyanate-functional compounds and oligomeric or polymeric polyols or polyamines having number average molar masses of 500 to 8500 g/mol. Very particular preference is given to allophanates formed from HDI or TMDI and difunctional polyether-polyols having number average molar masses of 1000 to 8200 g/mol.

The prepolymers described above preferably have residual contents of free monomeric isocyanate of less than 1% by weight, particularly preferably less than 0.5% by weight, very particularly preferably less than 0.2% by weight.

In addition to the prepolymers described, the polyisocyanate component can of course contain further isocyanate components proportionately. Aromatic, araliphatic, aliphatic and cycloaliphatic di-, tri- or polyisocyanates are suitable for this purpose. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate (TMDI), the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-tolylene diisocyanate, 1,5-naphthylene diisocyanate, 2,4'- or 4,4'-diphenylmethane diisocyanate, triphenylmethane 4,4',4"-triisocyanate or derivatives thereof having a urethane, urea, carbodiimide, acylurea, isocyanurate, allophanate, biuret, oxadiazinetrione, uretdione or iminooxadiazinedione structure and mixtures thereof. Polyisocyanates based on oligomerized and/or derivatized diisocyanates which were freed from excess diisocyanate by suitable processes are preferred. The oligomeric isocyanurates, uretdiones and iminooxadiazinediones of HDI and mixtures thereof are particularly preferred.

It is optionally also possible for the polyisocyanate component a) proportionately to contain isocyanates, which are partially reacted with isocyanate-reactive ethylenically unsaturated compounds. $\alpha,\beta$-Unsaturated carboxylic acid derivatives, such as acrylates, methacrylates, maleates, fumarates, maleimides, acrylamides, and vinyl ethers, propenyl ethers, allyl ethers and compounds which contain dicyclopentadienyl units and have at least one group reactive towards isocyanates are preferably used here as isocyanate-reactive ethylenically unsaturated compounds; these are particularly preferably acrylates and methacrylates having at least one isocyanate-reactive group. Suitable hydroxy-functional acrylates or methacrylates are, for example, compounds such as 2-hydroxyethyl(meth)acrylate, polyethylene oxide mono(meth)acrylates, polypropylene oxide mono(meth)acrylates, polyalkylene oxide mono(meth)acrylates, poly($\epsilon$-caprolactone) mono(meth)acrylates, such as, for example, Tone® M100 (Dow, USA), 2-hydroxypropyl(meth)acrylate, 4-hydroxybutyl(meth)acrylate, 3-hydroxy-2,2-dimethylpropyl (meth)acrylate, the hydroxy-functional mono-, di- or tetra (meth)acrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol and industrial mixtures thereof. In addition, isocyanate-reactive oligomeric or polymeric unsaturated compounds containing acrylate and/or methacrylate groups, alone or in combination with the abovementioned monomeric compounds, are suitable. The proportion of isocyanates which are partly reacted with isocyanate-reactive ethylenically unsaturated compounds, based on the isocyanate component a), is 0 to 99%, preferably 0 to 50%, particularly preferably 0 to 25% and very particularly preferably 0 to 15%.

It may also be possible for the abovementioned polyisocyanate component a) to contain, completely or proportionately, isocyanates which are reacted completely or partially with blocking agents known to the person skilled in the art from coating technology. The following may be mentioned as an example of blocking agents: alcohols, lactams, oximes, malonic esters, alkyl acetoacetates, triazoles, phenols, imidazoles, pyrazoles and amines, such as, for example, butanone oxime, diisopropylamine, 1,2,4-triazole, dimethyl-1,2,4-triazole, imidazole, diethyl malonate, ethyl acetoacetate, acetone oxime, 3,5-dimethylpyrazole, ε-caprolactam, N-tert-butylbenzylamine, cyclopentanone carboxyethyl ester or any desired mixtures of these blocking agents.

It is particularly preferable for the polyisocyanate component to be an aliphatic polyisocyanate or an aliphatic prepolymer and preferably an aliphatic polyisocyanate or a prepolymer with primary NCO groups.

All polyfunctional, isocyanate-reactive compounds which have on average at least 1.5 isocyanate-reactive groups per molecule can be used as polyol component b).

In the context of the present invention, isocyanate-reactive groups are preferably hydroxyl, amino or thio groups, and hydroxy compounds are particularly preferred.

Suitable polyfunctional, isocyanate-reactive compounds are, for example, polyester-, polyether-, polycarbonate-, poly(meth)acrylate- and/or polyurethanepolyols.

Suitable polyesterpolyols are, for example, linear polyesterdiols or branched polyesterpolyols, as are obtained in a known manner from aliphatic, cycloaliphatic or aromatic di- or polycarboxylic acids or their anhydrides with polyhydric alcohols having an OH functionality of ≥2.

Examples of such di- or polycarboxylic acids or anhydrides are succinic, glutaric, adipic, pimelic, suberic, azelaic, sebacic, nonanedicarboxylic, decanedicarboxylic, terephthalic, isophthalic, o-phthalic, tetrahydrophthalic, hexahydrophthalic or trimellitic acid and acid anhydrides, such as o-phthalic, trimellitic or succinic anhydride or any desired mixtures thereof with one another.

Examples of suitable alcohols are ethanediol, di-, tri- or tetraethylene glycol, 1,2-propanediol, di-, tri- or tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, trimethylolpropane, glycerol or any desired mixtures thereof with one another.

The polyesterpolyols may also be based on natural raw materials, such as castor oil. It is also possible for the polyesterpolyols to be based on homo- or copolymers of lactones, as can preferably be obtained by an addition reaction of lactones or lactone mixtures, such as butyrolactone, ε-caprolactone and/or methyl-ε-caprolactone, with hydroxy-functional compounds, such as polyhydric alcohols having an OH functionality of >2 for example of the aforementioned type.

Such polyesterpolyols preferably have number average molar masses of 400 to 4000 g/mol, particularly preferably of 500 to 2000 g/mol. Their OH functionality is preferably 1.5 to 3.5, particularly preferably 1.8 to 3.0.

Suitable polycarbonatepolyols are obtainable in a manner known per se by reacting organic carbonates or phosgene with diols or diol mixtures.

Suitable organic carbonates are dimethyl, diethyl and diphenyl carbonate.

Suitable diols or mixtures comprise the polyhydric alcohols mentioned in connection with the polyester segments and having an OH functionality of ≥2, preferably 1,4-butanediol, 1,6-hexanediol and/or 3-methylpentanediol, or polyesterpolyols can be converted into polycarbonatepolyols.

Such polycarbonatepolyols preferably have number average molar masses of 400 to 4000 g/mol, particularly preferably of 500 to 2000 g/mol. The OH functionality of these polyols is preferably 1.8 to 3.2, particularly preferably 1.9 to 3.0.

Suitable polyetherpolyols are polyadducts of cyclic ethers with OH- or NH-functional starter molecules, said polyadducts optionally having a block structure.

Suitable cyclic ethers are, for example, styrene oxides, ethylene oxide, propylene oxide, tetrahydrofuran, butylene oxide, epichlorohydrin and any desired mixtures thereof.

Starters which may be used are the polyhydric alcohols mentioned in connection with the polyesterpolyols and having an OH functionality of ≥2 and primary or secondary amines and amino alcohols.

Preferred polyetherpolyols are those of the abovementioned type, exclusively based on propylene oxide or random or block copolymers based on propylene oxide with further 1-alkylene oxides, the proportion of 1-alkylene oxides being not higher than 80% by weight. Propylene oxide homopolymers and random or block copolymers which have oxyethylene, oxypropylene and/or oxybutylene units are particularly preferred, the proportion of the oxypropylene units, based on the total amount of all oxyethylene, oxypropylene and oxybutylene units, accounting for at least 20% by weight, preferably at least 45% by weight. Here, oxypropylene and oxybutylene comprise all respective linear and branched C3- and C4-isomers.

Such polyetherpolyols preferably have number average molar masses of 250 to 10 000 g/mol, particularly preferably of 500 to 8500 g/mol and very particularly preferably of 600 to 4500 g/mol. The OH functionality is preferably 1.5 to 4.0, particularly preferably 1.8 to 3.1.

In addition, aliphatic, araliphatic or cycloaliphatic di-, tri- or polyfunctional alcohols having molecular weights below 500 g/mol and containing 2 to 20 carbon atoms are useful as polyfunctional, isocyanate-reactive compounds as constituents of polyol component b). These can be for example ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butylpropanediol, trimethylpentanediol, positionally isomeric diethyloctanediols, 1,3-butylene glycol, cyclohexanediol, 1,4-cyclohexanedimethanol, 1,6-hexanediol, 1,2-cyclohexanediol, 1,4-cyclohexanediol, hydrogenated bisphenol A (2,2-bis(4-hydroxycyclohexyl)propane), (2,2-dimethyl-3-hydroxypropyl) 2,2-dimethyl-3-hydroxypropionate. Examples of suitable triols are trimethylolethane, trimethylolpropane or glycerol. Suitable higher-functional alcohols are ditrimethylolpropane, pentaerythritol, dipentaerythritol or sorbitol.

It is particularly preferable for the polyol component to be a difunctional polyether, polyester or a polyether-polyester block copolyester or a polyether-polyester block copolymer with primary OH functions.

Particular preference is given to a combination of components a) and b) in the production of matrix polymers consisting of addition products of butyrolactone, e-caprolactone and/or methyl e-caprolactone onto polyetherpolyols having a functionality of 1.8 to 3.1 with number average molar masses of 200 to 4000 g/mol in conjunction with isocyanurates, uretdiones, iminooxadiazinediones and/or other oligomers based on HDI. Very particular preference is given to addition products of e-caprolactone onto poly(tetrahydrofuran)s having a functionality of 1.9 to 2.2 and number average molar masses of 500 to 2000 g/mol (especially 600 to 1400 g/mol), the number average overall molar mass of which is from 800 to 4500 g/mol and especially from 1000 to 3000 g/mol, in conjunction with oligomers, isocyanurates and/or iminooxadiazinediones based on HDI.

The photoinitiators used are typically initiators which are activatable by actinic radiation and which trigger a polymerization of the corresponding polymerizable groups. Photoinitiators are commercially available compounds known per se, which are classed as unimolecular (type I) and bimolecular (type II). Type II photoinitiators may more particularly comprise a cationic dye and a coinitiator. Useful coinitiators include ammonium arylborates as described for example in EP-A 0223587. Examples of suitable ammonium arylborates are tetrabutylammonium triphenylhexylborate, tetrabutylammonium triphenylbutylborate, tetrabutylammonium trinaphthylhexylborate, tetrabutylammonium tris(4-tert-butyl)phenylbutylborate, tetrabutylammonium tris(3-fluorophenyl)hexylborate, tetramethylammonium triphenylbenzylborate, tetra(n-hexyl)ammonium (sec-butyl)triphenylborate, 1-methyl-3-octylimidazolium dipentyldiphenylborate and tetrabutylammonium tris(3-chloro-4-methylphenyl)hexylborate (Cunningham et al., RadTech'98 North America UV/EB Conference Proceedings, Chicago, Apr. 19-22, 1998).

It can be advantageous to use mixtures of these compounds. Depending on the radiation source used for curing, type and concentration has to be adapted to photoinitiator in a manner known to a person skilled in the art. Further particulars are available for example from P.K.T. Oldring (Ed.), Chemistry & Technology of UV & EB Formulations For Coatings, Inks & Paints, Vol. 3, 1991, SITA Technology, London, pp. 61-328.

Preferred photoinitiators are mixtures of tetrabutylammonium tetrahexylborate, tetrabutylammonium triphenylhexylborate, tetrabutylammonium tris(3-fluorophenyl)-hexylborate ([191726-69-9], CGI 7460, product from BASF SE, Basle) and tetrabutylammonium tris(3-chloro-4-methylphenyl)hexylborate ([1147315-11-4], CGI 909, product from BASF SE, Basle) with the dyes of formula $F^+An^-$ according to the present invention.

In one further preferred embodiment, the photopolymer formulation additionally contains urethanes as plasticizers, which urethanes may be more particularly substituted with at least one fluorine atom.

The urethanes may preferably have the general formula (CI)

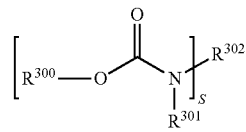

(CI)

where s is $\geq 1$ and $\leq 8$ and $R^{300}$, $R^{301}$, $R^{302}$ are independently of each other hydrogen, linear, branched, cyclic or heterocyclic unsubstituted or else optionally heteroatom-substituted organic moieties, wherein preferably at least one of $R^{300}$, $R^{301}$, $R^{302}$ is substituted with at least a fluorine atom and more preferably $R^{300}$ is an organic moiety with at least one fluorine atom. It is particularly preferable for $R^{302}$ to be a linear, branched, cyclic or heterocyclic organic radical which is unsubstituted or else optionally substituted with heteroatoms such as fluorine for example.

In one further preferred embodiment, the writing monomer comprises at least a mono- and/or a multi-functional writing monomer, which may more particularly comprise mono- and multi-functional acrylate writing monomers. It is particularly preferable for the writing monomer to comprise at least a monofunctional and multifunctional urethane(meth)acrylate.

Acrylate writing monomers may be more particularly compounds of general formula (CII)

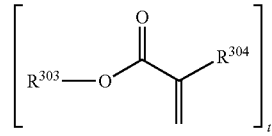

(CII)

where in each case t is $\geq 1$ and $t \leq 4$ and $R^{303}$, $R^{304}$ are independently of each other hydrogen, linear, branched, cyclic or heterocyclic unsubstituted or else optionally heteroatom-substituted organic radicals. It is particularly preferable for $R^{304}$ to be hydrogen or methyl and/or $R^{303}$ to be a linear, branched, cyclic or heterocyclic unsubstituted or else optionally heteroatom-substituted organic radical.

It is similarly possible to add further unsaturated compounds such as α,β-unsaturated carboxylic acid derivatives such as acrylates, methacrylates, maleates, fumarates, maleimides, acrylamides, also vinyl ether, propenyl ether, allyl ether and dicyclopentadienyl-containing compounds and also olefinically unsaturated compounds such as, for example, styrene, a-methylstyrene, vinyltoluene, olefins, for example 1-octene and/or 1-decene, vinyl esters, (meth)acrylonitrile, (meth)acrylamide, methacrylic acid, acrylic acid. Preference, however, is given to acrylates and methacrylates.

In general, esters of acrylic acid and methacrylic acid are designated as acrylates and methacrylates, respectively. Examples of acrylates and methacrylates which can be used are methyl acrylate, methyl methacrylate, ethyl acrylate, ethyl methacrylate, ethoxyethyl acrylate, ethoxyethyl methacrylate, n-butyl acrylate, n-butyl methacrylate, tert-butyl acrylate, tert-butyl methacrylate, hexyl acrylate, hexyl methacrylate, 2-ethylhexyl acrylate, 2-ethylhexyl methacrylate, butoxyethyl acrylate, butoxyethyl methacrylate, lauryl acrylate, lauryl methacrylate, isobornyl acrylate, isobornyl methacrylate, phenyl acrylate, phenyl methacrylate, p-chlorophenyl acrylate, p-chlorophenyl methacrylate, p-bromophenyl acrylate, p-bromophenyl methacrylate, 2,4,6-trichlorophenyl acrylate, 2,4,6-trichlorophenyl methacrylate, 2,4,6-tribromophenyl acrylate, 2,4,6-tribromophenyl methacrylate, pentachlorophenyl acrylate, pentachlorophenyl methacrylate, pentabromophenyl acrylate, pentabromophenyl methacrylate, pentabromobenzyl acrylate, pentabromobenzyl methacrylate, phenoxyethyl acrylate, phenoxyethyl methacrylate, phenoxyethoxyethyl acrylate, phenoxyethoxyethyl methacrylate, phenylthioethyl acrylate, phenylthioethyl methacrylate, 2-naphthyl acrylate, 2-naphthyl methacrylate, 1,4-bis(2-thionaphthyl)-2-butyl acrylate, 1,4-bis(2-thionaphthyl)-2-butyl methacrylate, propane-2,2-diylbis[(2,6-dibromo-4,1-phenylene)oxy(2-{[3,3,3-tris(4-chlorophenyl)propanoyl]oxy}propane-3,1-diyl)oxyethane-2,1-diyl]diacrylate, bisphenol A diacrylate, bisphenol A dimethacrylate, tetrabromobisphenol A diacrylate, tetrabromobisphenol A dimethacrylate and the ethoxylated analogue compounds thereof, N-carbazolyl acrylates, to mention only a selection of acrylates and methacrylates which may be used.

Urethane acrylates may of course also be used. Urethane acrylates are understood as meaning compounds having at least one acrylic acid ester group which additionally have at least one urethane bond. It is known that such compounds can be obtained by reacting a hydroxy-functional acrylic acid ester with an isocyanate-functional compound.

Examples of isocyanate-functional compounds which can be used for this purpose are aromatic, araliphatic, aliphatic and cycloaliphatic di-, tri- or polyisocyanates. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluene diisocyanate, 1,5-naphthylene diisocyanate, 2,4'- or 4,4'-diphenylmethane diisocyanate, 1,5-naphthylene diisocyanate, m-methylthiophenyl isocyanate, triphenylmethane 4,4', 4"-triisocyanate and tris(p-isocyanatophenyl)thiophosphate or derivatives thereof having a urethane, urea, carbodiimide, acylurea, isocyanurate, allophanate, biuret, oxadiazinetrione, uretdione or iminooxadiazinedione structure and mixtures thereof. Aromatic or araliphatic di-, tri- or polyisocyanates are preferred.

Suitable hydroxy-functional acrylates or methacrylates for the preparation of urethane acrylates are compounds such as 2-hydroxyethyl(meth)acrylate, polyethylene oxide mono(meth)acrylates, polypropylene oxide mono(meth)acrylates, polyalkylene oxide mono(meth)acrylates, poly(ε-caprolactone) mono(meth)acrylates, such as, for example, Tone® M100 (Dow, Schwalbach, Germany), 2-hydroxypropyl(meth)acrylate, 4-hydroxybutyl(meth)acrylate, 3-hydroxy-2,2-dimethylpropyl(meth)acrylate, hydroxypropyl(meth)acrylate, 2-hydroxy-3-phenoxypropyl acrylate, the hydroxyfunctional mono-, di- or tetraacrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol or industrial mixtures thereof. 2-Hydroxyethyl acrylate, hydroxypropyl acrylate, 4-hydroxybutyl acrylate and poly(ε-caprolactone) mono(meth)acrylates are preferred. In addition, isocyanate-reactive oligomeric or polymeric unsaturated compounds containing acrylate and/or methacrylate groups, alone or in combination with the abovementioned monomeric compounds, are suitable. The epoxy(meth)acrylates known per se containing hydroxyl groups and having OH contents of 20 to 300 mg KOH/g or polyurethane(meth)acrylates containing hydroxyl groups and having OH contents of 20 to 300 mg KOH/g or acrylated polyacrylates having OH contents of 20 to 300 mg KOH/g and mixtures thereof with one another and mixtures with unsaturated polyesters containing hydroxyl groups and mixtures with polyester(meth)acrylates or mixtures of unsaturated polyesters containing hydroxyl groups with polyester(meth)acrylates can likewise be used.

Preference is given particularly to urethane acrylates obtainable from the reaction of tris(p-isocyanatophenyl)thiophosphate and m-methylthiophenyl isocyanate with alcohol-functional acrylates such as hydroxyethyl(meth)acrylate, hydroxypropyl(meth)acrylate and hydroxybutyl(meth)acrylate.

The invention also provides a holographic medium containing a photopolymer formulation according to the invention, or obtainable using a photopolymer formulation according to the invention. The invention still further provides for the use of a photopolymer formulation according to the invention for producing holographic media.

The holographic media of the invention can be processable to holograms in the entire visible and near UV region (300-800 nm) by appropriate exposure processes for optical applications. Visual holograms comprise any hologram which is recordable by processes known to a person skilled in the art. This definition includes inter alia in-line (Gabor) holograms, off-axis holograms, full-aperture transfer holograms, white light transmission holograms ("rainbow holograms), Denisyuk holograms, off-axis reflection holograms, edge-lit holograms and also holographic stereograms. Preference is given to reflection holograms, Denisyuk holograms, transmission holograms.

Possible optical functions of the holograms obtainable using the photopolymer formulations of the present invention correspond to the optical functions of light elements such as lenses, mirrors, deflectors, filters, diffuser screens, diffraction elements, light conductors, waveguides, projection screens and/or masks. Frequently, these optical elements show a frequency selectivity, depending on how the holograms were exposed and on the dimensions of the hologram.

In addition, the photopolymer formulations of the invention can also be used to produce holographic pictures or images, for example for personal portraits, biometric representations in security documents or generally of images or image structures for advertising, security labels, brand protection, branding, labels, design elements, decorations, illustrations, multi-journey tickets, images and the like, and also images which can represent digital data, inter alia also in combination with the products described above. Holographic images can give the impression of a three-dimensional image, but they may also represent image sequences, short films or a number of different objects, depending on the angle from which they are illuminated, the light source (including moving light source) with which they are illuminated, etc. It is because of these diverse design possibilities that holograms, more particularly volume holograms, constitute an attractive technical solution for the abovementioned use.

The photopolymer formulations can be used more particularly for producing holographic media in the form of a film. A layer of a material or assembly of materials which is transparent to light in the visible spectrum (transmission greater than 85% in the wavelength range from 400 to 780 nm), as a support, is coated one- or both-sidedly and, optionally, a covering layer is applied on top of the photopolymer layer or layers.

Preferred materials or assemblies of materials for the support are based on polycarbonate (PC), polyethylene terephthalate (PET), polybutylene terephthalate, polyethylene, polypropylene, cellulose acetate, cellulose hydrate, cellulose nitrate, cycloolefin polymers, polystyrene, polyepoxides, polysulphone, cellulose triacetate (CTA), polyamide, polymethyl methacrylate, polyvinyl chloride, polyvinyl butyral or polydicyclopentadiene or mixtures thereof. They are more preferably based on PC, PET and CTA. Assemblies of materials can be laminates of self-supporting polymeric sheets, or coextrudates. Preferred assemblies of materials are duplex and triplex films constructed according to one of the schemes A/B, A/B/A or A/B/C. Particular preference is given to PC/PET, PET/PC/PET and PC/TPU (TPU=thermoplastic polyurethane).

As an alternative to the abovementioned plastics supports, it is also possible to use planar glass plates, which are used particularly for large-area accurately imaging exposures, for example for holographic lithography. Holographic interference lithography for integrated optics. IEEE Transactions on Electron Devices (1978), ED-25(10), 1193-1200, ISSN: 0018-9383).

The materials or assemblies of materials of the support may have an anti-stick, antistatic, hydrophobic or hydrophilic finish on one or both sides. On the side facing the photopolymer layer, the modifications mentioned serve the purpose of making it possible to remove the photopolymer layer from the support non-destructively. A modification of that side of the support which faces away from the photopolymer layer serves to ensure that the media of the present invention meet specific mechanical requirements, for example in relation to processing in roll laminators, more particularly in roll-to-roll processes.

The present invention further provides a dye of formula $F^+An^-$ where $F^+$ represents a cationic dye and $An^-$ represents an anion and wherein the anion $An^-$ is selected from the group sec-alkylbenzenesulphonates, branched alkyl sulphates, n-alkyl sulphates, sec-alkylsulphonates, sulphosuccinates, ester sulphates and ester sulphonates. It is particularly preferable here when the cationic dye $F^+$ is selected from the group of acridine, xanthene, thioxanthene, phenazine, phenoxazine, phenothiazine, tri(het)arylmethane, particularly diamino- and triamino(het)arylmethane, mono-, di- and trimethinecyanine, hemicyanine, externally cationic merocyanine, externally cationic neutrocyanine, nullmethine, particularly naphtholactam and streptocyanine dyes.

EXAMPLES

The examples which follow illustrate the invention.
Methods of Measurement:
The reported OH numbers were determined according to DIN 53240-2.

The reported NCO values (isocyanate contents) were determined according to DIN EN ISO 11909.

The reported water contents (KF) from solution were determined to DIN 51777.

The 2-hydroxyethyl acrylate (HEA) content is determined on the lines of DIN/ISO 10283 (2007). 1.41 g of anthracene (calibrating substance) as internal standard substance are weighed into a 1 liter volumetric flask and made up with ethyl acetate to the mark. About 1 g of sample is weighed out and mixed with 10 mL of the above-described solution of the internal standard and 10 mL of ethyl acetate, of which 2.0 µL are separated by gas chromatography, and HEA content is computed in area-corrected % by weight.

Water imbibition of examples was determined by initially drying 5-10 g of the dyes in each case in an open glass dish at a pressure of 200 mbar and a temperature of 50° C. to constant mass. Samples were weighed after removal from the vacuum drying cabinet after they had a chance to cool down to room temperature during 60 min in the absence of moisture. To ensure absence of moisture prior to weighing, the glass dishes were sealed airtight with Parafilm M® (Pechiney Plastic Packaging, Chicago, Ill. 60631, USA, www.parafilm.com), and then weighed. This was followed by standing in air at room temperature (22° C.) and relative humidity of 90% for 7 days to constant mass and weighing. Water imbibition was then computed from formula (F-1)

$$W = (m_f/m_t - 1) * 100\%  \quad (F\text{-}1),$$

where $m_f$ is the mass of the dye after water saturation and $m_t$ is the mass of the dried dye.

Measurement of plateau modulus $G_0$ of matrix network of photopolymers with oscillation rheometer in context of present invention To produce the photopolymer formulation for determining the plateau modulus $G_0$ of the matrix network, the writing monomers and also additives, the isocyanate-reactive component and the dye solution are added together and mixed in a Speedmixer for 5 minutes. The dye was dissolved in N-ethylpyrrolidone beforehand. Then, isocyanate is added followed by mixing in the Speedmixer for 1 minute. Thereafter, a solution of the catalyst in N-ethylpyrrolidone is added which is again followed by mixing in the Speedmixer for 1 minute. The concentration of catalyst in N-ethylpyrrolidone is 10 weight percent.

The still liquid formulation is then introduced into the plate-plate measuring system of a rheometer (from Anton Paar Physica model MCR 301 equipped with the oven model CTD 450 which was preheated to 80° C.). The curing of the matrix of the photopolymer formulation over time is then measured under the following conditions:
  Plate spacing 250 µm.
  Oscillation measuring mode at a constant angular frequency $\omega_0$ of 10 rad/s and a regulated deformation amplitude of 1%.
  Temperature 80° C., normal force regulation set to 0 newtons
  Recording the storage modulus G' over the measuring time of at most 2 hours or until a constant value $G_{max}$ of G' was reached. This value is then taken as the plateau modulus $G_0$ of the matrix network of photopolymers.

Figure 3:
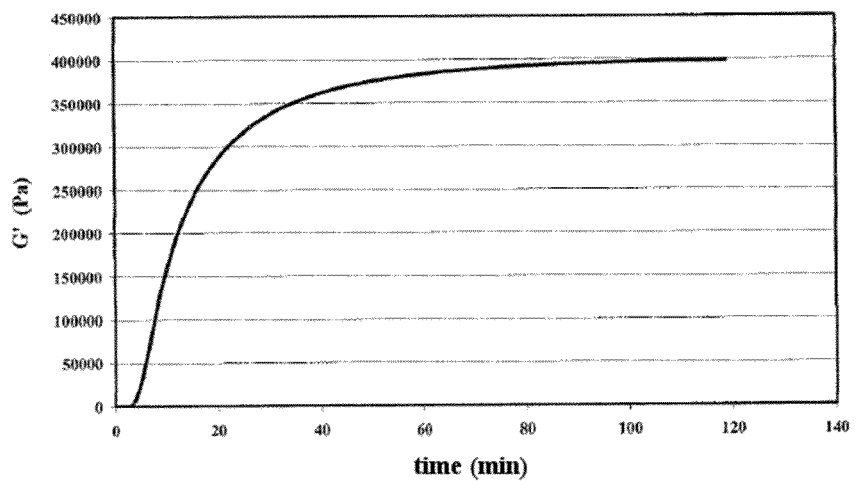
FIG. 3 shows the course of curing the matrix network as a plot of storage modulus G' against curing time.

FIG. 3 shows the course of curing the matrix network as a plot of storage modulus G' against curing time.

According to M. Doi, S. F. Edwards, The Theory of Polymer Dynamics, Oxford Science Publications, 1986, the plateau modulus $G_0$ can be related to the average molecular weight $M_C$ of segments bridging two polymer strands as follows.

$$G_0 = \frac{\rho \cdot R \cdot T}{M_C}$$

R is Avogadro's constant, T is the absolute temperature in kelvin and ρ is the mass density. A low plateau modulus $G_0$ or a high average molecular weight $M_C$ for segments bridging two polymer strands characterize a network of low crosslink density.

Therefore, given a solid composition for the photopolymer formulation, a reduced plateau modulus $G_0$ is indicative of incomplete crosslinking of matrix polymer.

Measuring the holographic properties DE and Δn of holographic media via two-beam interference in reflection arrangement.

Figure 1:
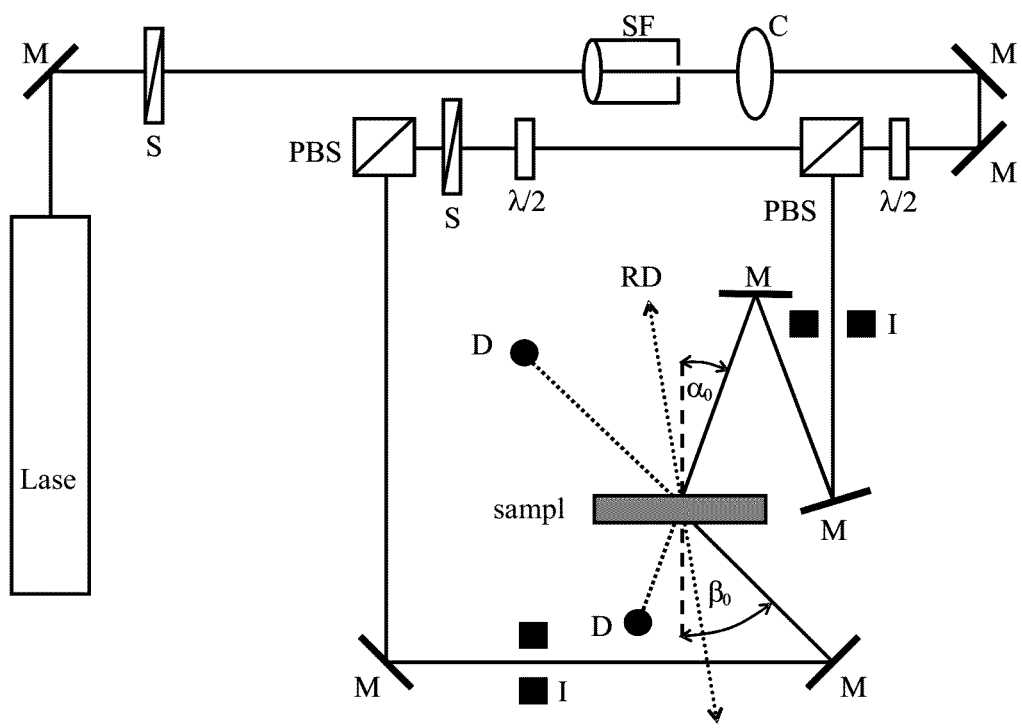
FIG. 1 shows the measured transmitted power PT (right y axis) as a solid line plotted against the angle detuning ΔΩ, the measured diffraction efficiency η (left y axis) as solid circles plotted against the angle detuning ΔΩ (if permitted by the finite size of the detector) and the adaptation of the Kogelnik theory as a dashed line (left y axis).

The experimental holographic set-up as depicted in FIG. 1 was used to measure the diffraction efficiency (DE) of media. The beam of an He—Ne laser (emission wavelength 633 nm) was transformed via the spatial filter (SF) and together with the collimation lens (CL) into a parallel homogeneous beam. The final cross sections of the signal and reference beams are fixed via the iris diaphragms (I). The diameter of the iris diaphragm opening is 0.4 cm. The polarization-dependent beam splitters (PBS) split the laser beam into two coherent identically polarized beams. Via the λ/2 plates, the power of the reference beam was adjusted to 0.5 mW and the power of the signal beam to 0.65 mW. The powers were determined using the semiconductor detectors (D) with sample removed. The angle of incidence ($\alpha_0$) of the reference beam is $-21.8°$ and the angle of incidence ($\beta_0$) of the signal beam is $41.8°$. The angles are measured from the sample normal to the beam direction. According to FIG. 1, therefore, $\alpha_0$ has a negative sign and $\beta_0$ has a positive sign. At the location of the sample (medium), the interference field of the two overlapping beams produced a grating of light and dark strips which are perpendicular to the angle bisector of the two beams incident on the samples (reflection hologram). The strip spacing Λ, also referred to as grating period, in the medium is ~225 nm (the refractive index of the medium is assumed to be ~1.504).

FIG. 1 shows the geometry of a holographic media tester (HMT) at λ=633 nm (He—Ne laser): M=mirror, S=shutter, SF=spatial filter, CL=collimator lens, λ/2=λ/2 plate, PBS=polarization-sensitive beam splitter, D=detector, I=iris diaphragm, $\alpha_0=-21.8°$, $\beta_0=41.8°$ are the angles of incidence of the coherent beams outside the sample (outside the medium). RD=reference direction of turntable.

Holograms were written into the medium in the following manner:

Both shutters (S) are open for the exposure time t.
Thereafter, with the shutters (S) closed, the medium was allowed 5 minutes for the diffusion of still unpolymerized writing monomers.

The written holograms were then read in the following manner. The shutter of the signal beam remained closed. The shutter of the reference beam was open. The iris diaphragm of the reference beam was closed to a diameter of <1 mm. This ensured that the beam was always completely in the previously written hologram for all angles (Ω) of rotation of the medium. The turntable, under computer control, then covered the angle range from $\Omega_{min}$ to $\Omega_{max}$ with an angle step width of $0.05°$. Ω is measured from the sample normal to the reference direction of the turntable. The reference direction of the turntable occurs when, during writing of the hologram, the angle of incidence of the reference beam and of the signal beam are of equal magnitude, i.e. $\alpha_4=-31.8°$ and $\beta_0=31.8°$. $\Omega_{recording}$ is then $=0°$. For $\alpha_0=-21.8°$ and $\beta_0=41.8°$, therefore, $\Omega_{recording}$ is $10°$. The following is generally true for the interference field during recording ("writing") of the hologram:

$$\alpha_0=\theta_0+\Omega_{recording}.$$

$\theta_0$ is the semiangle in the laboratory system outside the medium and the following is true during recording of the hologram:

$$\theta_0 = \frac{\alpha_0 - \beta_0}{2}.$$

In this case, $\theta_0$ is therefore $-31.8°$. At each angle Ω of rotation approached, the powers of the beam transmitted in the zeroth order were measured by means of the corresponding detector D and the powers of the beam transmitted in the first order were measured by means of detector D. The diffraction efficiency was obtained at each angle Ω approached as the quotient of:

$$\eta = \frac{P_D}{P_D + P_T}$$

$P_D$ is the power in the detector of the diffracted beam and $P_T$ is the power in the detector of the transmitted beam.

By means of the method described above, the Bragg curve (it describes the diffraction efficiency η as a function of the angle Ω of rotation) of the recorded hologram was measured and stored in a computer. In addition, the intensity transmitted in the zeroth order was also recorded with respect to the angle Ω of rotation and stored in a computer.

The maximum diffraction efficiency (DE=$\eta_{max}$) of the hologram, i.e. its peak value, was determined at $\Omega_{reconstruction}$. For this purpose, the position of the detector of the diffracted beam had to be changed, if necessary, in order to determine this maximum value.

The refractive index contrast Δn and the thickness d of the photopolymer layer were now determined by means of the Coupled Wave Theory (cf. H. Kogelnik, The Bell System Technical Journal, Volume 48, November 1969, Number 9, page 2909-page 2947) from the measured Bragg curve and the angle variation of the transmitted intensity. It should be noted that, owing to the thickness shrinkage occurring as a result of the photopolymerization, the strip spacing Λ' of the hologram and the orientation of the strips (slant) may deviate from the strip spacing Λ of the interference pattern and the orientation thereof. Accordingly, the angle $\alpha_0$' or the corresponding angle of the turntable $\Omega_{reconstruction}$ at which maximum diffraction efficiency is achieved will also deviate from $\alpha_0$ or from the corresponding $\Omega_{recording}$, respectively. As a result, the Bragg condition changes. This change is taken into account in the evaluation method. The evaluation method is described below:

all geometrical quantities which relate to the recorded hologram and not to the interference pattern are represented as quantities shown by dashed lines.

According to Kogelnik, the following is true for the Bragg curve η(Ω) of a reflection hologram:

$$\eta = \begin{cases} \dfrac{1}{1 - \dfrac{1-(\xi/v)^2}{\sin^2\left(\sqrt{\xi^2 - v^2}\right)}}, & \text{for } v^2 - \xi^2 < 0 \\[2ex] \dfrac{1}{1 + \dfrac{1-(\xi/v)^2}{\sinh^2\left(\sqrt{v^2 - \xi^2}\right)}}, & \text{for } v^2 - \xi^2 \geq 0 \end{cases}$$

with:

$$v = \frac{\pi \cdot \Delta n \cdot d'}{\lambda \cdot \sqrt{|c_x \cdot c_r|}}$$

$$\xi = -\frac{d'}{2 \cdot c_s} \cdot DP$$

$$c_s = \cos(\vartheta') - \cos(\psi') \cdot \frac{\lambda}{n \cdot \Lambda'}$$

-continued $$c_r = \cos(\vartheta')$$

$$DP = \frac{\pi}{\Lambda'} \cdot \left(2 \cdot \cos(\psi' - \vartheta') - \frac{\lambda}{n \cdot \Lambda'}\right)$$

$$\psi' = \frac{\beta' + \alpha'}{2}$$

$$\Lambda' = \frac{\lambda}{2 \cdot n \cdot \cos(\psi' - \alpha')}$$

When reading the hologram ("reconstruction"), the situation is analogous to that described above:

$$\vartheta'_0 = \eta_0 + \Omega$$

$$\sin(\vartheta'_0) = n \cdot \sin(\vartheta')$$

Under the Bragg condition, the "dephasing" DP is 0. Accordingly, the following is true:

$$\alpha'_0 = \theta_0 + \Omega_{reconstruction}$$

$$\sin(\alpha'_0) = n \cdot \sin(\alpha')$$

The still unknown angle β' can be determined from the comparison of the Bragg condition of the interference field during recording of the hologram and the Bragg condition during reading of the hologram, assuming that only thickness shrinkage takes place. The following is then true:

$$\sin(\beta') = \frac{1}{n} \cdot [\sin(\alpha_0) + \sin(\beta_0) - \sin(\theta_0 + \Omega_{reconstruction})]$$

ν is the grating thickness, ξ is the detuning parameter and ψ' is the orientation (slant) of the refractive index grating which was recorded. α' and β' correspond to the angles $\alpha_0$ and $\beta_0$ of the interference field during recording of the hologram, but measured in the medium and applicable to the grating of the hologram (after thickness shrinkage). n is the mean refractive index of the photopolymer and was set at 1.504. λ is the wavelength of the laser light in vacuo.

The maximum diffraction efficiency (DE=$\theta_{max}$) for ξ=0 is then:

$$DE = \tanh^2(v) = \tanh^2\left(\frac{\pi \cdot \Delta n \cdot d'}{\lambda \cdot \sqrt{\cos(\alpha') \cdot \cos(\alpha' - 2\psi)}}\right)$$

FIG. 1 shows the measured transmitted power $P_T$ (right y axis) as a solid line plotted against the angle detuning ΔΩ, the measured diffraction efficiency η (left y axis) as solid circles plotted against the angle detuning ΔΩ (if permitted by the finite size of the detector) and the adaptation of the Kogelnik theory as a dashed line (lefty axis).

Figure 2:
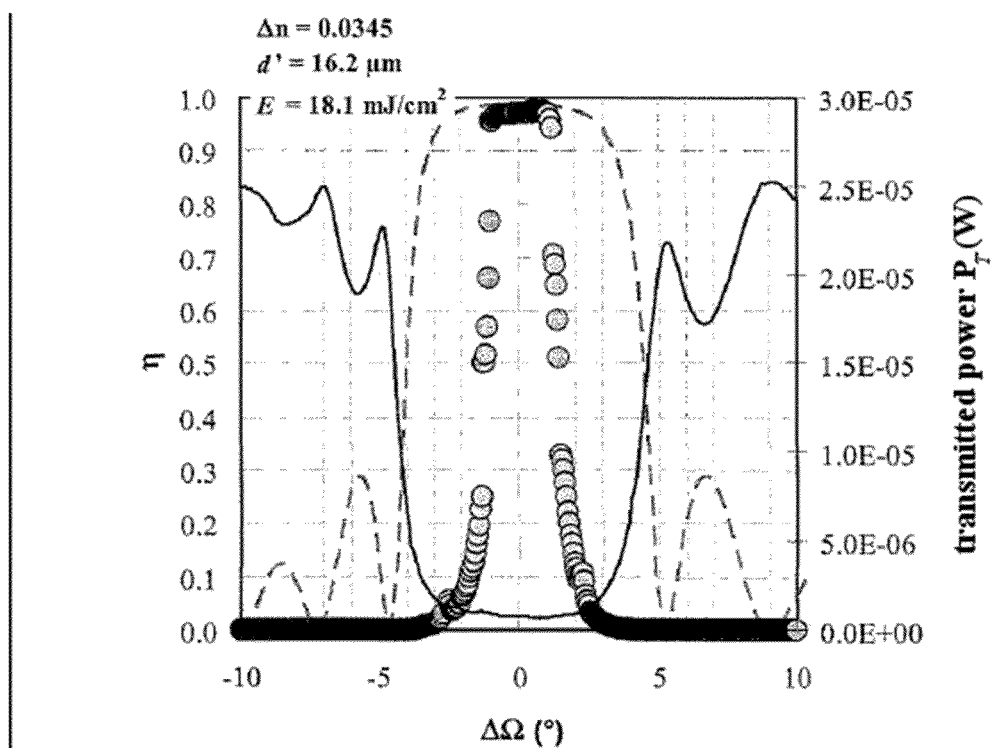
FIG. 2 shows the plot of the Bragg curve η according to the Coupled Wave Theory (dashed line), the measured diffraction efficiency (solid circles) and the transmitted power (black solid line) against the angle detuning $\Delta\Omega$.

The measured data of the diffraction efficiency, the theoretical Bragg curve and the transmitted intensity are plotted against the centred angle of rotation $\Delta\Omega \equiv \Omega_{reconstruction} - \Omega = \alpha'_0 - \vartheta'_0$, also referred to as angle detuning, as shown in FIG. 2.

Since DE is known, the shape of the theoretical Bragg curve according to Kogelnik is determined only by the thickness d' of the photopolymer layer. Δn is corrected via DE for a given thickness d' so that measurement and theory of DE always agree. d' is now adjusted until the angular positions of the first secondary minima of the theoretical Bragg curve correspond to the angular positions of the first secondary maxima of the transmitted intensity and furthermore the full width at half maximum (FWHM) for the theoretical Bragg curve and for the transmitted intensity correspond.

Since the direction in which a reflection hologram rotates on reconstruction by means of an Ω scan, but the detector for diffracted light can detect only a finite angular range, the Bragg curve of broad holograms (small d') is not completely registered with an Ω scan, but only the central region, with suitable detector positioning. The shape of the transmitted intensity which is complementary to the Bragg curve is therefore additionally used for adjusting the layer thickness d'

FIG. 2 shows the plot of the Bragg curve η according to the Coupled Wave Theory (dashed line), the measured diffraction efficiency (solid circles) and the transmitted power (black solid line) against the angle detuning ΔΩ.

For one formulation, this procedure was possibly repeated several times for different exposure times t on different media in order to determine at which mean energy dose of the incident laser beam during recording of the hologram DE the saturation value is reached. The mean energy dose E is obtained as follows from the powers of the two partial beams coordinated with the angles $\alpha_0$ and $\beta_0$ (reference beam with $P_r$=0.50 mW and signal beam with $P_s$=0.63 mW), the exposure time t and the diameter of the iris diaphragm (0.4 cm):

$$E(mJ/cm^2) = \frac{2 \cdot [P_r + P_s] \cdot t(s)}{\pi \cdot 0.4^2 cm^2}$$

The powers of the partial beams were adjusted so that, at the angles $\alpha_0$ and $\beta_0$ used, the same power density is reached in the medium.

As an alternative I, a test equivalent to the set-up depicted in illustration 1 was also performed with a green laser of emission wavelength λ in vacuo of 532 nm. For this, $\alpha_0$=−11.5° and $\beta_0$=33.5° and $P_r$=1.84 mW and $P_s$=2.16 mW.

As an alternative II, a test equivalent to the set-up depicted in illustration 1 was also performed with a blue laser of emission wavelength λ in vacuo of 473 nm. For this, $\alpha_0$=−22.0° and $\beta_0$=42.0° and $P_r$=1.78 mW and $P_s$=2.22 mW.

Substances:

The dyes and salts used as well as solvents and reagents were acquired commercially.

CGI-909 Tetrabutylammonium tris(3-chloro-4-methylphenyl)(hexyl)borate, [1147315-11-4] is a product produced by BASF SE, Basle, Switzerland.

Desmorapid Z Dibutyltin dilaurate [77-58-7], product from Bayer MaterialScience AG, Leverkusen, Germany.

Desmodur® N 3900 Product from Bayer MaterialScience AG, Leverkusen, Germany, hexane diisocyanate-based polyisocyanate, iminooxadiazinedione proportion at least 30%, NCO content: 23.5%.

Fomrez UL 28 Urethanization catalyst, commercial product of Momentive Performance Chemicals, Wilton, Conn., USA.

Safranin O/T It was found that commercial Safranin O/T consists of six coloured

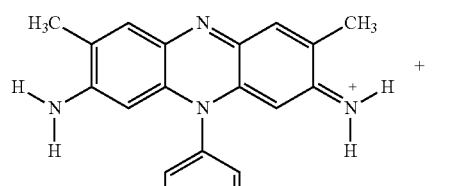

75-80%

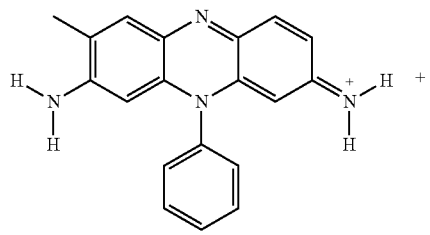

8-10%

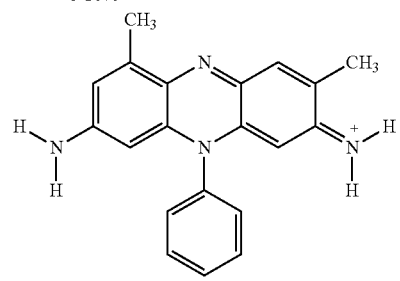

8-10%

The fourth is a further isomer with 2 methyl groups. For the other two, mass spectroscopy suggests the structures

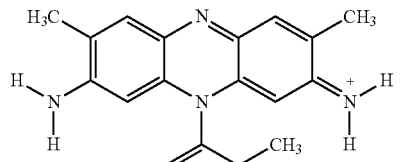

and

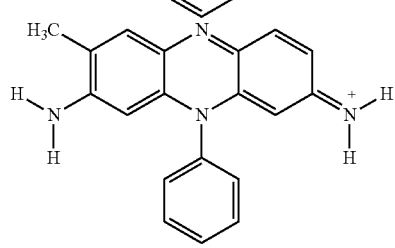

or isomers thereof to be plausible. For simplicity, only the formula of the main component is indicated below when Safranin O is used. But this is always to be understood as meaning the mixture of all six components—including in combination with the anions of the invention.

Example 1

3.00 g of Safranin O corresponding to a mixture with the dye of formula

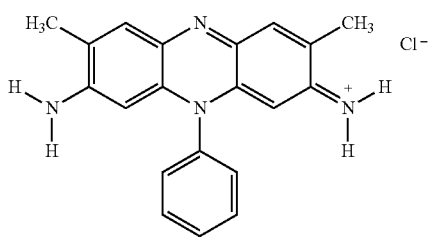 [SMILES: Cc1cc2nc3cc(C)c(=[NH2+])cc-3n(-c3ccccc3)c2cc1N ; [Cl-]]

as main component (obtained in 2010 from Chemos GmbH, Germany, Article No. 1308) were dissolved in a mixture of 20 ml of methanol and 30 ml of water. A solution of 2.98 g of sodium 4-(sec-dodecyl)benzenesulphonate (mixture with the five different sec-dodecyl moieties) was prepared from 3.10 g of 4-(sec-dodecyl)benzenesulphonic acid 90 percent pure (obtained in 2010 from Fluka, Article No. 44198) by neutralizing a solution in 50 ml of water with 1M aqueous sodium hydroxide solution. This solution was added dropwise to the dye solution at room temperature during 30 min under efficient agitation. During 30 min, 100 ml of water were added dropwise. The red suspension was stirred at room temperature for 5 h, filtered off with suction, washed with 200 ml of water in portions and dried at 50° C. under reduced pressure to obtain 5.99 g (91.2% of theory) of a mixture as a red powder which in one formula (dye: main component, anion: idealized) corresponds to

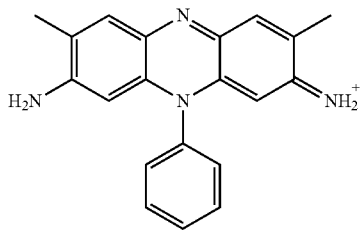

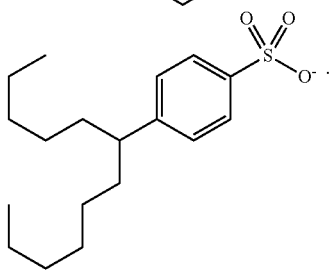

$\lambda_{max}$ in methanol: 528 nm.
Suitable laser wavelength: 532 nm.

Example 2

5.00 g of the dye of formula

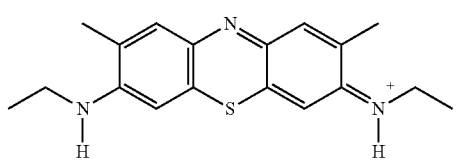

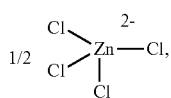

(New Methylene Blue, obtained from in 2008 TCI Europe b.v.) were dissolved in a mixture of 60 ml of water and 10 ml of glacial acetic acid. This solution was diluted with 100 ml of water and 20 ml of methanol. 5.44 g of a 50 percent solution of sodium 2-ethylhexylsulphate (obtained from Aldrich in 2009) were diluted with 17 ml of water. This solution was added dropwise to the dye solution at room temperature during 60 min under efficient agitation to obtain a suspension which was subsequently stirred for 2 h. This was followed by filtration with suction and washing with 200 ml of water in portions. Drying at 50° C. under reduced pressure left 4.85 g (79.4% of theory) of a blue powder of formula

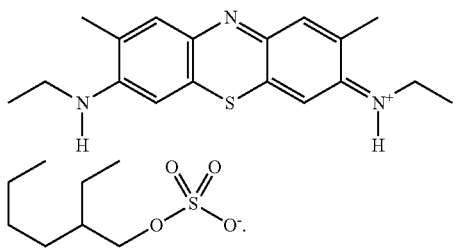

$\lambda_{max}$ in methanol: 625 nm.
Suitable laser wavelength: 633 nm.

Example 3

3.00 g of the dye of formula

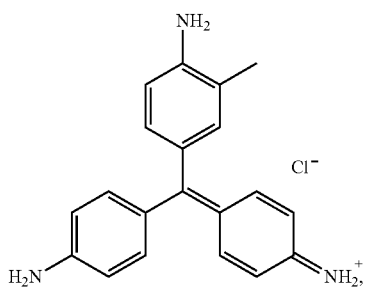

(Fuchsin, obtained from Alfa-Aesar in 2009) were dissolved in 70 ml of methanol. 2.56 g of sodium dodecylsulphate (obtained from Applichem in 2009) were dissolved in 25 ml of water. This solution was added dropwise to the dye solution at room temperature during 30 min under efficient agitation to obtain a deeply red-violet solution which was precipitated by gradual addition of altogether 40 ml of water during 5 h. The precipitate was filtered off with suction, washed with 60 ml of 1:1 water/methanol and finally with 150 ml of water and dried at 50° C. under reduced pressure to obtain 3.38 g (67.0% of theory) of a violet powder of formula

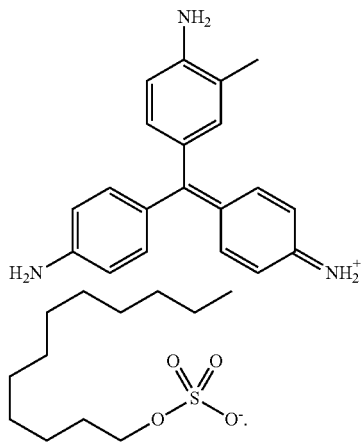

$\lambda_{max}$ in methanol: 551 nm.
Suitable laser wavelength: 532 nm.

Example 4

2.00 g of Safranin O (supply source see Example 1) which corresponds to a mixture with the dye of formula

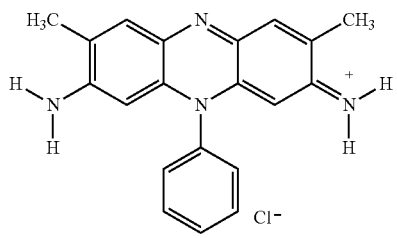

as main component were dissolved in 60 ml of acetonitrile at 50° C. 4.96 g of triethylammonium salt of formula

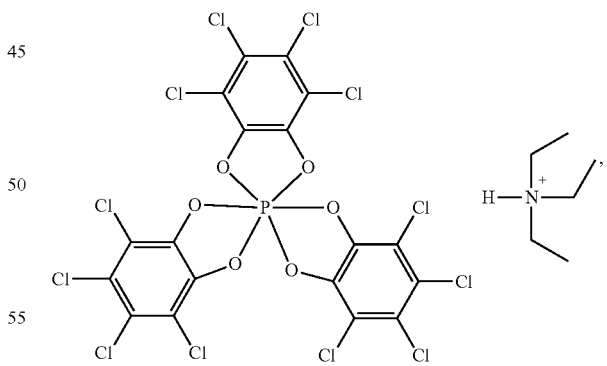

prepared as per J. Org. Chem. 2004, 69, 8521-8524, were dissolved in 30 ml of acetonitrile at 50° C. This solution was added dropwise to the dye solution at 50° C. during 10 min under efficient agitation. The mixture was cooled down to room temperature and precipitated with 150 ml of water. The red suspension was filtered off with suction, washed with 150 ml of water portionwise and dried at 50° C. under reduced pressure to leave 5.34 g (86.3% of theory) of a red powder of formula

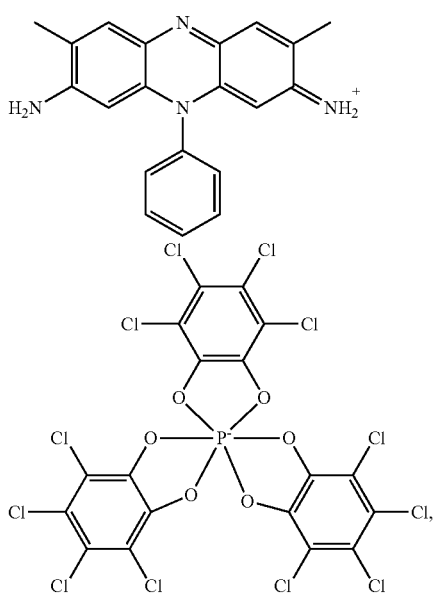

$\lambda_{max}$ in methanol: 528 nm.
Suitable laser wavelength: 532 nm.

Example 5

2.00 g of Safranin O (supply source see Example 1) which corresponds to a mixture with the dye of formula

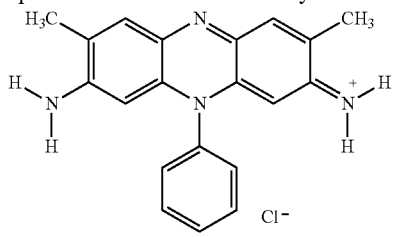

as main component were partially dissolved in 20 ml of water. 1.74 g of sodium oleate (obtained from Riedel-de-Haen in 1982) were dissolved in 30 ml of water. This solution was added to the partial solution of the dye followed by stirring at room temperature for 24 h. A resinous red product has formed, and the aqueous phase was decanted from it. The resin was stirred with 30 ml of fresh water for 24 h. Another decanting was carried out. The red resin was dried at 50° C. under reduced pressure and finally stirred with 30 ml of tert-butyl methyl ether. The suspension formed was filtered off with suction, washed with 5 ml of tert-butyl methyl ether and dried at 50° C. under reduced pressure to leave 2.72 g (79.9% of theory) of a red powder of formula

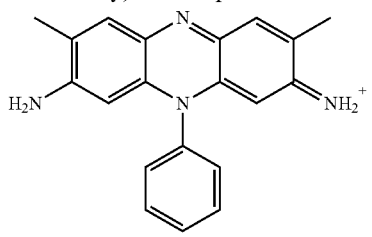

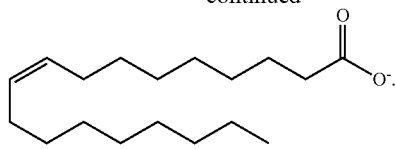

$\lambda_{max}$ in methanol: 528 nm.
Suitable laser wavelength: 532 nm.

Example 6

2.00 g of the dye of formula

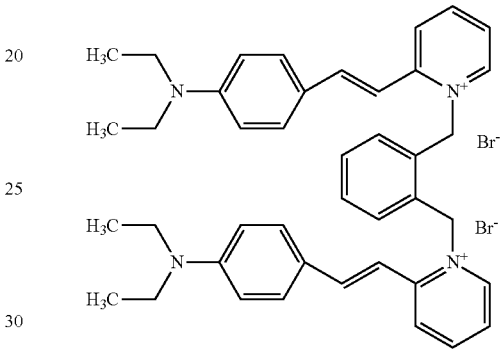

were dissolved in 45 ml of methanol by stirring at the heat of boiling. 1.78 g of sodium tetraphenylborate (obtained from ABCR in 2010) were added. The resulting suspension was boiled for 15 min, cooled down, filtered off with suction, washed with 20 ml of methanol and 100 ml of water and dried at 50° C. under reduced pressure. For purification, the crude dye was dissolved at room temperature in the least amount of N-ethylpyrrolidone needed, diluted with five times the amount of methanol and finally precipitated with water to the point of a pale coloured mother liquor. The precipitate was filtered off with suction, washed with 50 ml of methanol in portions and dried at 50° C. under reduced pressure to obtain 2.45 g (75.5% of theory) of a red, slightly greenishly iridescent powder of formula

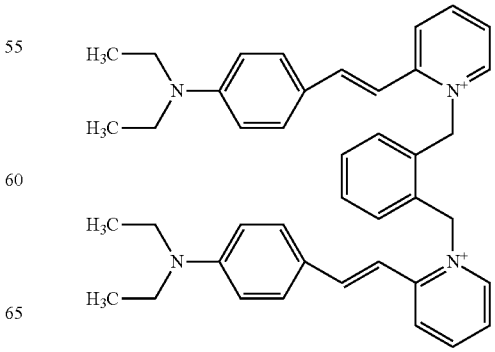

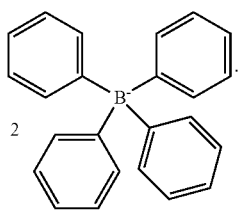

$\lambda_{max}$ in methanol: 486 nm.
Suitable laser wavelength: 473 nm.

The starting dye was prepared similarly to existing methods as follows:

5.78 g of 2-methylpyridine and 8.20 g of α,α'-dibromo-o-xylene were stirred in 60 ml of γ-butyrolactone at 80° C. for 2 h. The mixture was cooled down and filtered with suction and the filter residue was dried. 12.0 g of this material were placed in a mixture of 27 ml of glacial acetic acid and 27 ml of morpholine and gradually mixed with 9.45 g of 4-diethylaminobenzaldehyde before stirring at 80° C. for 2 h. After cooling, the mixture was discharged onto water and the product was isolated and dried.

Example 7

2.00 g of dye of formula

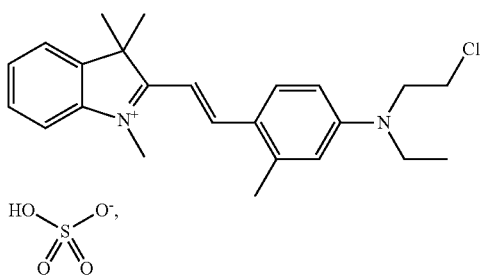

(C. I. Basic Violet 7) were dissolved in 30 ml of ethanol. In the absence of light, 6.39 g of a 20 percent aqueous solution of lithium butyl triphenylborate (obtained from Hokko Chemical Ind., Japan, in 2009) were added dropwise at room temperature under agitation. The thick red suspension was stirred for 4 h, filtered off with suction, washed with 15 ml of ethanol and 100 ml of water in portions and dried at 50° C. under reduced pressure in the absence of light to obtain 2.78 g (97.7% of theory) of a purple-coloured powder of formula

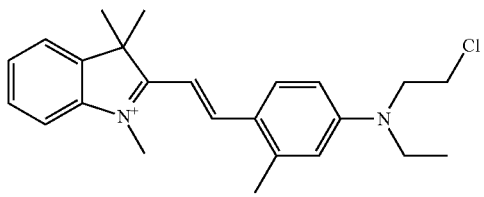

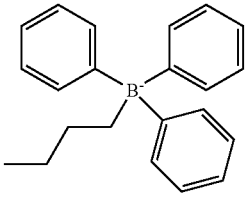

$\lambda_{max}$ in methanol: 549 nm.
Suitable laser wavelength: 532 nm.

Example 8

3.00 g of dye of formula

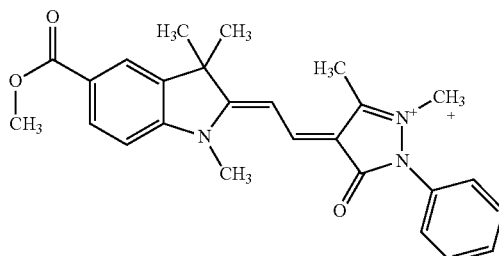

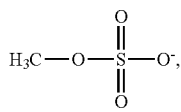

prepared as described in German patent 1 158 646, were partially dissolved in 50 ml of methanol. 1.90 g of sodium tetraphenylborate (obtained from ABCR in 2010) were dissolved in 15 ml of methanol. This solution was added dropwise to the dye suspension at room temperature during 30 min under agitation. In the process, the red suspension turned into an orange suspension. After 2 h stirring it was filtered off with suction, washed with 10 ml of methanol and 100 ml of water in portions and dried at 50° C. under reduced pressure to obtain 2.00 g (28.2% of theory) of a reddish orange powder of formula

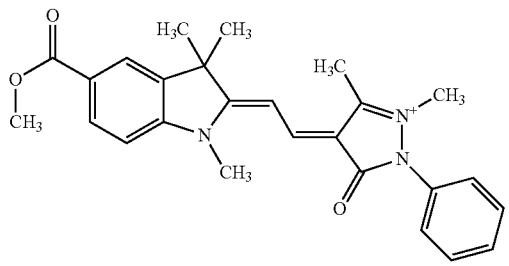

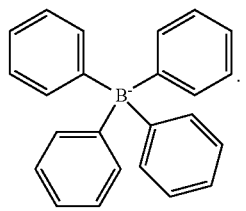

$\lambda_{max}$ in methanol: 467 nm.
Suitable laser wavelength: 473 nm.

Example 9

15.0 g of sodium bis(2-ethylhexyl)sulphosuccinate (obtained from Aldrich in 2010) were dissolved in 350 ml of water at 50° C. 24.5 g of dye of formula

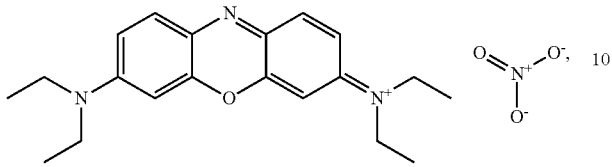

(Basic Blue 3), as 53% by weight material and 220 ml of butyl acetate were added and stirred at 50° C. for 4 h. The aqueous phase was separated off and the organic phase was stirred three times with 50 ml of fresh water at 50° C. Finally the aqueous phase was separated off each time, the last time at room temperature. The deep blue organic phase was dried with anhydrous magnesium sulphate, filtered and freed of residual water by azeotropic distillation at 150 mbar. Anhydrous butyl acetate was added to finally obtain 250 g of deep blue solution which was 9.68% by weight in respect of the dye of formula

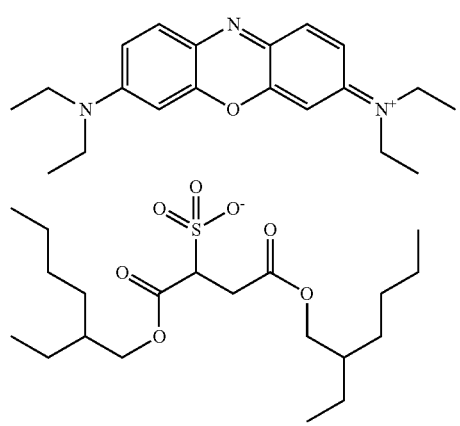

(96.4% of theory).
Water content (KF): 0.1%
$\lambda_{max}$ in methanol: 643 nm.
Suitable laser wavelength: 633 nm.

Evaporating the solution gave 24.2 g of a deep blue glass which crystallizes gradually in the form of goldingly lustrous prisms. They can in turn be used to prepare for example 20% by weight solutions in butanone or 7:3 ethyl acetate/butanone.

Example 10

3.71 g of anhydrous sodium bis(2-ethylhexyl)sulphosuccinate (obtained from Aldrich in 2010) were dissolved in 50 ml of anhydrous ethyl acetate. 4.00 g of the anhydrous dye of formula

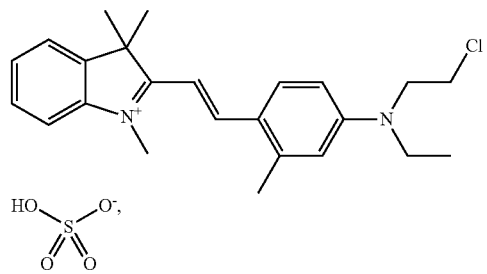

(Basic Violet 7), were added. The deep red mixture was stirred at room temperature for 3 h and filtered through a fluted filter to obtain 49.3 g of a ruby-red solution which is 13.5% by weight in respect of the dye of formula

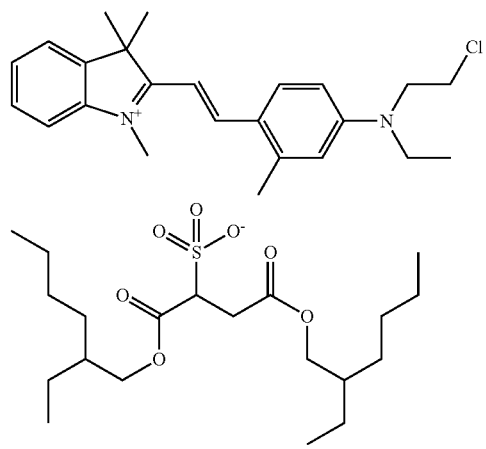

(99.2% of theory).
Water content (KF): 0.08%
$\lambda_{max}$ in methanol: 549 nm.
Suitable laser wavelength: 532 nm.

Example 11

2.78 g of sodium di-n-octylsulphosuccinate prepared as described in Phys. Chem. Chem. Phys. 1999, 1, 4395 were dissolved in 20 ml of ethyl acetate. 2.20 g of dye of formula

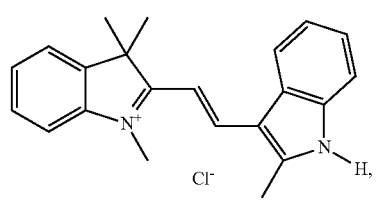

(Basic Orange 21), were added. The deep orange mixture was stirred at 45° C. for 8 h, cooled down to room temperature and filtered through a fluted filter to obtain a deep orange solution which was initially freed of entrained water by azeotropic distillation at atmospheric pressure and then adjusted to 23.0 g mass by addition of anhydrous ethyl acetate. The solution was 20.0% by weight in respect of the dye of formula

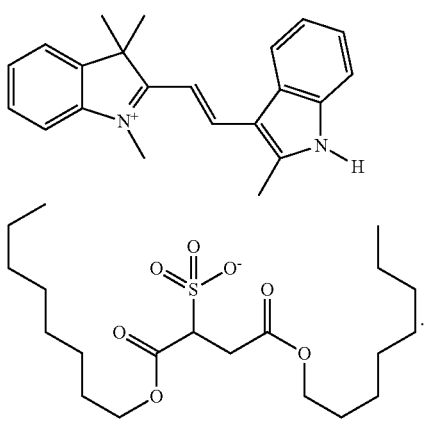

(99.5% of theory).
Water content (KF): 0.04%
$\lambda_{max}$ in methanol: 492 nm.
Suitable laser wavelength: 473 nm.

Example 12

3.33 g of dye of formula

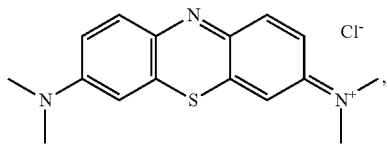

(methylene blue, obtained from Applichem in 2010, 90% purity), were dissolved in a mixture of 72 ml of water and 9 ml of methanol and filtered to remove a small amount of insolubles. In the absence of light, 14.36 g of a 20% by weight aqueous solution of lithium n-butyltriphenylborate (obtained from Hokko Chemical Ind., Japan, in 2009) were added dropwise under agitation. Stirring for 1 h was followed in the absence of light by filtration with suction, washing with 50 ml of water and drying at 50° C. under reduced pressure to obtain 4.73 g (86.4% of theory) of a blue powder of formula

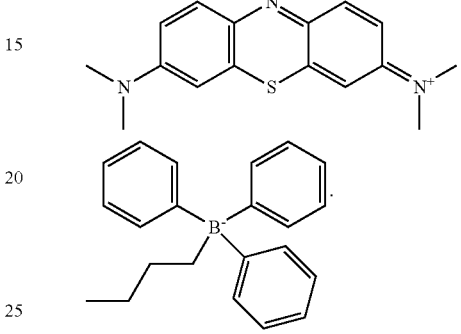

$\lambda_{max}$ in methanol: 653 nm, 612 (sh) nm.
Suitable laser wavelength: 633 nm.

The dyes in Table 2 hereinbelow are obtainable in a similar manner.

TABLE 2

Inventive dyes

| Example | F⁺ | An⁻ | Suitable laser wavelength (nm) |
|---|---|---|---|
| 13 | (indole-based cyanine dye with 2-phenyl group) | 4-alkylbenzenesulfonate | 473, 532 |
| 14 | (indole-based cyanine dye with 2-phenyl group) | bis(2-ethylhexyl) sulfosuccinate (isomer mixture) | 473, 532 |
| 15 | (styryl dye with N-methyl-N-(2-cyanoethyl)amino phenyl group) | bis(2-ethylhexyl) sulfosuccinate | 532 |

TABLE 2-continued

Inventive dyes

| Example | F⁺ | An⁻ | Suitable laser wavelength (nm) |
|---|---|---|---|
| 16 | (indolinium stilbene with N(CH₃)(CH₂CH₂CN) group) | tetraphenylborate | 532 |
| 17 | (indolinium stilbene with N(CH₃)(CH₂CH₂Cl) group) | bis(2-ethylhexyl) sulfosuccinate | 532 |
| 18 | (indolinium stilbene with N(CH₂CH₃)₂ group) | tetraphenylborate | 532 |

TABLE 2-continued
Inventive dyes
| Example | F+ | An− | Suitable laser wavelength (nm) |
|---|---|---|---|
| 19 | 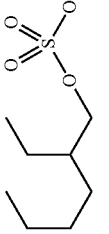 | 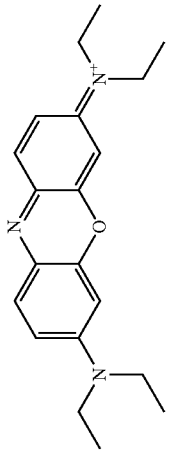 | 633 |
| 20 | 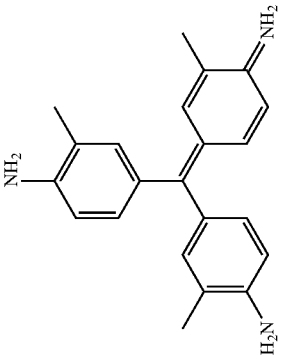 | 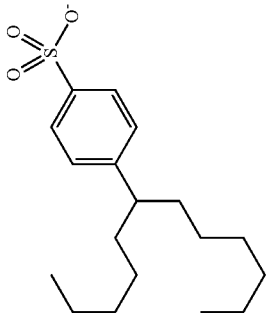 isomer mixture | 633 |
| 21 | 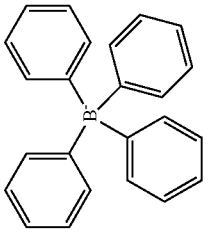 | 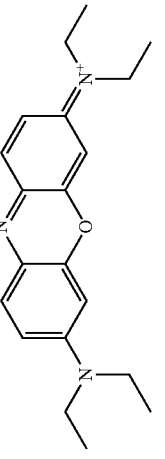 | 532 |

TABLE 2-continued

Inventive dyes

| Example | F+ | An− | Suitable laser wavelength (nm) |
|---|---|---|---|
| 22 | (triarylmethane dye with two NH2 and methyl groups) | tetraphenylborate | 532 |
| 23 | (triarylmethane dye with dimethylamino groups) | 4-alkylbenzenesulfonate (isomer mixture) | 532 |
| 25 | (phenothiazine dye, methylene blue type) | alkyl sulfate | 633 |
| 27 | (phenothiazine dye with ethylamino and methyl groups) | alkyl sulfate | 633 |

TABLE 2-continued

Inventive dyes

| Example | F+ | An− | Suitable laser wavelength (nm) |
|---|---|---|---|
| 29 | | | 532 |
| 32 | | | 532 |
| 34 | | | 532 |
| 35 | | | 532 |

TABLE 2-continued

Inventive dyes

| Example | F+ | An− | Suitable laser wavelength (nm) |
|---|---|---|---|
| 37 | (phenazine with CH3, NH2 groups, N-phenyl) | sulfonate-alkenyl-isopropyl ester | 532 |
| 38 | (phenazine with CH3, NH2 groups, N-phenyl) | tetrakis(4-fluorophenyl)borate with hexyl | 532 |
| 39 | (indole-cyanine dye) | alkyl-substituted benzenesulfonate (isomer mixture) | 473 |

TABLE 2-continued

Inventive dyes

| Example | F⁺ | An⁻ | Suitable laser wavelength (nm) |
|---|---|---|---|
| 40 | (2,3,3-trimethyl-1-methyl-3H-indolium with vinyl-2-methylindole substituent) | bis(2-ethylhexyl) sulfosuccinate | 473 |
| 41 | (same cation) | dodecyl sulfate | 473 |
| 42 | (same cation) | secondary alkyl sulfonate, isomer mixture | 473 |

TABLE 2-continued

Inventive dyes

| Example | F+ | An− | Suitable laser wavelength (nm) |
|---|---|---|---|
| 43 | | | 473 |
| 44 | | isomer mixture | 473 |
| 45 | | | 633 |
| 46 | | | 633 |

TABLE 2-continued

Inventive dyes

| Example | F+ | An− | Suitable laser wavelength (nm) |
|---|---|---|---|
| 47 | (structure) | (sulfonate with alkyl chains) | 473 |
| 48 | (structure) | tetraphenylborate, isomer mixture | 473 |
| 49 | (structure) | (alkylbenzenesulfonate), isomer mixture | 473 |

TABLE 2-continued
Inventive dyes
| Example | F+ | An− | Suitable laser wavelength (nm) |
|---|---|---|---|
| 50 | 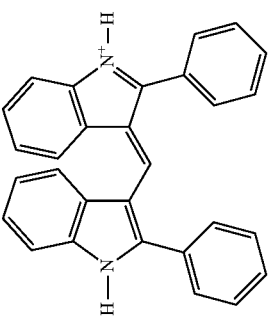 | 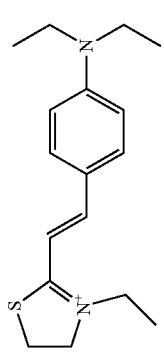 | 473 |
| 51 | 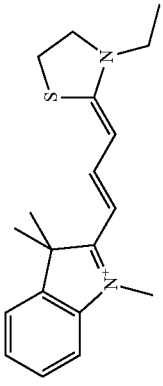 | 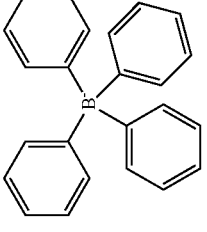 | 473 |
| 52 | 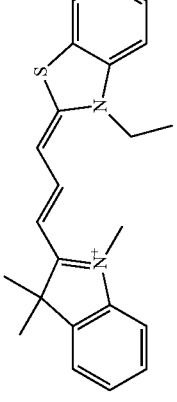 | 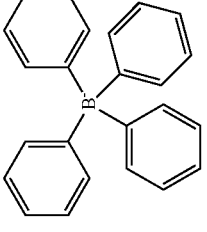 | 473 |
| 54 | 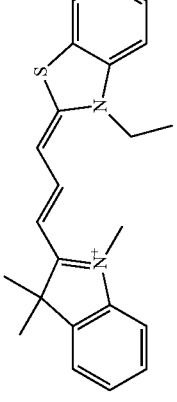 | | 532 |

TABLE 2-continued

Inventive dyes

| Example | F+ | An− | Suitable laser wavelength (nm) |
|---|---|---|---|
| 55 | benzothiazole-ethyl / trimethylindolinium vinyl dye | tetraphenylborate | 532 |
| 56 | diphenylamino-styryl-dimethylindolinium dye | bis(2-ethylhexyl) sulfosuccinate | 532 |
| 57 | morpholino-thiazole / diethylamino-phenyl methylidene dye | 4-(alkyl)benzenesulfonate (isomer mixture) | 532 |

TABLE 2-continued
Inventive dyes
| Example | F+ | An− | Suitable laser wavelength (nm) |
|---|---|---|---|
| 58 | 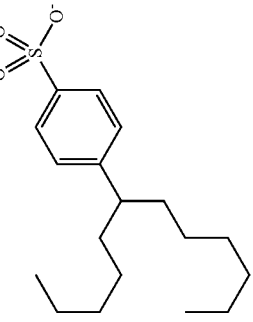 | 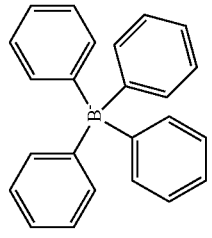 | 633 |
| 59 | 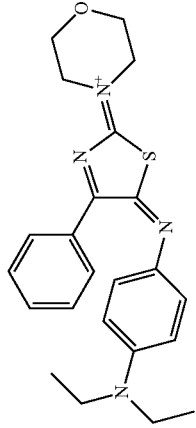 | 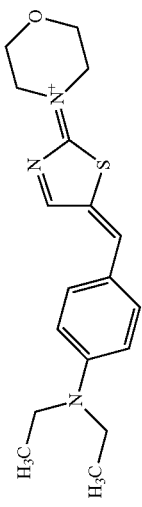 isomer mixture | 532 |
| 60 | 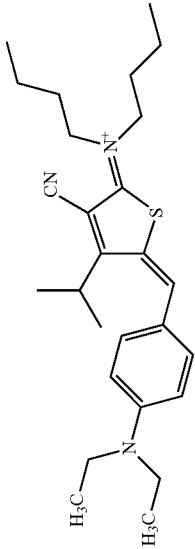 | 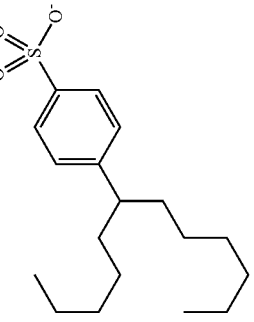 isomer mixture | 532 |

TABLE 2-continued

Inventive dyes

| Example | F+ | An− | Suitable laser wavelength (nm) |
|---|---|---|---|
| 61 | | | 633 |
| 62 | | | 532 |
| 63 | | | 532 |

TABLE 2-continued

Inventive dyes

| Example | F+ | An− | Suitable laser wavelength (nm) |
|---|---|---|---|
| 64 | (structure) | (structure) | 532 |
| 65 | (structure) | (structure) | 532 |
| 67 | (structure) | (structure) isomer mixture | 633 |

TABLE 2-continued
Inventive dyes
| Example | F+ | An− | Suitable laser wavelength (nm) |
|---|---|---|---|
| 68 | 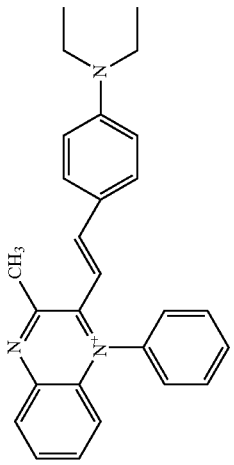 | 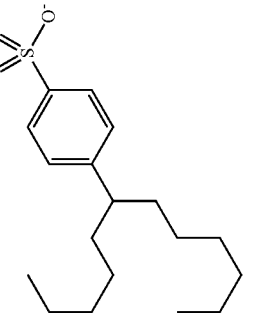 | 633 |
| 69 | 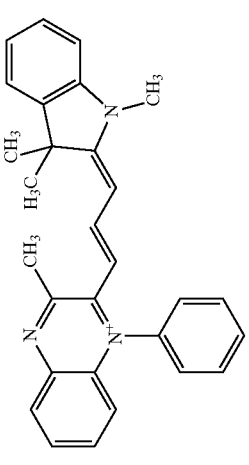 | 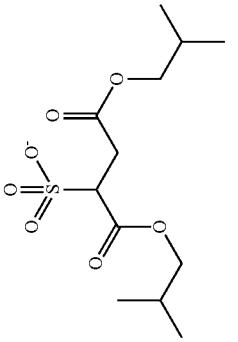 isomer mixture | 633 |
| 71 | 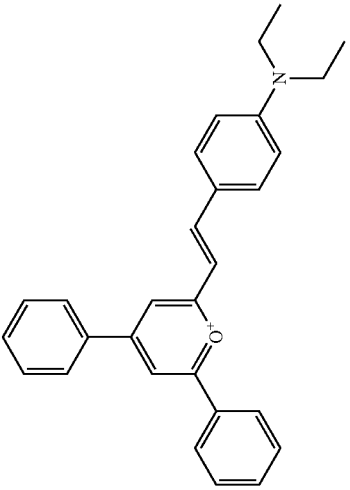 | 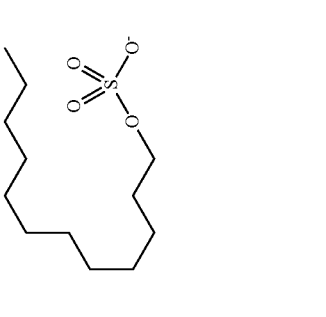 | 633 |

TABLE 2-continued

Inventive dyes

| Example | F⁺ | An⁻ | Suitable laser wavelength (nm) |
|---|---|---|---|
| 72 | (structure) | (structure) | 633 |
| 73 | (structure) | (structure) | 473 |
| 74 | (structure) | | 473 |

TABLE 2-continued

Inventive dyes

| Example | F⁺ | An⁻ | Suitable laser wavelength (nm) |
|---|---|---|---|
| 76 | | | 532 |
| 78 | | | 532 |
| 79 | | | 532 |

TABLE 2-continued

Inventive dyes

| Example | F+ | An− | Suitable laser wavelength (nm) |
|---|---|---|---|
| 81 | (structure) | (structure) | 633 |
| 82 | (structure) | isomer mixture | 633 |
| 83 | (structure) | (structure) | 633 |

TABLE 2-continued
Inventive dyes
| Example | F+ | An− | Suitable laser wavelength (nm) |
|---|---|---|---|
| 85 | 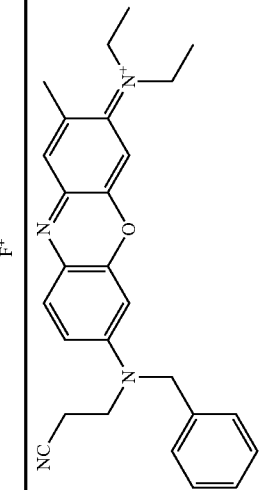 | 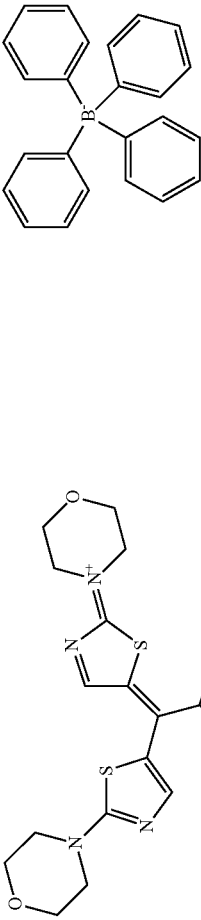 | 633 |
| 86 | | | 633 |

TABLE 2-continued

Inventive dyes

| Example | F+ | An− | Suitable laser wavelength (nm) |
|---|---|---|---|
| 87 | (morpholinium-thiophene-phenyl-thiophene-morpholine structure) | perfluoroalkyl sulfonate | 633 |
| 88 | poly(4-vinylpyridinium-stilbene-N-ethyl-N-phenylamine) | dicyclohexyl sulfosuccinate | 473 |
| 89 | thionine-type diaminophenothiazinium (5:1) | bis(2-ethylhexyl) sulfosuccinate | 633 |

TABLE 2-continued

Inventive dyes

| Example | F⁺ | An⁻ | Suitable laser wavelength (nm) |
|---|---|---|---|
| 90 | (structure) | (4-alkylphenylsulfonate structure) | 532 |
| 91 | (structure) | (alkylsulfonate, isomer mixture) | 532 |
| 94 | (structure) | (sulfonate ester, isomer mixture) | 532 |

TABLE 2-continued

Inventive dyes

| Example | F+ | An− | Suitable laser wavelength (nm) |
|---|---|---|---|
| 96 | (thiazole-morpholine dye structure) | tetraphenylborate | 532 |
| 97 | (oxazine/phenoxazine diethylamino dye structure) | dodecyl sulfate | 633 |
| 98 | (indolium cyanine dye structure) | 2-ethylhexyl sulfate (branched alkyl sulfate) | 532 |
| 99 | (styryl pyrrolinium dye with p-diethylaminophenyl group) | tetraphenylborate | 473 |

TABLE 2-continued

Inventive dyes

| Example | F⁺ | An⁻ | Suitable laser wavelength (nm) |
|---|---|---|---|
| 100 | | | 473 |
| 101 | | | 473 |
| 102 | | | 473 |
| 103 | | | 473 |

TABLE 2-continued

Inventive dyes

| Example | F+ | An− | Suitable laser wavelength (nm) |
|---|---|---|---|
| 104 | (1-methyl-3-phenyl-indol-2-yl azo)-3-methylthiazolium cation | tetraphenylborate | 523 |
| 106 | 2-(4-dimethylaminophenyl)-3-methylbenzothiazolium cation | perfluoroalkyl sulfonate | 473 |
| 107 | 2-{4-[N-(2-hydroxyethyl)-N-methylamino]phenyl}-6-chloro-1-ethyl-benz[cd]indolium cation | bis(2-ethylhexyl) sulfosuccinate | 532 |

TABLE 2-continued
Inventive dyes
| Example | F+ | An− | Suitable laser wavelength (nm) |
|---|---|---|---|
| 108 | 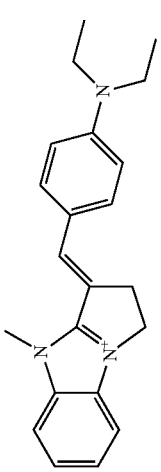 | 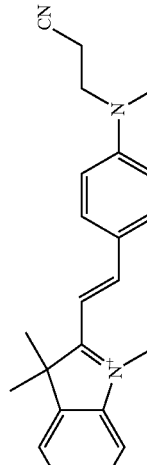 | 473 |
| 109 | 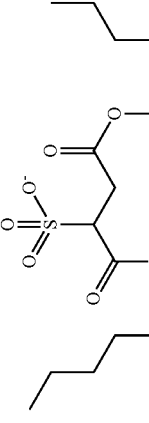 | 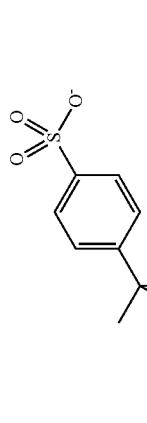 | 473 |
| 110 | 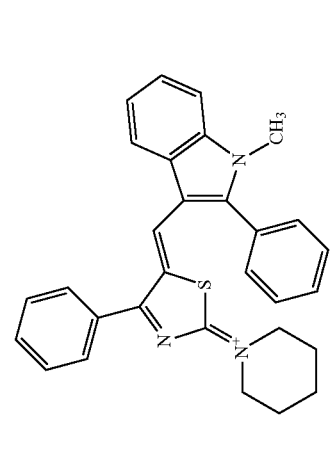 | 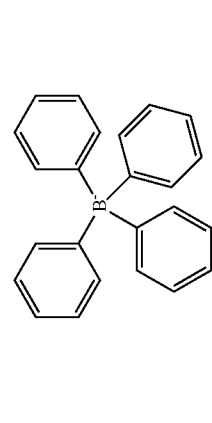 | 473 |

TABLE 2-continued

Inventive dyes

| Example | F⁺ | An⁻ | Suitable laser wavelength (nm) |
|---|---|---|---|
| 111 | (structure) | tetraphenylborate | 473 |
| 112 | (structure) | bis(2-ethylhexyl) sulfosuccinate | 532 |
| 113 | (structure) | tetra(imidazolyl)borate | 532 |

Table 3 summarizes the observed water imbibitions W for selected examples.

TABLE 3

Water imbibition of selected examples

| Example | F+ | An− | W [%] |
|---|---|---|---|
| 1 | (phenazine dye structure) | (branched alkylbenzenesulfonate, isomer mixture) | 2.7 |
| 14 | (indolinium styryl dye structure) | (bis(2-ethylhexyl) sulfosuccinate) | 0.03 |
| 25 | (methylene blue / phenothiazine dye structure) | (alkyl sulfate) | 0.1 |
| 30 | (phenazine dye structure) | (bis(2-ethylhexyl) sulfosuccinate) | 1.9 |
| 39 | (indolinium styryl dye structure) | (branched alkylbenzenesulfonate, isomer mixture) | 1.6 |

TABLE 3-continued

Water imbibition of selected examples

| Example | F+ | An− | W [%] |
|---|---|---|---|
| 41 | (indolenine-vinyl-indole cation structure) | (dodecyl sulfate structure) | 0.49 |
| 46 | (methylene blue cation structure) | (2-ethylhexyl sulfate structure) | 2.3 |

Comparative Examples V 1-2 are the commercial dyes Safranin O/T and methylene blue. Comparative Example V 3 is Basic Orange 21, prepared by a method from H. Berneth in Ullmann's Encyclopedia of Industrial Chemistry, Methine Dyes and Pigments, Wiley-VCH Verlag, 2008. V-4 was obtained from methylene blue and lithium perchlorate as described hereinbelow. Table 4 summarizes the observed water imbibitions W of Comparative Examples V 1-4.

TABLE 4

Water imbibition of selected comparative examples

| Comparative Example | F+ | An− | W [%] |
|---|---|---|---|
| V-1 | (phenazine diamine structure with phenyl) | Cl− | 14.8 |
| V-2 | (methylene blue structure) | Cl− | 20.9 |
| V-3 | (indolenine-vinyl-indole cation structure) | Cl− | 9.5 |
| V-4 | (methylene blue structure) | ClO4− | 6.2 |

Preparation of Comparative Example V4

5.55 g of methylene blue hydrate (90 percent pure, obtained from Fluka in 2010) were partially dissolved in 90 ml of water. To this partial solution, a solution of 1.66 g of lithium perchlorate (obtained from Acros in 2009) in 15 ml of water was added dropwise at room temperature during 1 h under efficient agitation. This was followed by stirring for 3 h, filtration with suction and washing with 2×25 ml of water. Drying at 50° C. under reduced pressure left 5.97 g (99.5%) of a blue powder of formula

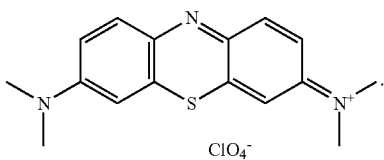

ClO4−

Preparing the Components

Preparation of Polyol 1

In a 1 L flask, 0.18 g of tin octoate, 374.8 g of ε-caprolactone and 374.8 g of a difunctional polytetrahydrofuran polyetherpolyol (equivalent weight 500 g/mol of OH) were initially charged and heated up to 120° C. and maintained at that temperature until the solids content (proportion of nonvolatile constituents) was 99.5% by weight or higher. This was followed by cooling to obtain the product as a waxy solid.

Preparation of acrylate 1 (phosphorus thioyltris(oxy-4,1-phenyleneiminocarbonyl-oxyethane-2,1-diyl) triacrylate)

In a 500 mL round-bottom flask, 0.1 g of 2,6-di-tert-butyl-4-methylphenol, 0.05 g of dibutyltin dilaurate (Desmorapid® Z, Bayer MaterialScience AG, Leverkusen, Germany) and also and 213.07 g of a 27% solution of tris(p-isocyanatophenyl)thiophosphate in ethyl acetate (Desmodur® RFE, product from Bayer MaterialScience AG, Leverkusen, Germany) were initially charged and heated to 60° C. Thereafter, 42.37 g of 2-hydroxyethyl acrylate were added dropwise and the mixture was further maintained at 60° C. until the isocyanate content had dropped below 0.1%. This was followed by cooling and complete removal of the ethyl acetate under reduced pressure to obtain the product as a partly crystalline solid.

Preparation of acrylate 2 2-({[3-(methylsulphanyl) phenyl]carbamoyl}oxy)ethyl prop-2-enoate)

In a 100 mL round-bottom flask, 0.02 g of 2,6-di-tert-butyl-4-methylphenol, 0.01 g of Desmorapid® Z, 11.7 g of 3-(methylthio)phenyl isocyanate were initially charged and heated to 60° C. Thereafter, 8.2 g of 2-hydroxyethyl acrylate were added dropwise and the mixture was further maintained at 60° C. until the isocyanate content had dropped below 0.1%. This was followed by cooling to obtain the product as a pale yellow liquid.

Preparation of additive 1:
(Bis(2,2,3,3,4,4,5,5,6,6,7,7-dodecafluoroheptyl) 2,2,4-trimethylhexane-1,6-diyl biscarbamate)

In a round-bottom flask, 0.02 g of Desmorapid Z and 3.6 g of 2,4,4-trimethylhexanes 1,6-diisocyanate were initially charged and heated to 70° C. This was followed by the dropwise addition of 11.39 g of 2,2,3,3,4,4,5,5,6,6,7,7-dodecafluoroheptan-1-ol and the mixture was further maintained at 70° C. until the isocyanate content had dropped below 0.1%. This was followed by cooling to obtain the product as a colourless oil.

Preparation of Formulations to Determine Modulus Build-Up and Plateau Modulus $G_0$ Example Formulation 1

2.00 g of acrylate 1, 2.00 g of acrylate 2, 1.50 g of additive 1 were mixed with 3.465 g of polyol 1 and a solution of 0.026 g of dye from Example 25 in 0.512 g of N-ethylpyrrolidone in a Speedmixer for 5 minutes to obtain a homogeneous solution. The polyol solution described above was then admixed with 0.667 g of Desmodur® N 3900 (product from Bayer MaterialScience AG, Leverkusen, Germany) by mixing in a Speedmixer for a further minute. This is followed by the addition of 0.01 gram of a 10% by weight solution of Fomrez UL 28 (urethanization catalyst, commercial product of Momentive Performance Chemicals, Wilton, Conn., USA) in N-ethylpyrrolidone, again followed by mixing in a Speedmixer for one minute. The liquid mass obtained was introduced into the plate-plate measuring system of the oscillation rheometer.

Comparative Formulation 1

2.00 g of acrylate 1, 2.00 g of acrylate 2, 1.50 g of additive 1 were mixed with 3.471 g of polyol 1 and a solution of 0.015 g of dye from Comparative Example V-2 in 0.512 g of N-ethylpyrrolidone in a Speedmixer for 5 minutes to obtain a homogeneous solution. The polyol solution described above was then admixed with 0.668 g of Desmodur® N 3900 (product from Bayer MaterialScience AG, Leverkusen, Germany) by mixing in a Speedmixer for a further minute. This is followed by the addition of 0.01 gram of a 10% by weight solution of Fomrez UL 28 (urethanization catalyst, commercial product of Momentive Performance Chemicals, Wilton, Conn., USA) in N-ethylpyrrolidone, again followed by mixing in a Speedmixer for one minute. The liquid mass obtained was introduced into the plate-plate measuring system of the oscillation rheometer.

Example Formulation 2

2.00 g of acrylate 1, 2.00 g of acrylate 2, 1.50 g of additive 1 were mixed with 3.465 g of polyol 1 and a solution of 0.026 g of dye from Example 41 in 0.512 g of N-ethylpyrrolidone in a Speedmixer for 5 minutes to obtain a homogeneous solution. The polyol solution described above was then admixed with 0.667 g of Desmodur® N 3900 (product from Bayer MaterialScience AG, Leverkusen, Germany) by mixing in a Speedmixer for a further minute. This is followed by the addition of 0.01 gram of a 10% by weight solution of Fomrez UL 28 (urethanization catalyst, commercial product of Momentive Performance Chemicals, Wilton, Conn., USA) in N-ethylpyrrolidone, again followed by mixing in a Speedmixer for one minute. The liquid mass obtained was introduced into the plate-plate measuring system of the oscillation rheometer.

Comparative Formulation 2

2.00 g of acrylate 1, 2.00 g of acrylate 2, 1.50 g of additive 1 were mixed with 3.471 g of polyol 1 and a solution of 0.015 g of dye from Comparative Example V-3 in 0.512 g of N-ethylpyrrolidone in a Speedmixer for 5 minutes to obtain a homogeneous solution. The polyol solution described above was then admixed with 0.668 g of Desmodur® N 3900 (product from Bayer MaterialScience AG, Leverkusen, Germany) by mixing in a Speedmixer for a further minute. This is followed by the addition of 0.01 gram of a 10% by weight solution of Fomrez UL 28 (urethanization catalyst, commercial product of Momentive Performance Chemicals, Wilton, Conn., USA) in N-ethylpyrrolidone, again followed by mixing in a Speedmixer for one minute. The liquid mass obtained was introduced into the plate-plate measuring system of the oscillation rheometer.

Example Formulation 3

2.00 g of acrylate 1, 2.00 g of acrylate 2, 1.50 g of additive 1 were mixed with 3.465 g of polyol 1, 0.512 g of N-ethylpyrrolidone and 0.125 g of a 20.7 (% by weight) solution of dye from Example 30 in butyl acetate and 2-butanone (80% by weight of butyle acetate, 20% by weight of 2-butanone) in a Speedmixer for 5 minutes to obtain a homogeneous solution. The polyol solution described above was then admixed with 0.667 g of Desmodur® N 3900 (product from Bayer MaterialScience AG, Leverkusen, Germany) by mixing in a Speedmixer for a further minute. This is followed by the addition of 0.01 gram of a 10% by weight solution of Fomrez UL 28 (urethanization catalyst, commercial product of Momentive Performance Chemicals, Wilton, Conn., USA) in N-ethylpyrrolidone, again followed by mixing in a Speedmixer for one minute. The liquid mass obtained was introduced into the plate-plate measuring system of the oscillation rheometer.

Comparative Formulation 3

2.00 g of acrylate 1, 2.00 g of acrylate 2, 1.50 g of additive 1 were mixed with 3.471 g of polyol 1 and a solution of 0.015 g of dye from Comparative Example V-1 in 0.512 g of N-ethylpyrrolidone in a Speedmixer for 5 minutes to obtain a homogeneous solution. The polyol solution described above was then admixed with 0.668 g of Desmodur® N 3900 (product from Bayer MaterialScience AG, Leverkusen, Germany) by mixing in a Speedmixer for a further minute. This is followed by the addition of 0.01 gram of a 10% by weight solution of Fomrez UL 28 (urethanization catalyst, commercial product of Momentive Performance Chemicals, Wilton, Conn., USA) in N-ethylpyrrolidone, again followed by mixing in a Speedmixer for one minute. The liquid mass obtained was introduced into the plate-plate measuring system of the oscillation rheometer.

Example Formulation 4

2.00 g of acrylate 1, 2.00 g of acrylate 2, 1.50 g of additive 1 were mixed with 3.465 g of polyol 1 and 0.125 g of a 20.7 (% by weight) solution of dye from Example 30 in butyl acetate and 2-butanone (80% by weight of butyl acetate, 20% by weight of 2-butanone) in a Speedmixer for 5 minutes to obtain a homogeneous solution. The polyol solution described above was then admixed with 0.667 g of Desmodur® N 3900 (product from Bayer MaterialScience AG, Leverkusen, Germany) by mixing in a Speedmixer for a further minute. This is followed by the addition of 0.01 gram of a 10% by weight solution of Fomrez UL 28 (urethanization catalyst, commercial product of Momentive Performance Chemicals, Wilton, Conn., USA) in N-ethylpyrrolidone, again followed by mixing in a Speedmixer for one minute. The liquid mass obtained was introduced into the plate-plate measuring system of the oscillation rheometer.

Plateau Modulus $G_0$ and Modulus Build-Up:

The formulations obtained as described were subsequently tested for their rheological properties in the manner described above. The following measurements were obtained for the plateau modulus $G_0$:

TABLE 5

Plateau modulus $G_0$ of selected examples

| Formulation | Plateau modulus $G_0$ (Pa) | Temperature (° C.) |
|---|---|---|
| Example formulation 1 | 430 000 | 80 |
| Comparative formulation 1 | 400 000 | 80 |
| Example formulation 2 | 357 000 | 80 |
| Comparative formulation 2 | 336 000 | 80 |
| Example formulation 3 | 372 000 | 80 |
| Comparative formulation 3 | 303 000 | 80 |
| Example formulation 4 | 480 000 | 80 |

The example formulations recited in Table 5 prove that their plateau modulus is always greater than that of the corresponding comparative formulation. Therefore, the dyes which are selected according to the present invention provide better polymer matrix crosslinking than the dyes with high water imbibition. Incomplete crosslinking of matrix polymer has an adverse effect on the stability of holograms recorded therein.

Figure 4:
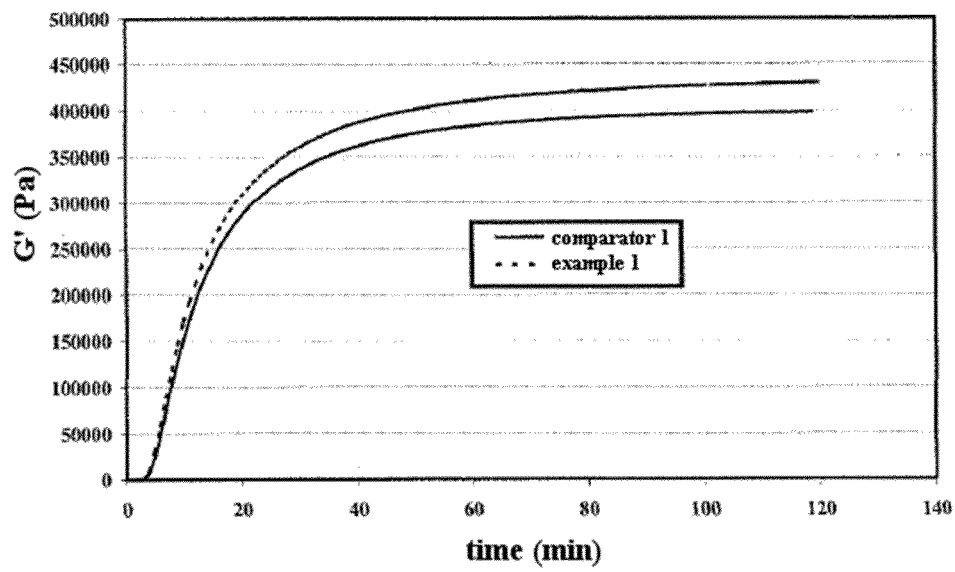
FIG. 4 shows the comparison of modulus build-up over the curing time between Example Formulation 1 and Comparative Formulation 1.
Figure 5:
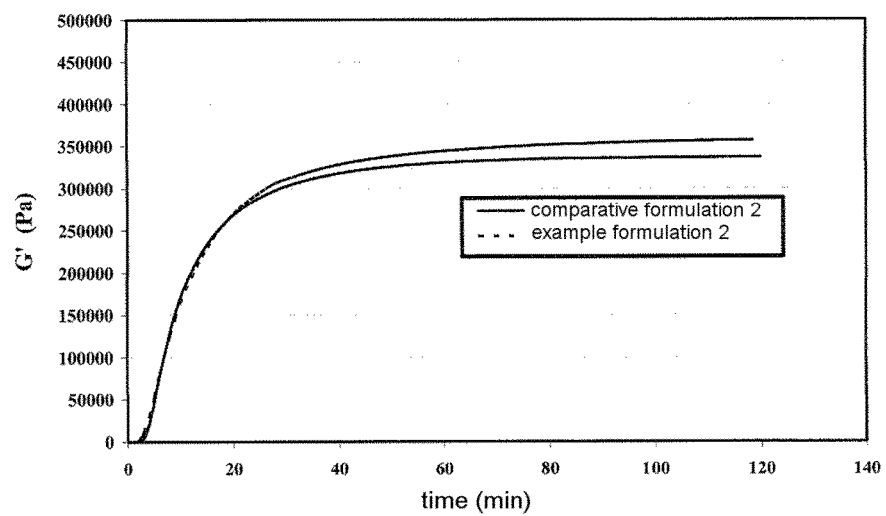
FIG. 5 shows the comparison of modulus build-up over the curing time between Example Formulation 2 and Comparative Formulation 2.
Figure 6:
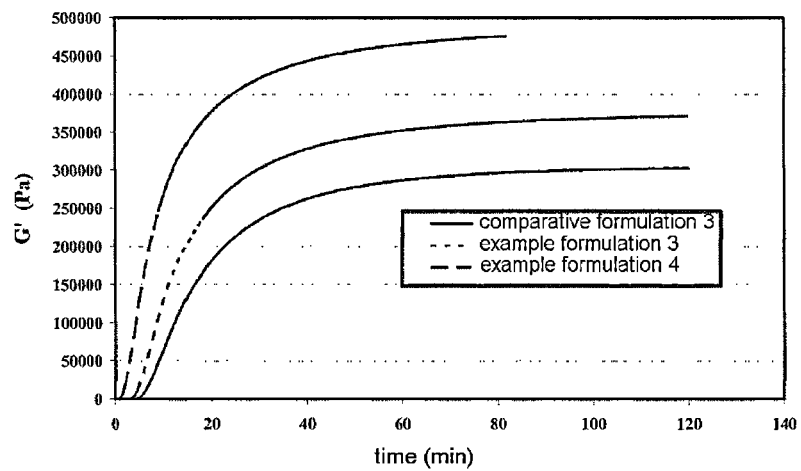
FIG. 6 shows the comparison of modulus build-up over the curing time between Example Formulation 3 and Comparative Formulation 3 and Example Formulation 4.

FIG. 4 shows the comparison of modulus build-up over the curing time between Example Formulation 1 and Comparative Formulation 1. FIG. 5 shows the comparison of modulus build-up over the curing time between Example Formulation 2 and Comparative Formulation 2. FIG. 6 shows the comparison of modulus build-up over the curing time between Example Formulation 3 and Comparative Formulation 3 and Example Formulation 4. It is evident that the example formulations generally exhibit a faster modulus build-up than the corresponding comparative formulations, i.e. reach a higher storage modulus G' after a fixed curing time. This is for example advantageous for more efficient coating of substrate foils with the photopolymer formulations for producing holographic films, since the photopolymer formulations of the present invention make it possible to realize shorter curing times to reach block resistance (i.e. the photopolymer formulation is mechanically so stable on reaching block resistance that the coated media can be further processed, generally wound up in a continuous roll-to-roll process). The photopolymer formulations of the present invention also make it possible to dispense with N-ethylpyrrolidone, thereby providing a further increase in the plateau modulus and its rise over the curing time, as evidenced by Example Formulation 4.

Producing the Media to Determine the Holographic Properties

Example Medium 1

3.38 g of polyol component 1 were mixed with 2.00 g of acrylate 1, 2.00 g of acrylate 1, 1.50 g of additive 1, 0.10 g of CGI 909 (product from BASF SE, Basle, Switzerland), 0.017 g of dye from Example 25 and 0.35 g of N-ethylpyrrolidone at 60° C. to obtain a clear solution. The solution was then cooled down to 30° C., 0.65 g of Desmodur® N3900 (commercial product from Bayer MaterialScience AG, Leverkusen, Germany, hexane diisocyanate-based polyisocyanate, portion on iminooxadiazinedione at least 30%, NCO content: 23.5%) was added before renewed mixing. Finally, 0.01 g of Fomrez UL 28 (urethanization catalyst, commercial product of Momentive Performance Chemicals, Wilton, Conn., USA) was added and again briefly mixed in. The liquid mass obtained was then applied to a glass plate and covered thereon with a second glass plate. This sample specimen was left to lie at room temperature for 12 hours for curing.

Example Medium 2

3.38 g of polyol component 1 were mixed with 2.00 g of acrylate 1, 2.00 g of acrylate 1, 1.50 g of additive 1, a mixture of a 30% by weight solution of 0.10 g of CGI 909 (product from BASF SE, Basle, Switzerland) in ethyl acetate and 0.103 g of the 9.68% by weight dye solution from Example 9 were mixed at 60° C. to obtain a clear solution. The solution was then cooled down to 30° C., 0.65 g of Desmodur® N3900 (commercial product from Bayer MaterialScience AG, Leverkusen, Germany, hexane diisocyanate-based polyisocyanate, portion on iminooxadiazinedione at least 30%, NCO content: 23.5%) was added before renewed mixing. Finally, 0.01 g of Fomrez UL 28 (urethanization catalyst, commercial product of Momentive Performance Chemicals, Wilton, Conn., USA) was added and again briefly mixed in. The liquid mass obtained was then applied to a glass plate and covered thereon with a second glass plate. This sample specimen was left to lie at room temperature for 12 hours for curing.

Example Medium 3

Example Medium 1 was repeated except that 0.01 g of the dye from Example 13 instead of 0.017 g of dye from Example 25 was used.

Example Medium 4

Example Medium 1 was repeated except that 0.01 g of the dye from Example 31 instead of 0.017 g of dye from Example 25 was used.

Comparative Medium 1

3.38 g of polyol component 1 were mixed with 2.00 g of acrylate 1, 2.00 g of acrylate 1, 1.50 g of additive 1, 0.10 g of CGI 909 (product from BASF SE, Basle, Switzerland), 0.010 g of dye from Comparative Example V-2 and 0.35 g of N-ethylpyrrolidone at 60° C. to obtain a clear solution. The solution was then cooled down to 30° C., 0.65 g of Desmodur® N3900 (commercial product from Bayer MaterialScience AG, Leverkusen, Germany, hexane diisocyanate-based polyisocyanate, portion on iminooxadiazinedione at least 30%, NCO content: 23.5%) was added before renewed mixing. Finally, 0.01 g of Fomrez UL 28 (urethanization catalyst, commercial product of Momentive Performance Chemicals, Wilton, Conn., USA) was added and again briefly mixed in. The liquid mass obtained was then applied to a glass plate and covered thereon with a second glass plate. This sample specimen was left to lie at room temperature for 12 hours for curing.

Holographic Testing:

The media obtained as described were subsequently tested for their holographic properties in the manner described above using a measuring arrangement as per FIG. 1. The following measurements were obtained for $\Delta n_{sat}$ at dose E [mJ/cm$^2$]:

TABLE 6

Holographic assessment of selected examples

| Dye Example | Medium | Wavelength [nm] | DE | $\Delta n_{sat}$ | Dose E [mJ/cm$^2$] |
|---|---|---|---|---|---|
| 25 | 1 | 633 | 0.98 | 0.033 | 9 |
| 9 | 2 | 633 | 0.98 | 0.035 | 36 |
| 13 | 3 | 473 | 0.99 | 0.036 | 48 |
| 31 | 4 | 532 | 0.98 | 0.033 | 8 |

The values found show that the inventive dyes used in photopolymer formulations are very useful in holographic media owing to the high value of $\Delta n_{sat}$, provide a more rapid modulus build-up in curing the matrix network and using them a higher plateau modulus $G_0$ and hence more complete crosslinking of matrix polymer is achieved.

Moreover, the photopolymer formulations of the present invention also show higher photosensitivity in the holographic medium. As shown by FIG. 7, which plots the Δn achieved versus the exposure dose E, holographic writing ensues in Example Medium 1 at lower doses E than in Comparative Medium 1.

In a manner similar to Example Media 1-4, the inventive dyes of Examples 1-8, 10-12, 14-24, 26-30 and 32-106 make it possible to obtain holographic media having comparable holographic data.

The invention claimed is:

1. A photopolymer formulation comprising a polyol component, a polyisocyanate component, a writing monomer and a photoinitiator containing a coinitiator and a dye of formula F$^+$An$^-$, where
F$^+$ represents a cationic phenothiazine dye, and
An$^-$ represents an anion,
wherein the dye of formula F$^+$An$^-$ has a water imbibition of ≤5%, and wherein the anion An– has an AClogP in the range of 1-6.5.

2. The photopolymer formulation according to claim 1, wherein the dye has a water imbibition of ≤3%.

3. The photopolymer formulation according to claim 1, wherein the dye has a water imbibition of ≤2%.

4. The photopolymer formulation according to claim 1, wherein the anion An– has a molar mass >150 g/mol.

5. The photopolymer formulation according to claim 1, wherein the anion An– has an AClogP in the range of 1-4 and the anion An– has a molar mass >250 g/mol.

6. The photopolymer formulation according to claim 1, wherein the anion An– comprises at least a phosphorus, boron or sulphur atom.

7. The photopolymer formulation according to claim 1, wherein the anion An– has one or more than one linear or branched aliphatic moiety or when it has more than one linear or branched aliphatic moiety, these together have 8 to 36 carbon atoms.

8. The photopolymer formulation according to claim 1, wherein the anion An– is selected from the group C8- to C25-alkanesulphonate, C3- to C18-perfluoroalkanesulphonate, C9- to C25-alkanoate, C9- to C25-alkenoate, C8- to C25-alkyl sulphate, C8- to C25-alkenyl sulphate, preferably C13- to C25-alkenyl sulphate, C3- to C18-perfluoroalkyl sulphate, polyether sulphates based on 4 or more equivalents of ethylene oxide and/or propylene oxide, bis-C4- to C25-alkyl, C5- to C7-cycloalkyl, C3- to C8-alkenyl or C7- to C11-aralkyl sulphosuccinate, bis-C2- to C10-alkyl sulphosuccinate substituted by 8 or more fluorine atoms, C8- to C25-alkyl sulphoacetates, benzenesulphonate substituted by at least one moiety from the group halogen, C4- to C25-alkyl, perfluoro-C1- to C8-alkyl and/or C1- to C12-alkoxycarbonyl, optionally nitro-, cyano-, hydroxyl-, C1- to C25-alkyl-, C1- to C12-alkoxy-, amino-, C1- to C12-alkoxycarbonyl- or chlorine-substituted naphthalene- or biphenylsulphonate, optionally nitro-, cyano-, hydroxyl-, C1- to C25-alkyl-, C1- to C12-alkoxy-, C1- to C12-alkoxycarbonyl- or chlorine-substituted benzene-, naphthalene- or biphenyldisulphonate, dinitro-, C6- to C25-alkyl-, C4- to C12-alkoxycarbonyl-, benzoyl-, chlorobenzoyl- or toluoyl-substituted benzoate, the anion of naphthalenedicarboxylic acid, diphenyl ether disulphonate, sulphonated or sulphated, optionally mono- or polyunsaturated C8- to C25-fatty acid esters of aliphatic C1- to C8-alcohols or glycerol, bis(sulpho-C2- to C6-alkyl) C3- to C12-alkanedicarboxylic esters, bis(sulpho-C2- to C6-alkyl) itaconic acid esters, (sulpho-C2- to C6-alkyl) C6- to C18-alkanecarboxylic esters, (sulpho-C2- to C6-alkyl) acrylic or methacrylic acid esters, triscatechol phosphate optionally substituted by up to 12 halogen moieties, an anion from the group tetraphenyl borate, cyanotriphenyl borate, tetraphenoxyborate, C4- to C12-alkyltriphenyl borate, the phenyl or phenoxy moieties of which may be halogen, C1- to C4-alkyl and/or C1- to C4-alkoxy substituted, C4- to C12-alkyltrinaphthyl borate, tetra-C1- to C20-alkoxyborate, 7,8- or 7,9-dicarbanidoundecaborate(1-) or (2-), which optionally bear on the B and/or C atoms one or two C1- to C12-alkyl or phenyl substituents, dodecahydrodicarbadodecaborate(2-) or B—C1- to C12-alkyl-C-phenyldodecahydrodicarbadodecaborate(1-), where An– in multivalent anions and represents one equivalent of this anion, and where the alkane and alkyl groups may be branched and/or may be halogen, cyano, methoxy, ethoxy, methoxycarbonyl or ethoxycarbonyl substituted.

9. The photopolymer formulation according to claim 8, where An– is naphthalenedisulphonate.

10. The photopolymer formulation according to claim 1, wherein the anion An– is sec-C11- to C18-alkanesulphonate, C13- to C25-alkyl sulphate, branched C8- to C25-alkyl sulphate, optionally branched bis-C6- to C25-alkyl sulphosuccinate, sec- or tert-C4- to C25-alkylbenzenesulphonate, sulphonated or sulphated, optionally mono- or polyunsaturated C8- to C25-fatty acid esters of aliphatic C1- to C8-alcohols or glycerol, bis(sulpho-C2- to C6-alkyl) C3- to C12-alkanedicarboxylic esters, (sulpho-C2- to C6-alkyl) C6- to C18-alkanecarboxylic esters, triscatechol phosphate substituted by up to 12 halogen moieties, cyanotriphenyl borate, or tetraphenoxyborate.

11. The photopolymer formulation according to claim 1, wherein the polyisocyanate component is an aliphatic polyisocyanate or a prepolymer with primary NCO groups.

12. The photopolymer formulation according to claim 1, wherein the polyol component is a difunctional polyether, polyester or a polyether-polyester block copolyester with primary OH functions.

13. The photopolymer formulation according to claim 1, wherein the writing monomer comprises at least a monofunctional and a multifunctional urethane(meth)acrylate.

14. The photopolymer formulation according to claim 1, wherein it additionally comprises a plasticizer which conforms to general formula (CI)

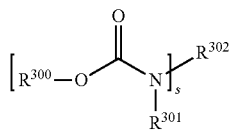

(CI)

where s is ≥1 and ≤8 and $R^{300}$, $R^{301}$, $R^{302}$ are independently of each other hydrogen, linear, branched, cyclic or heterocyclic unsubstituted or else optionally heteroatom-substituted organic moieties, wherein optionally at least one of $R^{300}$, $R^{301}$, $R^{302}$ is substituted with at least a fluorine atom and optionally $R^{300}$ is an organic moiety with at least one fluorine atom.

15. A holographic medium containing the photopolymer formulation according to claim 1 coated as a layer.

16. A process for recording of in-line, off-axis, full-aperture transfer, white light transmission, Denisyuk, off-axis reflection or edge-lit holograms or holographic stereograms, which comprises interferometrically exposing the holographic medium according to claim 15.

17. The photopolymer formulation according to claim 1, wherein a cured composition prepared from the photopolymer formulation has a plateau modulus $G_0$ which is greater than a plateau modulus $G_0$ obtained from the same composition comprising a dye which has a water imbibition of >5%, wherein the plateau modulus $G_0$ is determined by measuring the curing of the matrix in an oscillation rheometer as follows:
plate spacing 250 μm,
oscillation measuring mode at a constant angular frequency $\omega_0$ of 10 rad/s and a controlled logarithmic deformation amplitude ramp of 1%
temperature 80° C., normal force regulation set at 0 Newton
recording of the storage modulus G' over the measuring time for at least 2 hours or until a constant value of G' was reached; this value is referred to as $G_0$.

* * * * *